(12) United States Patent
Hsieh et al.

(10) Patent No.: US 7,903,006 B2
(45) Date of Patent: *Mar. 8, 2011

(54) AUTOMATIC POWER CONTROL SYSTEM FOR OPTICAL DISC DRIVE AND METHOD THEREOF

(75) Inventors: Bing-Yu Hsieh, Taipei (TW); Ming-Jiou Yu, Taipei (TW); Kuo-Jung Lan, Taipei (TW); Shu-Hung Chou, Taipei (TW); Chih-Ching Chen, Miaoli County (TW); Chia-Wei Liao, Hsinchu County (TW)

(73) Assignee: Mediatek Inc., Hsin-Chu (TW)

( * ) Notice: Subject to any disclaimer, the term of this patent is extended or adjusted under 35 U.S.C. 154(b) by 21 days.

This patent is subject to a terminal disclaimer.

(21) Appl. No.: 12/273,601

(22) Filed: Nov. 19, 2008

(65) Prior Publication Data

US 2009/0073827 A1 Mar. 19, 2009

Related U.S. Application Data

(63) Continuation of application No. 11/758,119, filed on Jun. 5, 2007, now Pat. No. 7,474,235.

(51) Int. Cl.
*H03M 1/00* (2006.01)
(52) U.S. Cl. .......... 341/110; 341/144; 341/155; 375/354
(58) Field of Classification Search .............. 341/61, 341/144, 155, 141, 110; 375/354, 229, 343, 375/372
See application file for complete search history.

(56) References Cited

U.S. PATENT DOCUMENTS 5,212,675 A 5/1993 Yoshino
(Continued)

FOREIGN PATENT DOCUMENTS

CN 1402231 3/2003
(Continued)

OTHER PUBLICATIONS

English language translation of abstract of TW 476935 (published Feb. 21, 2002).
(Continued)

*Primary Examiner* — Peguy JeanPierre
(74) *Attorney, Agent, or Firm* — Thomas | Kayden

(57) ABSTRACT

An automatic power control system, a down sampling circuit and a down sampling method. The automatic power control system is incorporated in an optical disc drive comprising a laser diode for receiving a control signal to generate a laser beam; and a photodetector for detecting the laser beam to generate an analog input signal. The automatic power control system comprises an analog-to-digital converter, a down sampling circuit, a comparator, and a digital-to-analog converter. The analog-to-digital converter converts the analog input signal to digital data. The down sampling circuit, coupled to the analog-to-digital converter, comprises a down sampler, a counter, and a controller. The down sampler receives a predetermined amount of digital data to generate representation data. The counter, coupled to the down sampler, calculates the amount of digital data, and resets the down sampler when the amount equals or exceeds the predetermined count. The controller, coupled to the counter, disables the counter when the digital data is invalid. The comparator, coupled to the down sampling circuit, compares the representation data with predetermined target data to generate error data. The digital-to-analog converter, coupled to the comparator, converts the error data to analog to generate the control signal.

20 Claims, 46 Drawing Sheets

U.S. PATENT DOCUMENTS

| | | |
|---|---|---|
| 5,699,334 A | 12/1997 | Yamada et al. |
| 5,703,848 A | 12/1997 | Hofer |
| 5,768,227 A | 6/1998 | Baba |
| 5,805,715 A | 9/1998 | Rhee |
| 5,872,666 A | 2/1999 | Saiki et al. |
| 5,915,028 A | 6/1999 | Chahabadi |
| 6,091,678 A | 7/2000 | Fushimi et al. |
| 6,392,967 B1 | 5/2002 | Nakayama et al. |
| 6,424,687 B1 | 7/2002 | Tian et al. |
| 6,590,843 B1 | 7/2003 | Zhuang |
| 6,731,586 B2 | 5/2004 | Seo et al. |
| 6,891,787 B1 | 5/2005 | Tada |
| 7,257,058 B2 | 8/2007 | Sasaki |
| 7,474,235 B2 * | 1/2009 | Hsieh et al. .................... 341/61 |
| RE40,822 E | 7/2009 | Lai |
| 2001/0006494 A1 | 7/2001 | Park |
| 2002/0196717 A1 | 12/2002 | Masui et al. |
| 2003/0021208 A1 | 1/2003 | Ogura |
| 2004/0190397 A1 | 9/2004 | Kuwahara et al. |
| 2004/0233826 A1 | 11/2004 | Sugano |
| 2004/0257946 A1 | 12/2004 | Huang |
| 2005/0068882 A1 | 3/2005 | Yamamuro |
| 2005/0185559 A1 | 8/2005 | Maro et al. |
| 2005/0280569 A1 | 12/2005 | Park |
| 2006/0193053 A1 | 8/2006 | Shibuya et al. |
| 2006/0267825 A1 | 11/2006 | Fujiyama et al. |
| 2007/0019772 A1 | 1/2007 | Spires et al. |
| 2007/0047635 A1 | 3/2007 | Stojanovic et al. |
| 2007/0070853 A1 | 3/2007 | Koishi |
| 2007/0133831 A1 | 6/2007 | Kim et al. |
| 2008/0033695 A1 | 2/2008 | Sahara et al. |
| 2008/0219116 A1 | 9/2008 | Narumi |

FOREIGN PATENT DOCUMENTS

| | | |
|---|---|---|
| TW | 407266 | 10/2000 |
| TW | 476935 | 2/2002 |
| TW | I227017 | 1/2005 |

OTHER PUBLICATIONS

English language translation of abstract of TW 1227017 (published Jan. 21, 2005).

English language translation of abstract of CN 1402231 (published Mar. 12, 2003).

English language translation of abstract of TW 407266 (published Oct. 1, 2000).

* cited by examiner

AUTOMATIC POWER CONTROL SYSTEM FOR OPTICAL DISC DRIVE AND METHOD THEREOF

CROSS REFERENCE

This application is a Continuation of U.S. patent application Ser. No. 11/758,119, filed Jun. 5, 2007, which claimed the benefit of U.S. provisional application Ser. Nos. 60/811,031, 60/811,017, 60/803,875, 60/803,874, 60/803,887, 60/810,991, 60/810,898, 60/810,990, 60/810,989 and 60/810,972, all filed on Jun. 5, 2006, the subject matter of which is incorporated herein by reference.

BACKGROUND OF THE INVENTION

1. Field of the Invention

The invention relates to optical disc drive and in particular to automatic power control system for optical disc drive and a method thereof.

2. Description of the Related Art

In an optical disc system, a disc drive accesses an optical disc by a laser beam driven by a laser diode therein. To accurately record and play data to and from the optical disc, the disc drive utilizes an automatic control system for power and servo control to drive the laser diode.

FIG. 44 is a block diagram of a conventional automatic power control system, comprising analog preprocessing unit 6110, comparator 6112, and analog post processing unit 6114. Analog preprocessing unit 6110 is coupled to comparator 6112, and subsequently to analog post processing unit 6114.

During an automatic power control process, analog preprocessing unit 6110 is opened for invalid input data $S_{in}$, and closed for valid data. Analog preprocessing unit 6110 receives analog feedback signal $S_{in}$ and processes it to generate preprocessed signal $S_{pre}$. Comparator 6112 obtains preprocessed signal $S_{pre}$ for comparison with a target value $D_{target}$, and, based on differences therebetween, generates error signal $S_e$. Analog post processing unit 6114 generates a control signal $S_c$ in response to error signal $S_e$. Analog feedback signal $S_{in}$ indicates power level of the laser beam that reads data from an optical disc. When analog feedback signal $S_{in}$ is invalid, analog preprocessing unit 6110 is opened to stop data processes. Target value $D_{target}$ is a predetermined power level. When preprocessed signal $S_{pre}$ does not equal target value $D_{target}$, analog post processing unit 6114 determines control signal $S_c$ according to error signal $S_e$ to increase or decrease the driving current of the laser diode, thereby controlling the power level of the laser beam to a level where preprocessed signal $S_{pre}$ equals target value $D_{target}$.

FIG. 45 is a block diagram of a conventional automatic power control system, comprising analog-to-digital converter (ADC) 6220, digital preprocessing unit 6222, comparator 6224, digital post processing unit 6226, and digital-to-analog converter (DAC) 6228. Analog to digital converter (ADC) 6220 is coupled to digital preprocessing unit 6222, comparator 6224, digital post processing unit 6226, and subsequently to digital-to-analog converter 6228.

Automatic power control system 622 provides digital automatic power control to the power level of input signal $S_{in}$. Analog-to-digital converter 6220 samples analog feedback signal $S_{in}$ in a predetermined data rate to generate sampled data $D_s$. Digital preprocessing unit 6222 performs processes such as filtering on sampled data $D_s$, to generate preprocessed data $D_{pre}$, compared with target value $D_{target}$ in comparator 6224 to provide error data $D_e$. Digital post processing unit 6226 converts error data $D_e$ to post processed signal $D_{post}$, converted to analog control signal $D_c$ in Digital-to-Analog converter 6228 for controlling the driving current of the laser diode such that the power level of the laser beam is kept at a desirable level.

As technology moves from analog to digital, a need exists for an efficient and accurate digital automatic control circuit.

BRIEF SUMMARY OF THE INVENTION

A detailed description is given in the following embodiments with reference to the accompanying drawings.

According to the invention, an automatic power control system for an optical disc drive to control the power of laser beam is provided. The optical disc drive comprises a laser diode for receiving a control signal to generate a laser beam; and a photodetector for detecting the laser beam to generate an analog input signal. The automatic power control system comprises an analog-to-digital converter, a down sampling circuit, a comparator, and a digital-to-analog converter. The analog-to-digital converter converts the analog input signal to digital data. The down sampling circuit, coupled to the analog-to-digital converter, comprises a down sampler, a counter, and a controller. The down sampler receives a predetermined amount of digital data to generate representation data. The counter, coupled to the down sampler, calculates the amount of digital data, and resets the down sampler when the amount equals or exceeds the predetermined count. The controller, coupled to the counter, disables the counter when the digital data is invalid. The comparator, coupled to the down sampling circuit, compares the representation data with predetermined target data to generate error data. The digital-to-analog converter, coupled to the comparator, converts the error data to analog to generate the control signal.

According to the invention, a down sampling circuit comprises a down sampler, a counter, and a controller. The down sampler receives a predetermined amount of digital data to generate representation data. The counter, coupled to the down sampler, calculates the amount of digital data, and resets the down sampler when the amount equals or exceeds the predetermined count. The controller, coupled to the counter, disables the counter when the digital data is invalid.

According to another embodiment of the invention, a down sampling method comprises a down sampler receiving a predetermined amount of digital data to generate representation data, a counter calculating an amount of the digital data, resetting the down sampler when the amount equals or exceeds the predetermined count, and disabling the counter when the digital data is invalid.

According to yet another embodiment of the invention, a method of limiting a current through a load comprises providing a current indication indicating the current, generating a short-circuit signal when the current exceeds a predetermined threshold, delivering a mirror current from a current mirror in a current supply circuit to the load, upon reception of the short-circuit signal, and passing the current from the voltage source through a by pass path in the current supply circuit to the load in the absence of the short-circuit signal.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
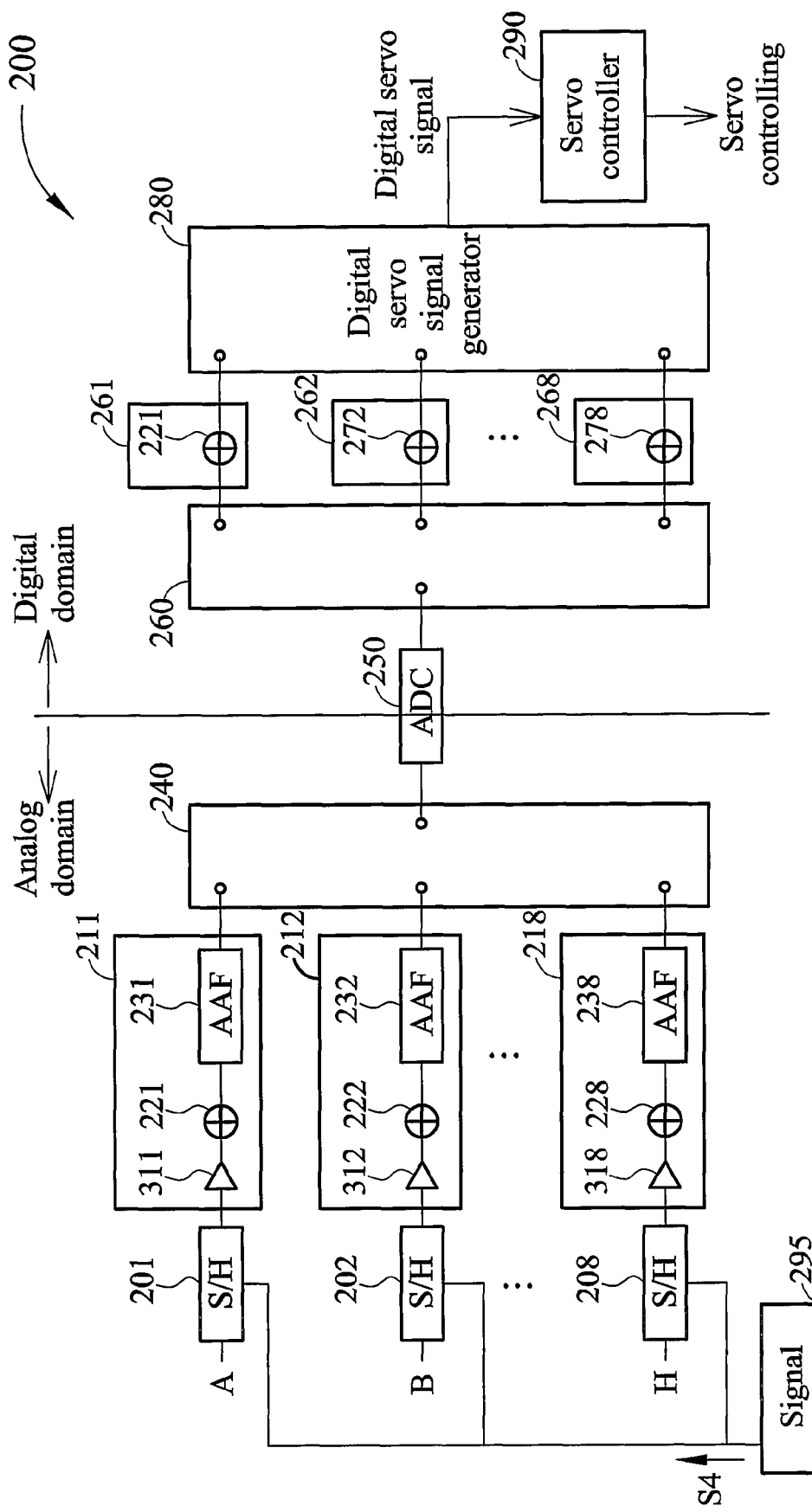
FIG. 1 is a diagram illustrating the signal processing apparatus according to an embodiment of the present invention.

Please refer to FIG. 1. FIG. 1 is a diagram illustrating the signal processing apparatus 200 according to an embodiment of the present invention. The signal processing apparatus 200 comprises 8 sample and hold units 201~208, 8 analog adjusting modules 211~218, a multiplexer 240, an Analog to Digital Converter (ADC) 250, a de-multiplexer 260, 8 digital adjusting modules 261~268, a digital servo error signal generator 280, and a signal holding controller 295.

The sample and hold units 201~208 respectively receive photo diode signals A, B . . . H from photo diodes (or called PDIC) of the optical pickup, and hold the received photo diode signals according to the control signal S4. For example, when the signal holding controller 295 transmits the control signal S4, the sample and hold unit 201 outputs the current photo diode signal A. On the other hand, when the signal holding controller 295 does not transmit the control signal S4, the sample and hold unit 201 outputs the previous sampled photo diode signal A instead of the current photo diode signal A.

The signal holding controller 295 is coupled to the sample and hold units 201~208 for generating the control signal S4. Thus, the holding actions of the sample and hold units 201~208 are all controlled by the signal holding controller 295. For example, the signal holding controller 295 can transmit the control signal S4 when the optical disc drive operates in the read state, or transmit the control signal S4 in the period that the analog photo diode signals A~H are in the constant manner similar to the read power when the optical disc drive operates in write state. Moreover, the signal holding controller 295 can always transmit the control signal S4 so that the sample and hold units always sample analog photo diode signals.

Each of the analog adjusting modules 211~218 comprises an amplifier, an analog offset unit, and an Anti-Alias Filter (AAF). For example, the first adjusting module 211 comprises an amplifier 311, an analog offset unit 221, and an AAF 231. Each of the digital adjusting modules 261~268 comprises a digital offset unit. For example, the second adjusting module 261 comprises a digital offset unit 271.

The amplifiers 211~218 are respectively coupled to the sample and hold units 201~208 for receiving the sampled photo diode signals A-H output from the sample and hold units 201~208 and amplifying the received photo diode signals. The gains of the amplifiers 211~218 are appropriately controlled for increasing signal qualities of the amplified analog photo diode signals.

The analog offset units 221~228 are respectively coupled to the amplifiers 211~218 for receiving the amplified photo diode signals A~H output from the amplifiers 211~218 and offsetting the amplified photo diode signals A~H. The offset values of the analog offset units 221~228 are appropriately controlled so that the analog photo diode signals after being offset can fall within the input signal ranges of the multiplexer 240 and the ADC 250.

The AAFs 231~238 are respectively coupled to the analog offset units 221~228 for receiving the offset photo diode signals A~H output from the analog offset units 221~228 and filtering the offset photo diode signals A~H.

The multiplexer 240 comprises 8 input ends and an output end. Each of the input ends of the multiplexer 240 is respectively coupled to the corresponding AAF for receiving the filtered photo diode signal. The multiplexer 240 couples the 8 input ends of the multiplexer 240 selectively to the output end of the multiplexer 240. The sequence of the input ends of the multiplexer 240 coupled to the output end of the multiplexer can be in sequential or programmable. In this way, the output end of the multiplexer 240 outputs the filtered photo diode signals A~H at different time.

The ADC 250 is coupled to the output end of the multiplexer 240 for receiving signals from the multiplexer 240 and accordingly converting the received signals into digital signals. In this way, the filtered analog photo diode signals A~H are converted into digital photo diode signals A"~H" in different periods.

The de-multiplexer 260 comprises 8 output ends and an input end. The input end of the de-multiplexer 260 is coupled to the ADC 250 for sequentially receiving the digital photo diode signals A"~H". The de-multiplexer 260 couples the 8 output ends of the de-multiplexer 260 sequentially to the input end of the de-multiplexer 260. In this way, the output ends of the de-multiplexer 260 respectively output the digital photo diode signals A"~H".

The digital offset units 271~278 are respectively coupled to the output ends of the de-multiplexer 260 for respectively receiving the digital photo diode signals A"~H". For example, the digital offset unit 271 receives the digital photo diode signal A", the digital offset unit 272 receives the digital photo diode signal B", and so on. The digital offset units 271~278 offset the received digital photo diode signals A"~H". The offset values of the digital offset units 271~278 are appropriately controlled so as to offset the received digital photo diode signals A"~H". Thus, the level of each digital photo diode signals A"~H" could be set to a pre-determined value after digital offset.

The spirit of the present invention disposing digital offset units is to reduce the offsets of the photo diode signals caused by the components the photo diode signals pass through. If the photo diode signals are only adjusted once by the analog offset units 221~228, the offset of photo diode signals are still large even. Therefore, the digital offset units 271~278 are disposed for completely centering the photo diode signals.

The digital servo signal generator 280 is coupled to the digital offset units 271~278 for receiving the offset digital photo diode signals A"~H". The servo signal generator 280 generates digital servo signals by computation on the received digital photo diode signals A"~H". The digital servo signals can be a focusing error signal FE or a tracking error signal TE, for example. The focusing error signal FE is generated according to the equation: $FE=(A"+C")-(B"+D")$. The Push-Pull tracking error signal TE is generated according to the equation: $TE=[(A"+D")-(B"+C")]-\alpha*[(E"+H")-(F"+G")]$.

After the digital servo signal generator 280 generates the digital servo signals, the digital servo signals are transmitted to the servo controller 290. Thus, the servo controller 290 can execute servo controls according to the received digital servo signals. The servo control can be focusing control, tracking control, and seeking control.

The signal processing apparatus 200 of the present invention provides sample and hold units for a user to choose particular periods of the analog photo diode signals for signal processing. That is, the user can select particular periods of the analog photo diode signals for signal processing and further generation of the digital servo signals while other periods of the analog photo diode signals not selected are ignored. Furthermore, the user can select periods of the analog photo diode signals having the same constant manner for signal processing. In this way, the components of the first adjusting modules and the second adjusting modules can be designed with smaller input range, which reduce the product expenses and the design complexity.

The signal processing apparatus 200 of the present invention further provides the multiplexer and the de-multiplexer for saving the amount of ADCs. In the present invention, only one ADC is needed for converting all the analog photo diode signals.

Figure 2:
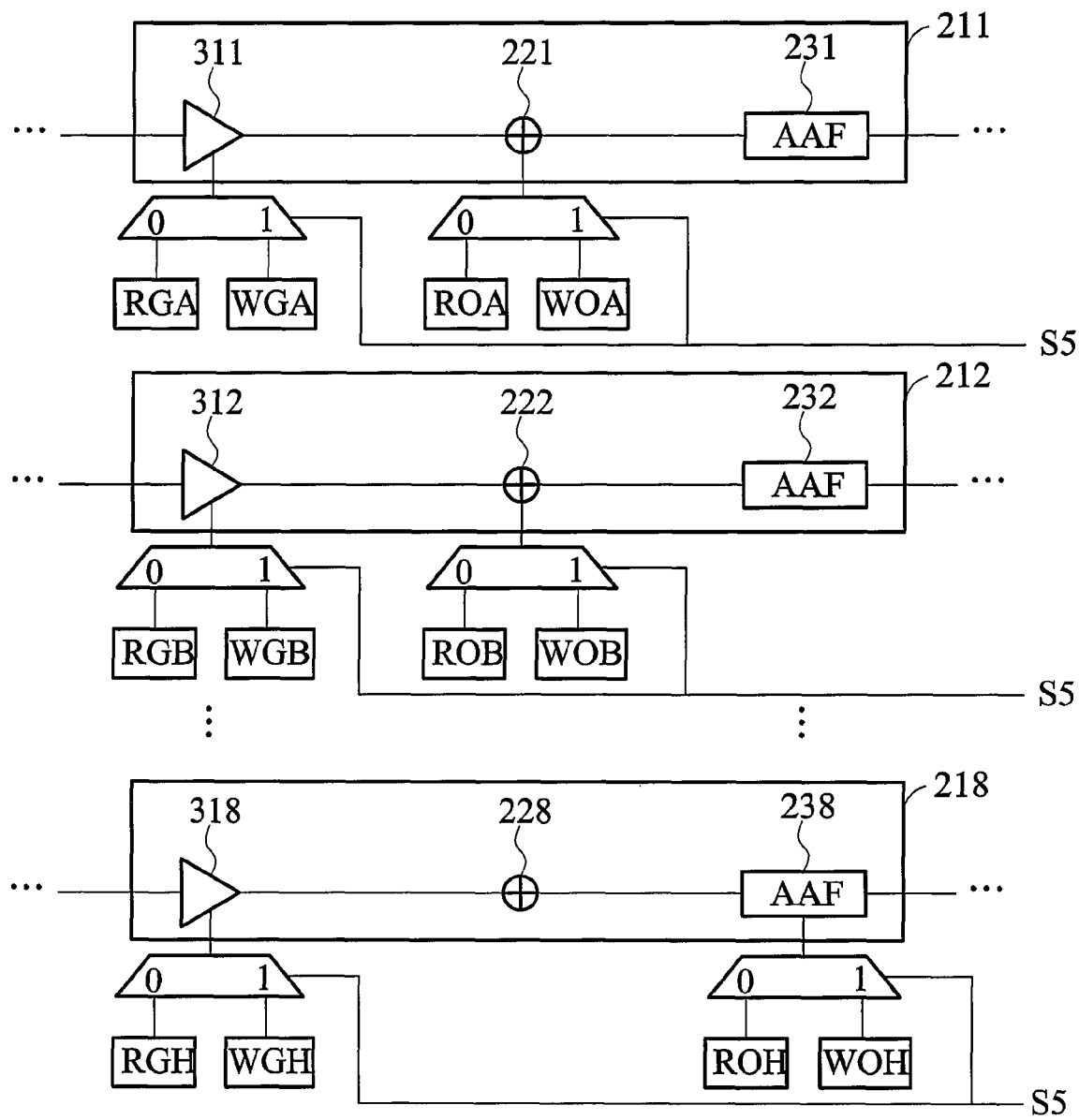
FIG. 2 is a diagram illustrating the analog adjusting modules of the present invention.

Please refer to FIG. 2. FIG. 2 is a diagram illustrating the analog adjusting modules 211~218 of the present invention.

The gain of the amplifier of the analog adjusting module of the present invention can be controlled according to the operation of the optical disc drive such as a write state or a read state. For example, in the analog adjusting module 211, the gain of the amplifier 311 is set to be a first predetermined value RGA when the optical disc drive operates in the read state, and is set to be a second predetermined value WGA when the optical disc drive operates in the write state. Each of the amplifiers 311~318 has its own predetermined values according to the states of the optical disc drive. The signal S5 indicates the state of the optical disc drive. For example, the signal S5 may be a 1, meaning the optical disc drive operates in the write state. Consequently, the gain of each amplifier is changed to the predetermined value of the write state. On the other hand, the signal S5 may be a 0, meaning the optical disc drive operates in the read state. Consequently, the gain of each amplifier is changed to the predetermined value of the read state.

Please continue referring to FIG. 2. The offset value of the analog offset unit of analog adjusting module of the present invention can be controlled according to the operation of the optical disc drive such as write state or read state. For example, in the analog adjusting module 211, the offset value of the analog offset unit 221 is set to be a third predetermined value ROA when the optical disc drive operates in the read state, and set to be a fourth predetermined value WOA when the optical disc drive operates in the write state. Each of the analog offset units 221~228 has its own predetermined values according to the states of the optical disc drive. The signal S5 indicates the state of the optical disc drive. For example, the signal S5 may be a 1, meaning the optical disc drive operates in the write state. Consequently, the offset value of each analog offset unit is changed to the predetermined value of the write state. On the other hand, the signal S5 may be a 0, meaning the optical disc drive operates in the read state. Consequently, the offset value of each analog offset unit is changed to the predetermined value of the read state.

Figure 3:
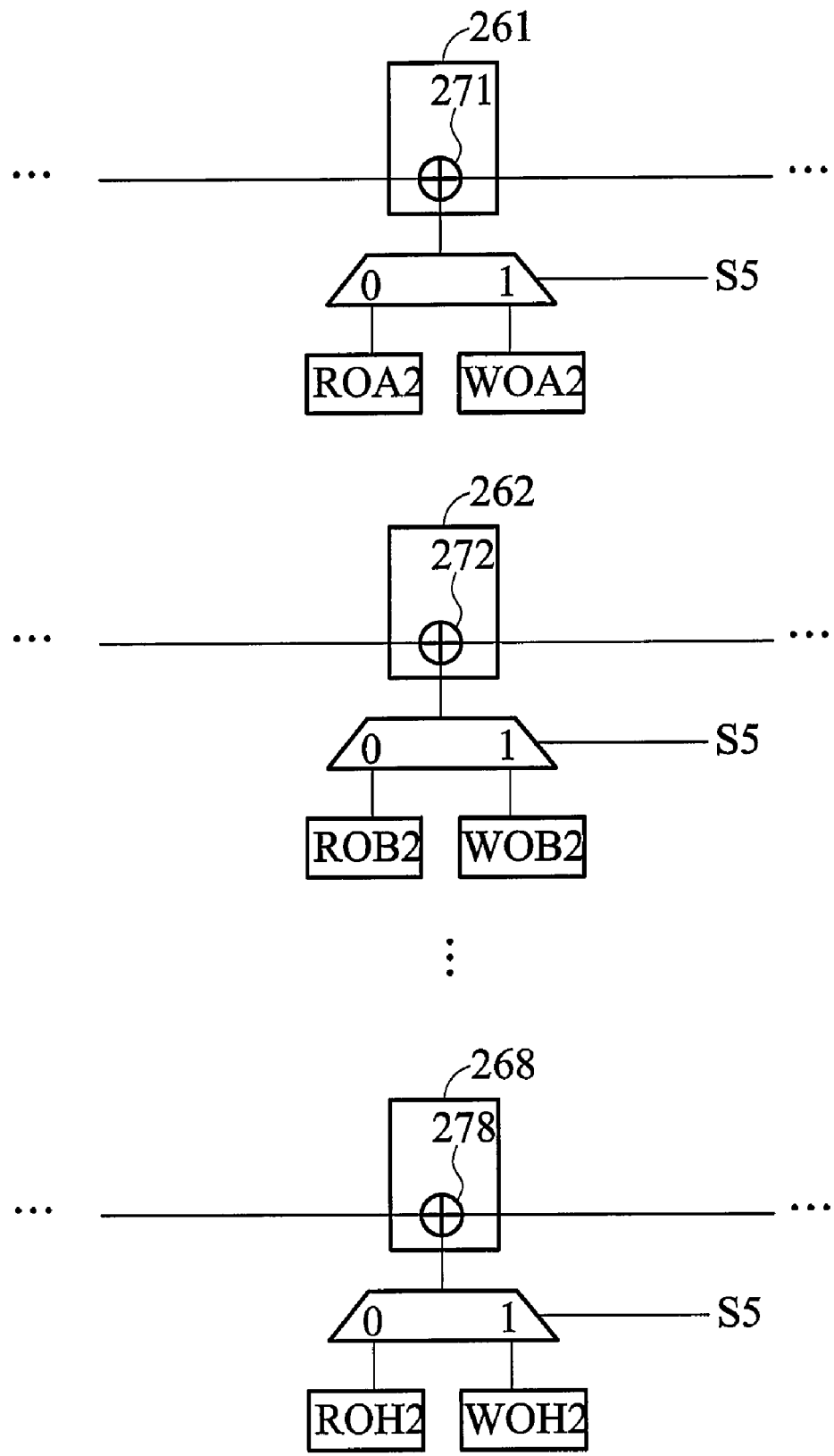
FIG. 3 is a diagram illustrating the digital adjusting modules of the present invention.

Please refer to FIG. 3. FIG. 3 is a diagram illustrating the digital adjusting modules 261~268 of the present invention. The offset value of the digital offset unit of the digital adjusting module of the present invention can be controlled according to the operation of the optical disc drive such as write state or read state. For example, in the digital adjusting module 261, the offset value of the digital offset unit 271 is set to be a fifth predetermined value ROA2 when the optical disc drive operates in the read state, and set to be a sixth predetermined value WOA2 when the optical disc drive operates in the write state. Each of the digital offset units 271~278 has its own predetermined values according to the states of the optical disc drive. The signal S5 indicates the state of the optical disc drive. For example, when the signal S5 is 1, the optical disc drive operates in the write state. Consequently, the offset value of each digital offset unit is changed to the predetermined value of the write state. On the other hand, when the signal S5 is 0, the optical disc drive operates in the read state. Consequently, the offset value of each digital offset unit is changed to the predetermined value of the read state.

Figure 4:
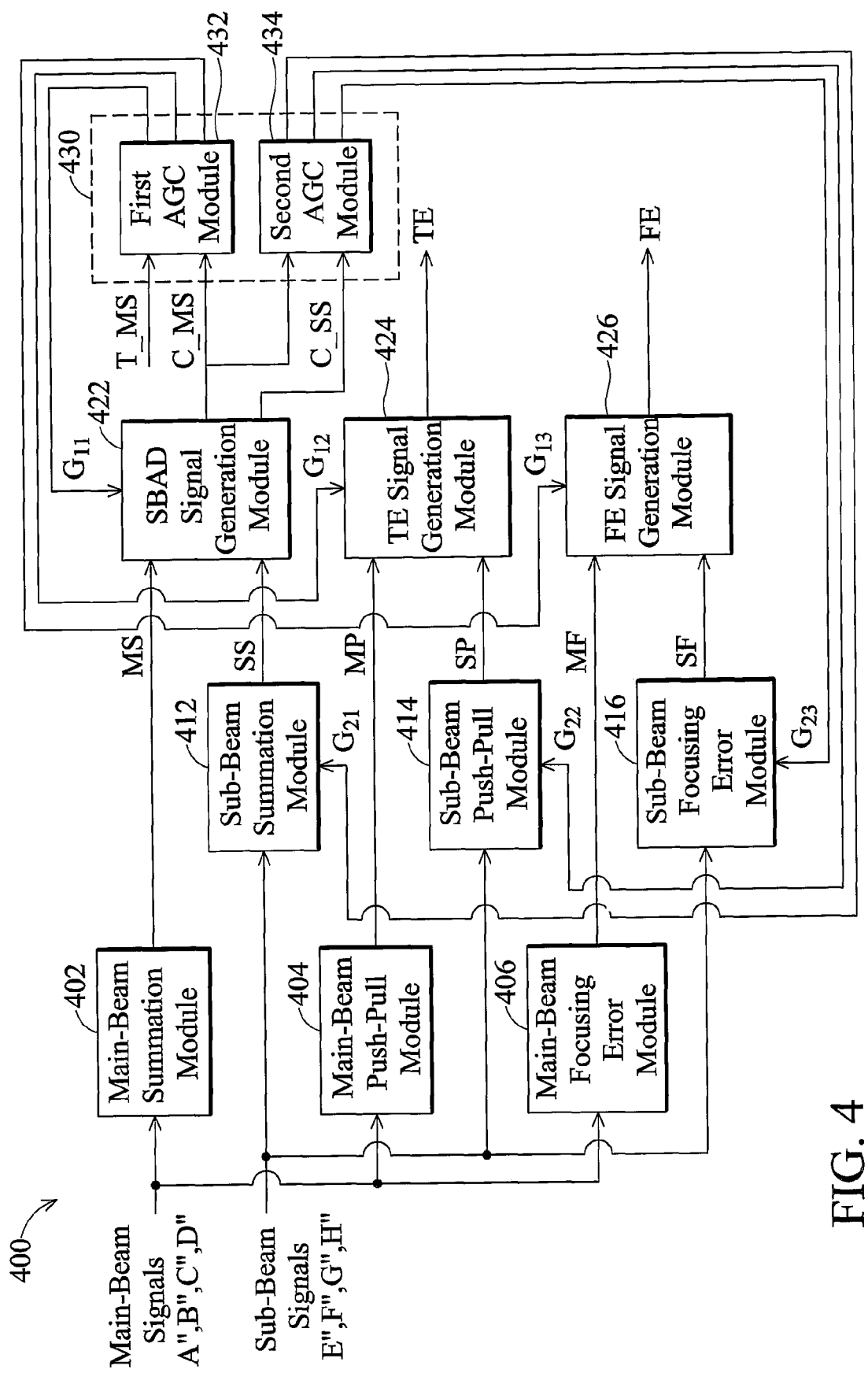
FIG. 4 is a block diagram of a servo signal generation module of FIG. 3.

FIG. 4 is a block diagram of a digital servo signal generator 400, an embodiment of the digital servo signal generator 280 of FIG. 1. The digital photo diode signals A", B", C", and D" of the main-beam are first delivered to a main-beam summation module 402, a main-beam push-pull module 404, and a main-beam focusing error module 406. The main-beam summation module 402 generates a main-beam summation signal MS which indicates the summation of signals A", B", C", and D". The main-beam push-pull module 404 generates a main-beam push-pull signal MP which indicates [(A"+D")−(B"+C")]. The main-beam focusing error module 406 derives a main-beam focusing error signal MF according to signals A", B", C", and D".

Accordingly, the digital photo diode signals E", F", G", and H" of the sub-beams are delivered to a sub-beam summation module 412, a sub-beam push-pull module 414, and a sub-beam focusing error module 416. The sub-beam summation module 412 generates a sub-beam summation signal SS indicating the summation of signals E", F", G", and H". The sub-beam push-pull module 414 generates a sub-beam push-pull signal SP indicating [(E"+H")−(F"+G")]. The sub-beam focusing error module 416 derives a sub-beam focusing error signal SF according to signals E", F", G", and H".

A tracking error (TE) signal generation module 424 then derives a tracking error signal TE according to the main-beam push-pull signal MP and the sub-beam push-pull signal SP. A focusing error (FE) signal generation module 426 derives a focusing error signal FE according to the main-beam focusing error signal MF and the sub-beam focusing error signal SF. A sub-beam addition (SBAD) signal generation module 422 derives a current main-beam summation signal C_MS indicating the sum of signals A", B", C", and D" and a current sub-beam summation signal C_SS indicating the sum of signals E", F", G", and H" according to the main-beam summation signal MS and the sub-beam summation signal SS. The SBAD signal may be the current main-beam summation signal C_MS or the current sub-beam summation signal C_SS. Although only three servo signals TE, FE and SBAD are shown in FIG. 4, the servo signal generation module 400 may include modules generating other servo signals such as CE and RFRP signals in the ways similar to the generation of signals TE, FE or SBAD.

Although the servo signals TE, FE and SBAD are already generated, the servo signals require appropriate amplification to maintain the strength of the servo signals at the same level in different operating conditions of the optical disc drive. As noted, the gain levels of the servo signals require quick adjustment to make the servo system stable whenever the optical disc drive encounters an operating state transition in which the reflection of the optical disc varies much. For example, the operating state transition occurs when the read portion of the optical disc is changed between a data zone and a blank zone, and when the operation of the optical disc drive is changed between write state and read state.

Thus, an apparatus 430 for automatically adjusting the gains of the servo signals whenever the operating state transition occurs is provided. The apparatus 430 includes a first automatic gain control (AGC) module 432 generating gain signals $G_{11}$, $G_{12}$, and $G_{13}$ according to a target level T_MS and the current main-beam sum signal C_MS. The SBAD signal generation module 422, the TE signal generation module 424, and the FE signal generation module 426 then amplify the SBAD signal (the C_MS or T_MS signal), the TE signal, and the FE signal respectively according to the gain signals $G_{11}$, $G_{12}$, and $G_{13}$, to maintain the servo signal level at an identical level in different operating conditions.

The apparatus 430 also includes a second automatic gain control (AGC) module 434 generating gain signals $G_{21}$, $G_{22}$, and $G_{23}$ according to the current main-beam sum signal C_MS and the current sub-beam sum signal C_SS. The sub-beam summation module 412, the TE sub-beam push-pull module 414, and the sub-beam focusing error module 416 then amplify the SS signal, the SP signal, and the SF signal respectively according to the gain signals $G_{21}$, $G_{22}$, and $G_{23}$, to balance the difference between the reflection intensities of the main-beam and the sub-beam.

Figure 5A:
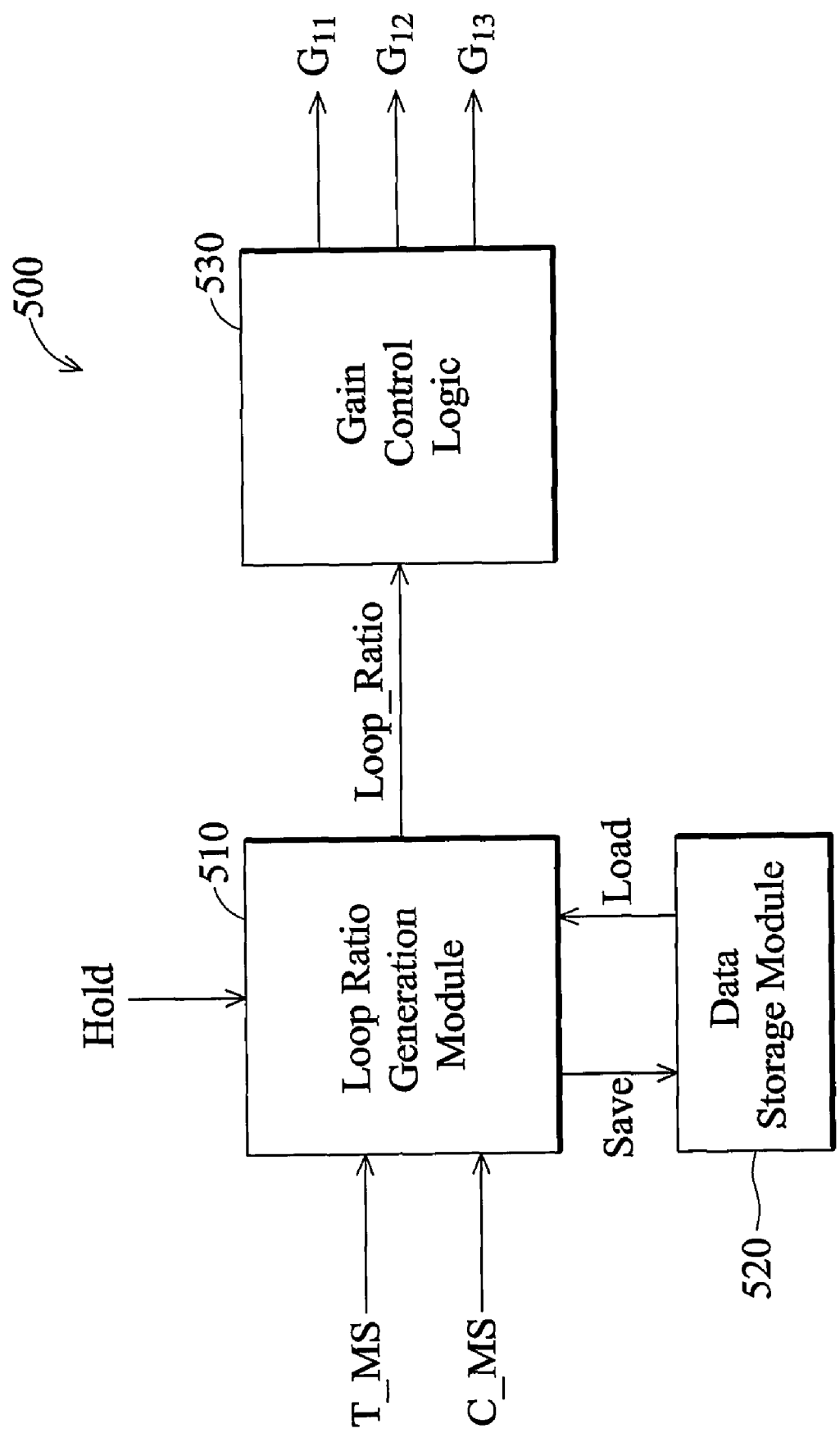
FIG. 5A is a block diagram of a first AGC module according to the invention.

FIG. 5A is a block diagram of the first AGC module 500 according to the invention. The first AGC module 500 includes a loop ratio generation module 510, a gain control logic 530, and a data storage module 520. The first AGC module 500 adjusts a loop ratio of the main-beam to control the gains $G_{11}$, $G_{12}$, and $G_{13}$ of the servo signals SBAD, TE, and FE during operating state. The loop ratio generation module 510 determines the loop ratio based on the target level T_MS and the current main-beam summation signal C_MS. Because the loop ratio indicates the ratio of the desired level to the current level of the reflection intensity of the main-beam, the gains of the servo signals TE, FE, and SBAD can be determined according to the loop ratio, thereby compensating the servo signals to the desired level. The gain control logic 530 then determines the gain signals $G_{11}$, $G_{12}$, and $G_{13}$ according to the loop ratio signal.

Figure 6:
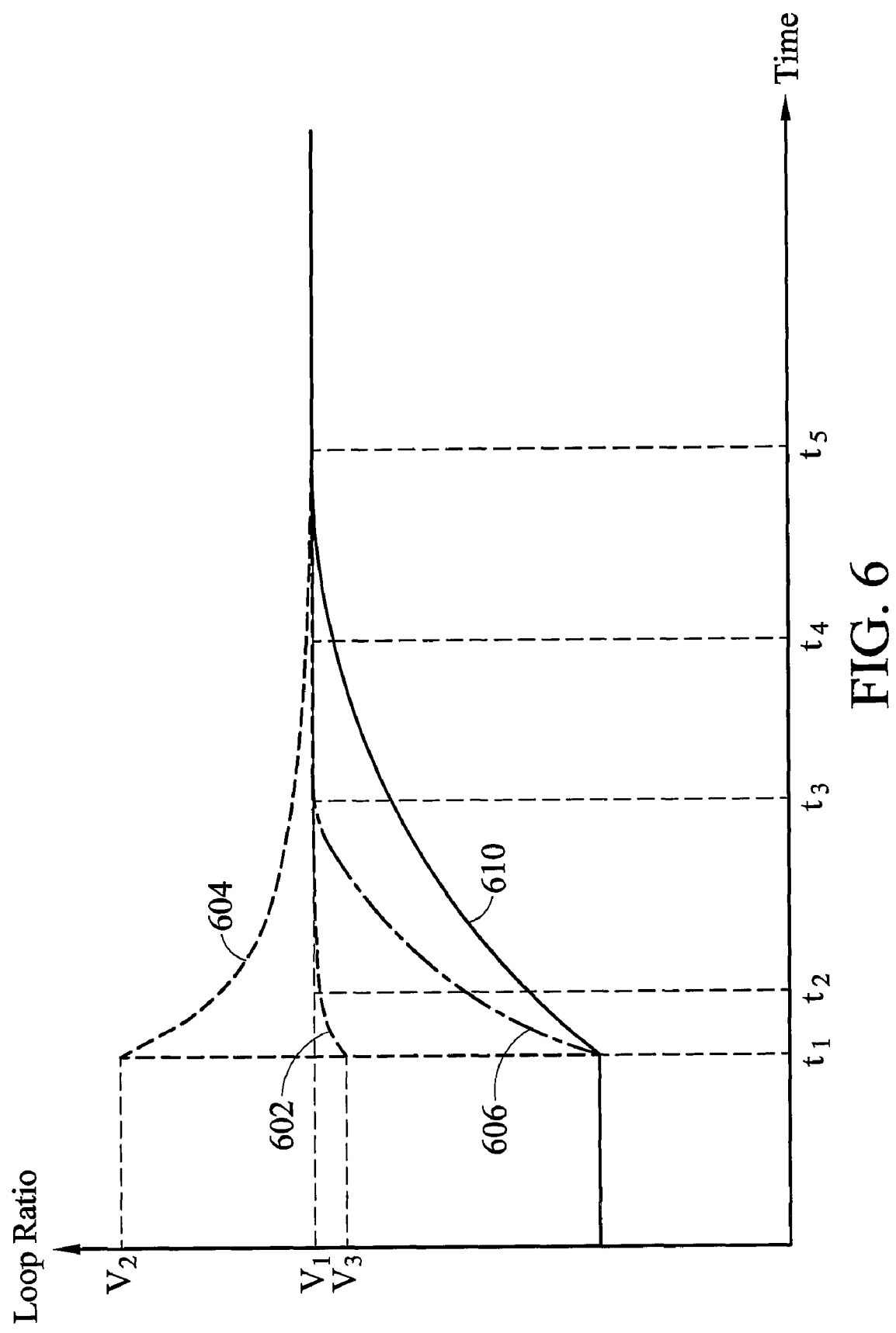
FIG. 6 is a schematic diagram showing transient variation of a loop ratio.

After the gains $G_{11}$, $G_{12}$, and $G_{13}$ of the servo signals are determined, the servo signals FE, TE or SBAD could be adjusted accordingly. The convergence of $G_{11}$, $G_{12}$, and $G_{13}$, however, is quite slow, requiring a long time for the servo signals to achieve the desired level under ordinary amplification. FIG. 6 shows a schematic diagram showing the transient variation of the loop ratio. The curve 610 indicates the loop ratio variation under the ordinary amplification. An operating state transition occurs at time $t_1$, but the loop ratio achieves the desired level of $V_1$ at time $t_5$, delaying the amplification of the servo signals.

To accelerate the amplification convergence of the servo signals, two AGC modes, a closed-loop mode and a state-reloading mode, are applied to the operation of both AGCs of the servo signals when the optical disc drive encounters an operating state transition. If the first AGC module 500 adopts the closed-loop mode only to amplify the servo signals, the gains of the servo signals could be compensated with a high bandwidth during a specific period after the operating state transition, as shown by the curve 606 indicating the loop ratio variation under closed-cloop mode. It can be seen that the convergence time under high bandwidth mode is reduced to time $t_3$, and the convergence process is accelerated. After this specific period, the bandwidth of AGCs could be switched to a slower one.

Another AGC mode is the state-reloading mode. The data storage module 520 of the first AGC module 500 respectively saves convergence values of the loop ratios under different operating conditions in advance while the servo signals converges. If the first AGC module 500 adopts the state-reloading mode to amplify the servo signals, the loop ratio generation module 510 immediately reloads the saved convergence value of the loop ratio or a pre-determined value corresponding to the current operating condition during operating state transition, and then assigns this value to be the initial value of the loop ratio. Curve 602 indicates the loop ratio variation under state reloading mode if the initial value $V_3$ is close to the convergence value $V_1$, and the convergence time is reduced to time $t_2$ to accelerate the convergence process. Curve 604 indicates the loop ratio variation under state reloading mode if the initial value $V_2$ is far from the convergence value $V_1$, and the convergence time is enlarged to time $t_4$. In state-reloading mode, after the saved convergence value or a pre-determined value loaded as the initial value of AGC, AGC is switched to closed-loop again to adjust the loop ratio dynamically.

Figure 5B:
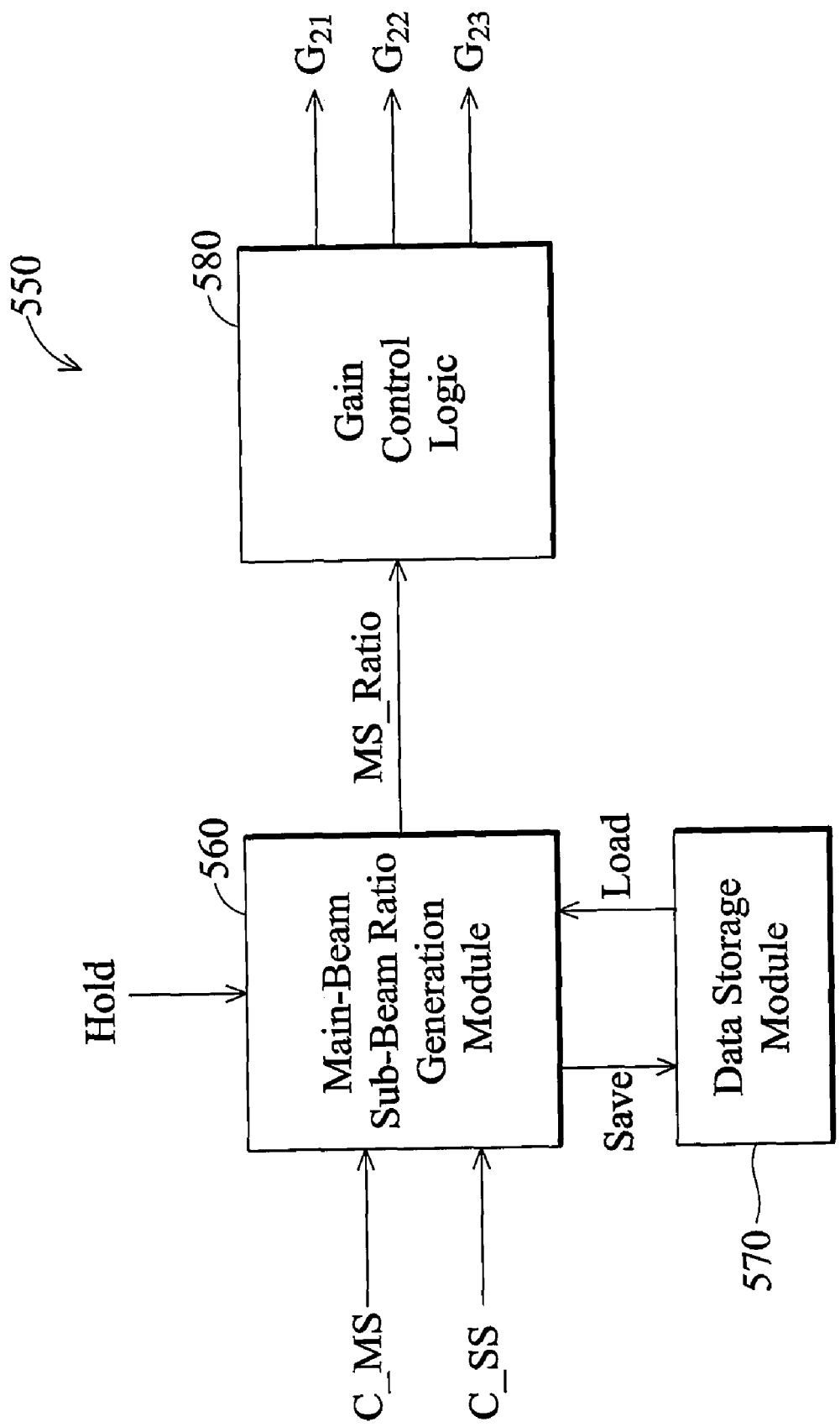
FIG. 5B is a block diagram of a second AGC module according to the invention.
Figure 8:
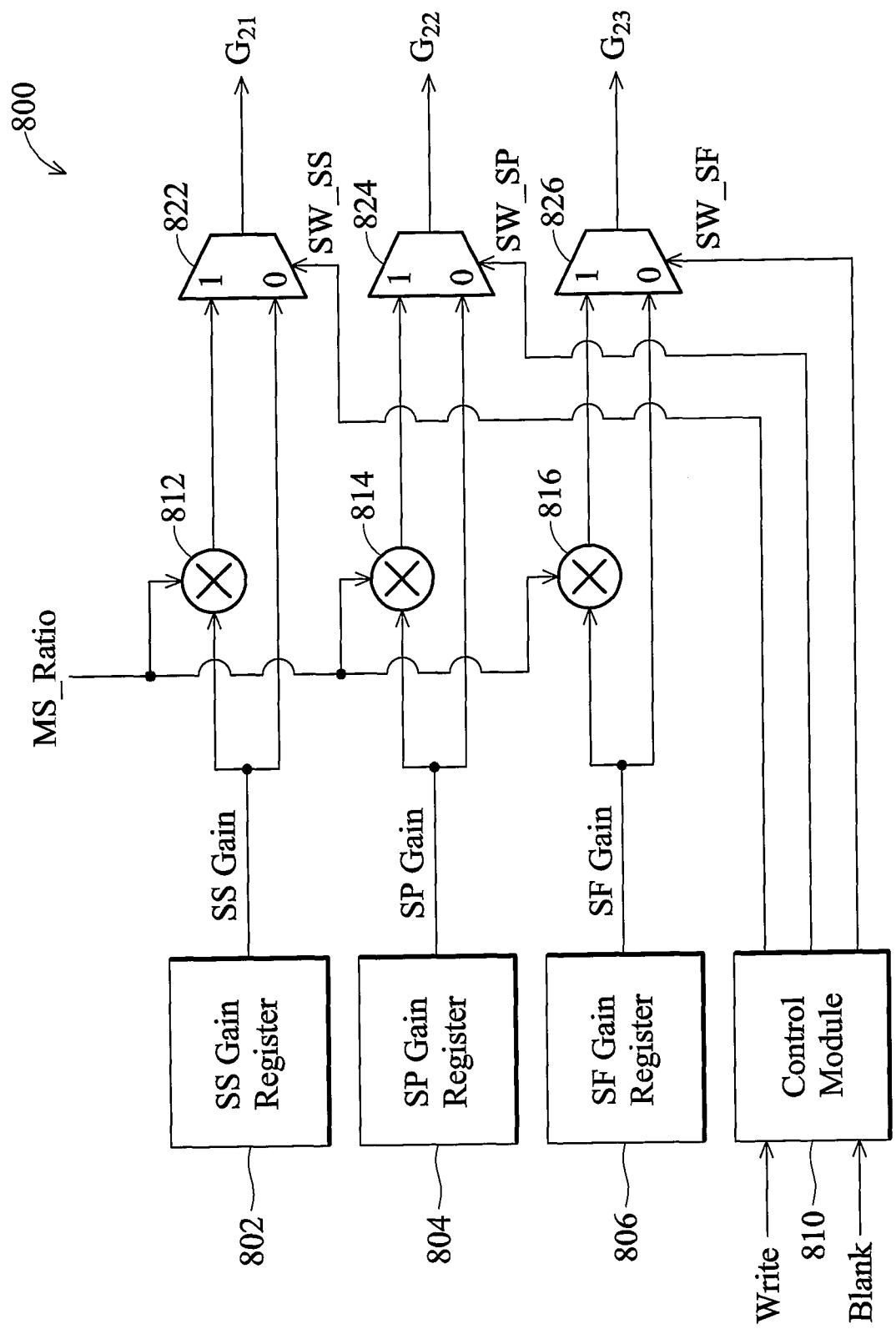
FIG. 8 is a block diagram of a gain control logic of the second ADC module of FIG. 5B.

FIG. 5B is a block diagram of a second AGC module 550 according to the invention. The second AGC module 550 includes a main-beam sub-beam ratio generation module 560, a gain control logic 580, and a data storage module 570. The second AGC module 550 adjusts the gains $G_{21}$, $G_{22}$, and $G_{23}$ of the sub-beam signals SS, SP, and SF according to a main-beam sub-beam ratio during operating state transition. The main-beam sub-beam ratio generation module 560 determines the main-beam sub-beam ratio (MS_ratio) from the current main-beam summation signal C_MS and the current sub-beam summation signal C_SS. Because the MS_ratio indicates the difference of the current levels of the reflection intensity of the main-beam and the sub-beam, the difference between the reflection intensity of the main-beam and the sub-beam can be appropriately balanced according to the MS_ratio, thereby securing the accuracy of the synthesis of the servo signals TE, FE, and SBAD. The gain control logic 580 then determines the gain signals $G_{21}$, $G_{22}$, and $G_{23}$ according to the MS_ratio signal. Details of the gain control logic 580 are shown in FIG. 8. Accordingly, the second AGC module 550 also adopts the closed-loop mode or the state-reloading mode in the amplification process of the sub-beam signals SS, SP, and SF to accelerate the signal convergence during operating state transition.

Figure 7:
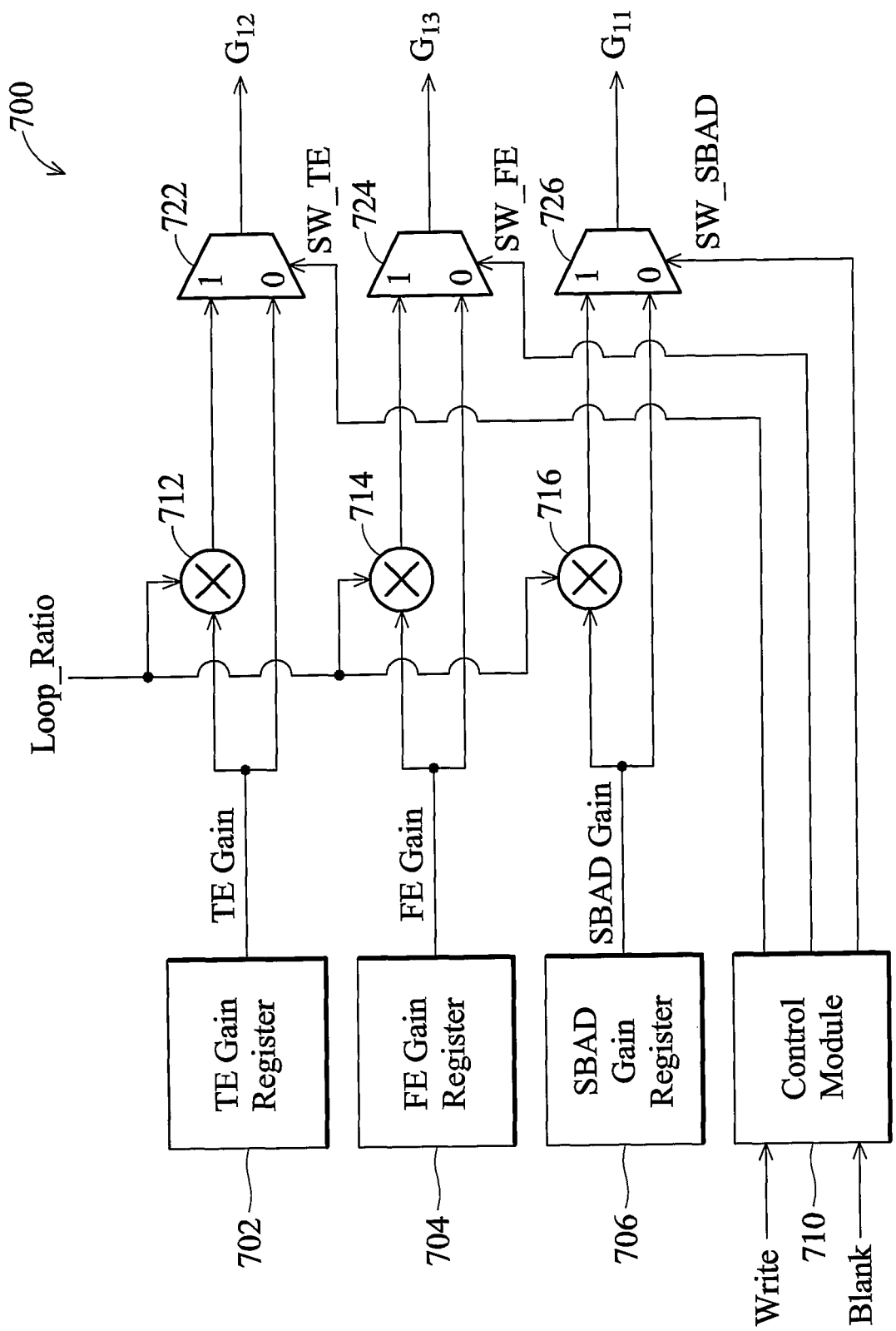
FIG. 7 is a block diagram of a gain control logic of the first ADC module of FIG. 5A.

FIG. 7 is a block diagram of a gain control logic 700 of the first AGC module of FIG. 5A. A TE gain register 702, a FE gain register 704, and a SBAD gain register 706 respectively hold the gains of the servo signals TE, FE, and SBAD. Three multipliers 712, 714, and 716 respectively multiply the gains of the servo signals TE, FE, and SBAD with the loop ratio. A control module 710 determines three switch signals SW_TE, SW_FE, and SW_SBAD according to a write signal and a blank signal. The write signal indicates the switch between the writing operation and the reading operation of the optical disc drive, and the blank signal indicates the switch between the blank zone and the data zone read by the optical disc drive. Thus, the control module 710 can determine the occurrence of the operating state transition according to both the write signal and the blank signal to switch the gain level of the servo signals. The switch signals SW_TE, SW_FE, and SW_SBAD then select the original gains or the multiplied gains as the actual gains $G_{12}$, $G_{13}$, $G_{11}$ of the servo signals TE, FE, and SBAD.

FIG. 8 is a block diagram of a gain control logic 800 of the second AGC module of FIG. 5B. A SS gain register 802, a SP gain register 804, and a SF gain register 806 respectively hold the gains of the sub-beam signals SS, SP, and SF. Three multipliers 812, 814, and 816 respectively multiply the gains of the sub-beam signals SS, SP, and SF with the MS_ratio. A control module 810 determines three switch signals SW_SS, SW_SP, and SW_SF according to the write signal and the blank signal. Accordingly, the control module 810 can determine the occurrence of the operating state transition according to both the write signal and the blank signal to switch the gain level of the sub-beam signals. The switch signals SW_SS, SW_SP, and SW_SF then select the original gains or the multiplied gains as the actual gains $G_{21}$, $G_{22}$, $G_{23}$ of the sub-beam signals SS, SP, and SF.

Figure 9:
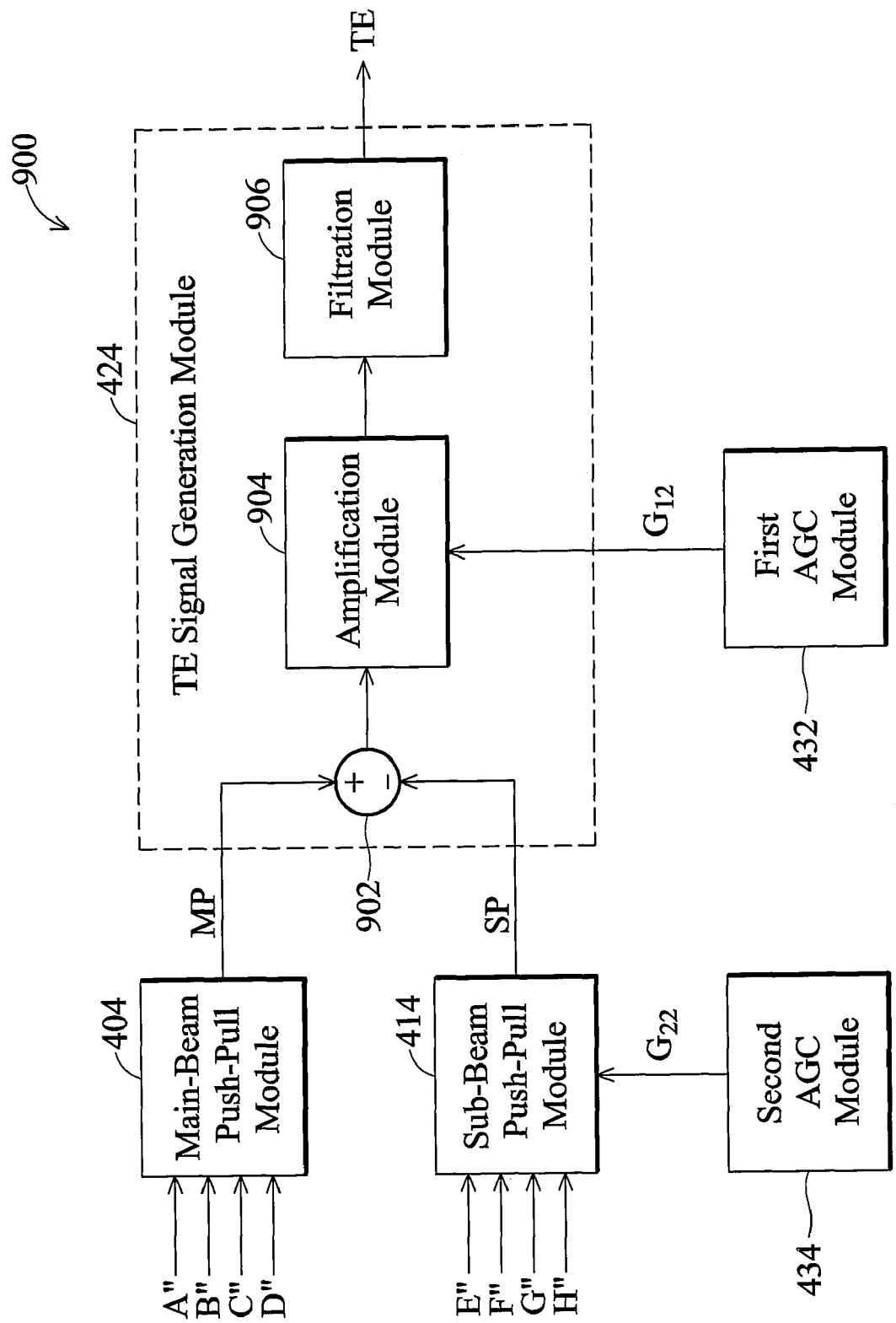
FIG. 9 shows an amplification process relating to generation of a tracking error signal.

FIG. 9 shows an amplification process relating to the generation of tracking error signal TE. The main-beam push-pull module 404 generates the main-beam push-pull signal MP according to the main-beam signals A", B", C", and D". The sub-beam push-pull module 414 generates the sub-beam push-pull signal SP according to the sub-beam signals E", F", G", and H". The second AGC module 434 generates a gain signal $G_{22}$ of the sub-beam push-pull signal SP to balance the signal strength difference between the main-beam and the sub-beam, and the sub-beam push-pull module 414 amplifies the sub-beam push-pull signal SP according to the gain signal $G_{22}$. A subtracter 902 of the TE signal generation module 424 then subtracts the amplified SP signal from the MP signal to obtain the tracking error signal. The first AGC module 432 then determines a gain signal $G_{12}$ of the tracking error signal to maintain the signal strength at a constant level in different operating conditions, and the amplification module 904 then amplifies the tracking error signal according to the gain signal $G_{12}$. After filtration of the filtration module 906, the tracking signal TE is output to the servo control module 312 to control the tracking operation of the optical disc drive.

Figure 10:
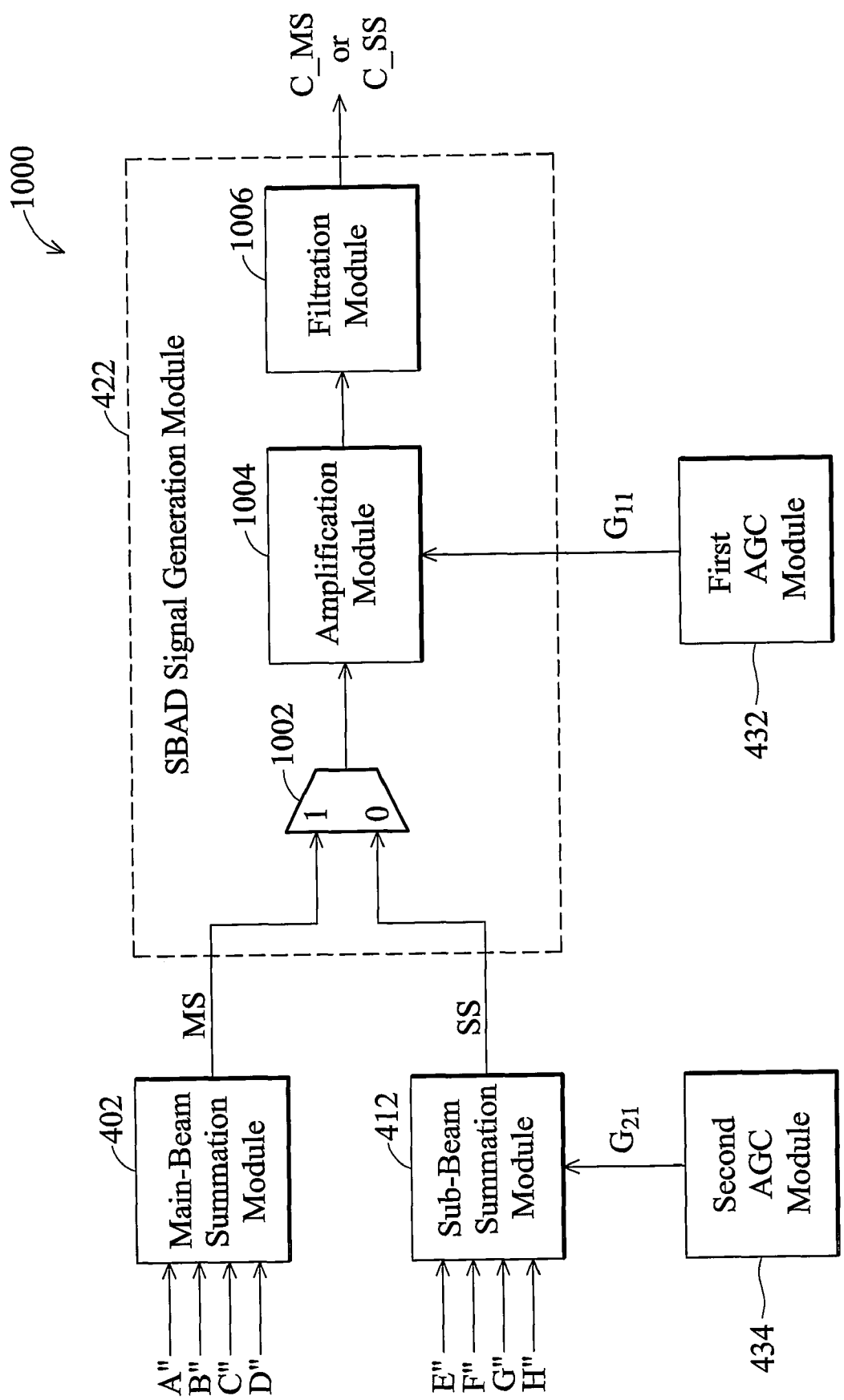
FIG. 10 shows an amplification process relating to generation of a sub-beam addition signal.

FIG. 10 shows an amplification process relating to generation of a sub-beam addition signal SBAD. The main-beam summation module 402 generates the main-beam summation signal MS according to the main-beam signals A", B", C", and D". The sub-beam summation module 412 generates the sub-beam summation signal SS according to the sub-beam signals E", F", G", and H". The second AGC module 434 generates a gain signal $G_{21}$ of the sub-beam summation signal SS to balance the signal strength difference between the main-beam and the sub-beam, and the sub-beam summation module 412 then amplifies the sub-beam summation signal SS according to the gain signal $G_{21}$. A multiplexer 1002 of the SBAD signal generation module 422 then selects the amplified SS signal or the MS signal as the SBAD signal, which may be the current main-beam sum signal C_MS or the current sub-beam sum signal C_SS. The first AGC module 432 then determines a gain signal $G_{11}$ of the SBAD signal to maintain the signal strength at a constant level in different operating conditions, and the amplification module 1004 then amplifies the SBAD signal according to the gain signal $G_{11}$. After filtration of the filtration module 1006, the SBAD signal is output to the servo control module 312.

Figure 11:
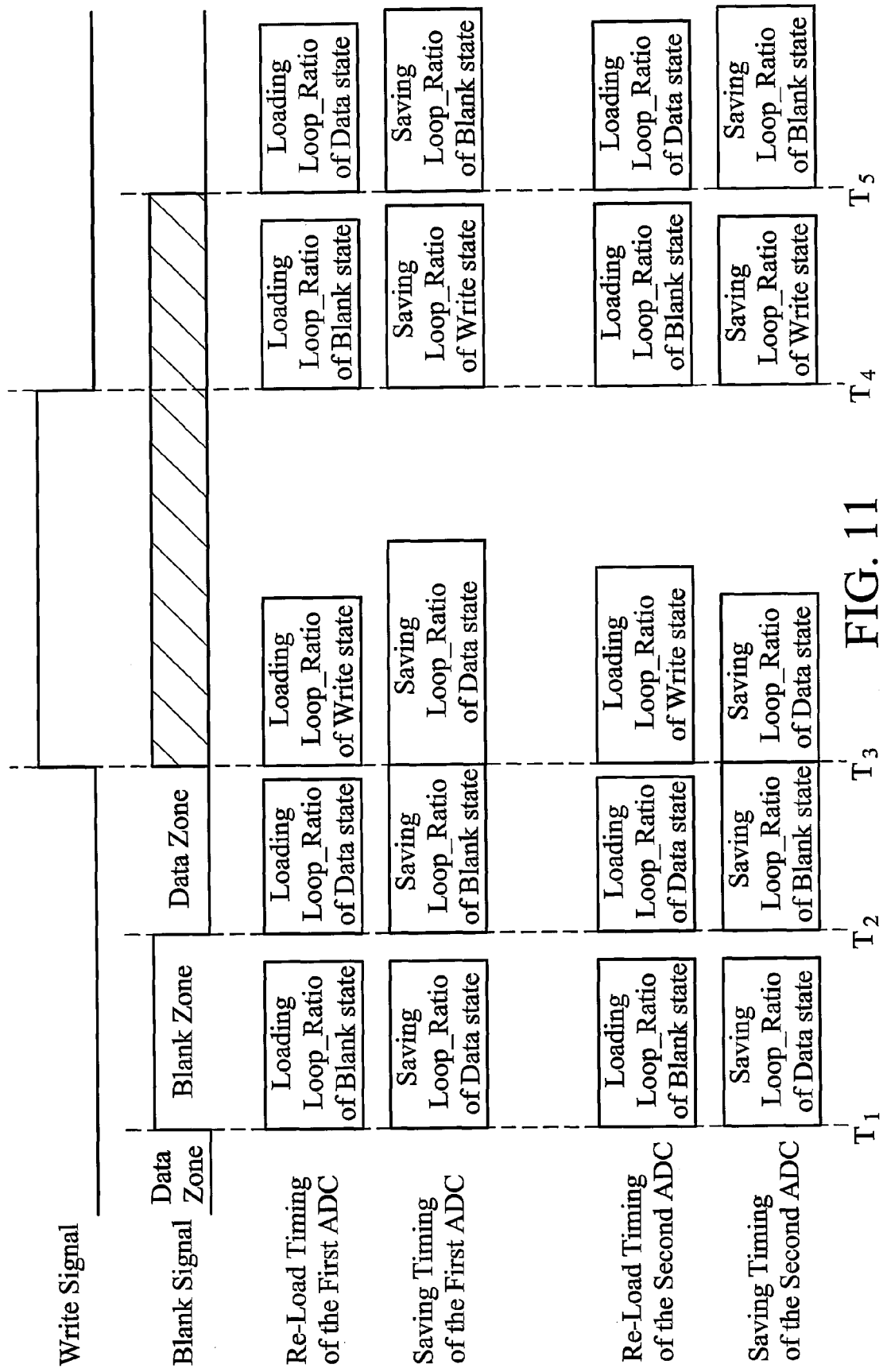
FIG. 11 shows the timing of saving and reloading operations of first and second AGC modules in a state reloading mode.

FIG. 11 shows the timing of the saving and reloading operations of the first and second AGC modules in state reloading mode. As previously explained, the write signal and the blank signal can determine the occurrence of the operating state transition. For example, the reading portion of the optical disc is switched from a data zone to a blank zone at time T1, and switched from a blank zone to a data zone at time T2. The operation of the optical disc drive is switched from reading to writing at time T3, and switched from writing back to a reading at time T4. Each of the times T1~T5 corresponds to an operating state transition, and the saving and reloading operations are also executed at each operating state transition.

For example, because the read portion of the optical disc drive is switched from a data zone to a blank zone at time T1, the loop ratio generation module 510 of the first AGC module 500 immediately saves the current converged value of the loop ratio corresponding to the previous data state into the data storage module 520 in state reloading mode. At the same time, the loop ratio generation module 510 retrieves the previously saved loop ratio value corresponding to the current blank state from the data storage module 520 and directly assigns the previously saved loop ratio value to be the initial value of the loop ratio. Moreover, because the operation of the optical disc drive is switched from reading to writing at time T3, the main-beam sub-beam ratio generation module 560 of the second AGC module 550 immediately saves the current converged value of the MS_ratio corresponding to the previous data state into the data storage module 570 in state reloading mode. At the same time, the main-beam sub-beam ratio generation module 560 retrieves the previously saved MS_ratio value corresponding to the current write state from the data storage module 570 and directly assigns the previously saved MS_ratio value to be the initial value of the MS_ratio.

Figure 12:
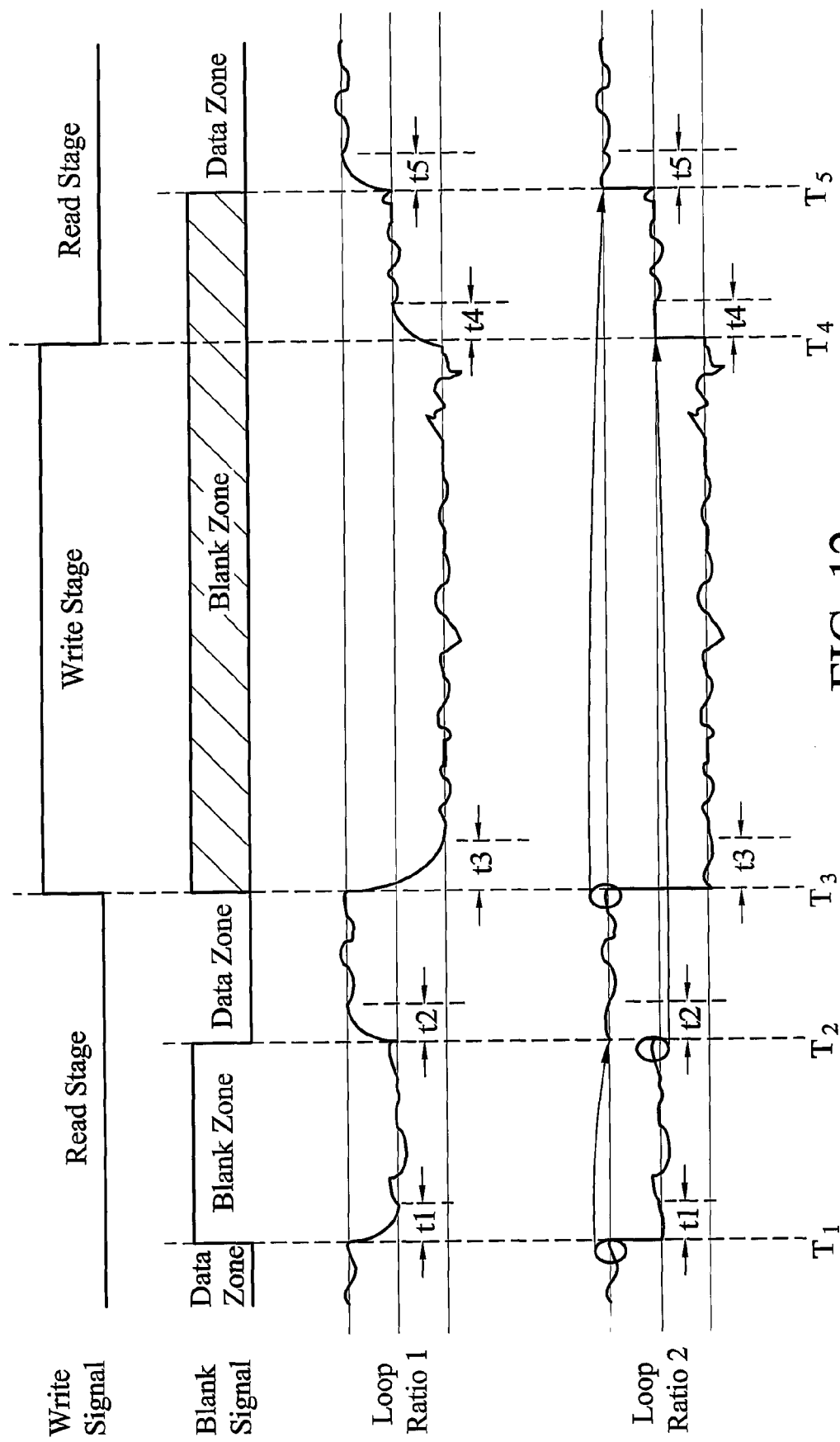
FIG. 12 shows converging processes of a loop ratio in high bandwidth and the state reloading modes.

FIG. 12 shows converging processes of the AGC loop in closed-loop mode and state-reload mode. Each of the times T1~T5 corresponds to an operating state transition as in FIG. 11. The loop ratio 1 shows the converging process of the AGC loop ratio in closed-loop mode only, and the loop ratio 2 shows the converging process of the AGC loop ratio in the combination of state-reload and closed-loop mode. The Bandwidth of AGC loop is selectable. Because the loop ratio 1 could be accelerated with a high bandwidth during a specific period after the operating state transition, rapid convergence of the loop ratio 1 could be attained. Additionally, because previously saved convergence values of the loop ratio or any pre-determined values are immediately assigned to be as the initial values of the loop ratio 2, the loop ratio 2 immediately converges to the correct level to accelerate the convergence of the servo signals.

The invention provides an apparatus for controlling servo signal gains of an optical disc drive. Generation of the servo signal and determination of gain adjustment thereof are implemented in digital domain, thereby facilitating the gain adjustment of the servo signals. The apparatus includes a first AGC module adjusting the loop ratio to determine the gain adjustment, thereby maintaining the strength of the servo signals at a constant under different operating conditions. The apparatus also includes a second AGC module adjusting a main-beam sub-beam ratio to determine the gain adjustment, thereby balancing the intensity difference of the main-beam and the sub-beam in different operating conditions. Additionally, the apparatus adopts a combination of closed-loop mode and state-reload mode to accelerate the convergence of the servo signals during the gain adjustment.

Figure 13:
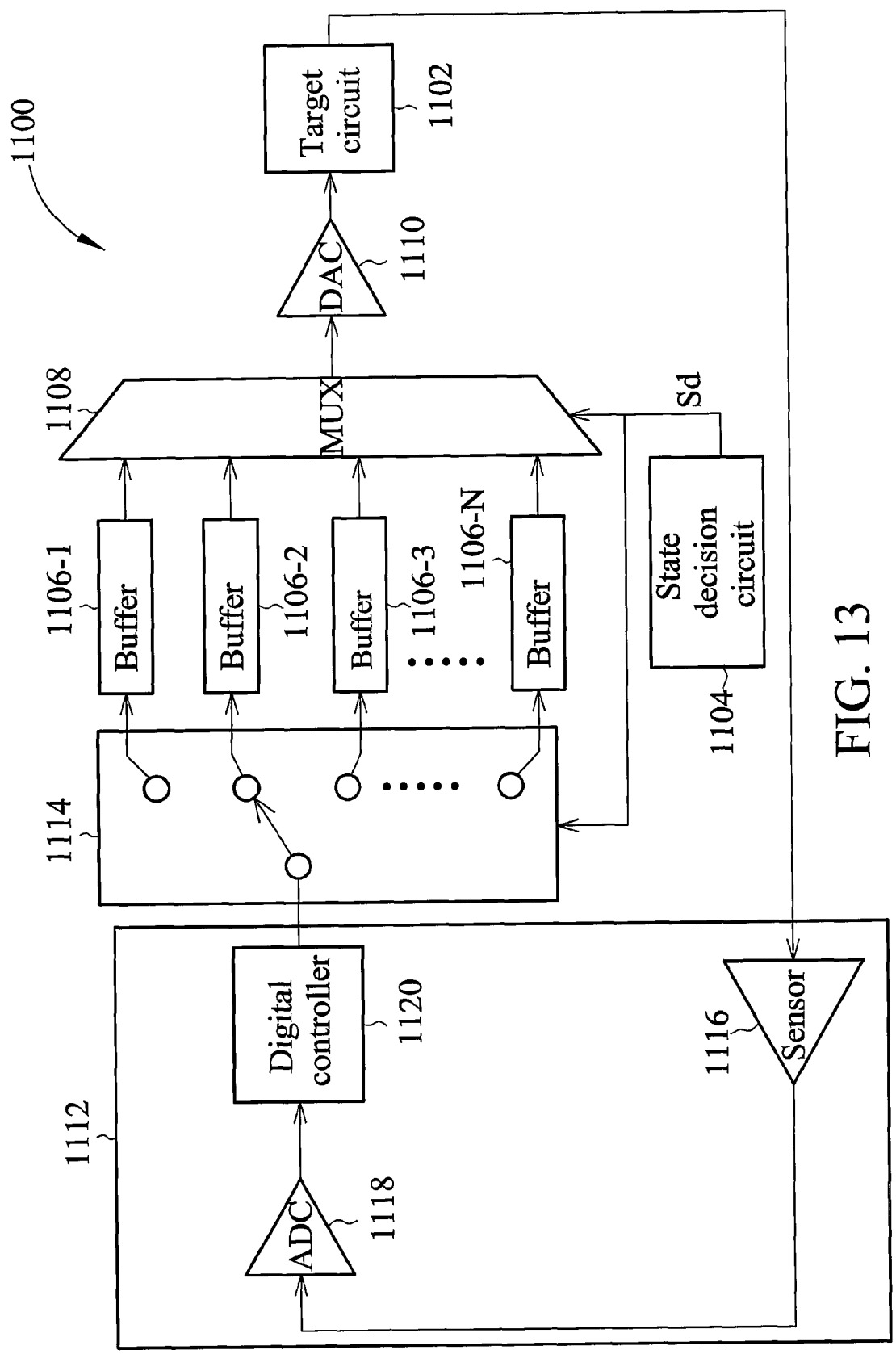
FIG. 13 is a block diagram illustrating a control system according to a first embodiment of the present invention.

Besides the signal processing apparatus for generating the digital servo signals, another digital part of the optical disc drive is digital auto power control system. Please refer to FIG. 13. FIG. 13 is a block diagram illustrating a control system 1100 according to an embodiment of the present invention. As shown in FIG. 13, the control system 1100 comprises a target circuit 1102 (e.g. an optical pick-up unit (OPU)), a state decision circuit 1104, a plurality of buffers 1106-1, 1106-2, 1106-3, ..., 1106-N, a multiplexer (MUX) 1108, a controlling circuit 1112, and a switch 1114. The state decision circuit 1104 is implemented for generating a state decision signal Sd according to a selected operational state of the target circuit 1102; the buffers 1106-1, 1106-2, 1106-3, ..., 1106-N are implemented for storing a plurality of control data corresponding to a plurality of candidate operational states of the target circuit 1102 respectively. The multiplexer 1108 is coupled between the state decision circuit 1104 and buffers 1106, and is implemented for coupling a selected buffer from the buffers 1106-1, 1106-2, 1106-3, ..., 1106-N to a digital-to-analog converter (DAC) 1110 according to the state decision signal Sd for outputting a control datum stored in the selected buffer to the DAC 1110. In this embodiment, the target circuit 1102 (e.g. a laser diode in an optical pick-up unit (OPU)) is a circuit configured to receive an analog input for further processing, and the DAC 1110 is coupled between the multiplexer 1108 and the target circuit 1102 for converting the control datum (i.e. digital datum) into an analog control signal (e.g. a control voltage or a control current) and outputting the analog control signal to the target circuit 1102. It should be noted that in other embodiments where the target circuit 1102 is a circuit configured to receive a digital input for further processing, the DAC 1110 can be omitted. In other words, the DAC 110 is an optional component, depending upon design requirements.

The controlling circuit 1112 is coupled to the target circuit 1102, and is implemented for determining the control datum of the selected operational state according to an operation of the target circuit 1102. As shown in FIG. 13, the controlling circuit 1112 includes a sensor 1116, an analog-to-digital controller (ADC) 1118, and a digital controller 1120. In this embodiment, the target circuit 1102 (e.g. a laser diode in an optical pick-up unit) is a circuit configured to output a non-electrical signal, and the sensor 1116 (e.g. a photo detector) is implemented to convert the non-electrical signal into a corresponding analog electrical signal. The ADC 1118 converts the incoming analog electrical signal into a digital value and outputs the digital value to the digital controller 120. Next, the digital controller 1120 determines and updates the control datum of the selected operational state of the target circuit 1102. Please note that the sensor 1116 is not limited to detect the non-electrical signal generated from the target circuit 1102 into the analog electrical signal. For example, if the target circuit 1102 is designed to perform a mechanism operation, such as moving or rotating, in response to a received control effort, the sensor 1116 is configured to detect the mechanism operation of the target circuit 1102 in order to generate the analog detection result to the following ADC 1118. Additionally, if the target circuit 1102 is designed to generate an analog electrical signal as its output, the sensor 1116 can be omitted. Similarly, in other embodiments where the sensor 1116 is configured to detect operation of the target circuit 1102 and then output a digital detection value, the ADC 1118 can be omitted. Briefly summarized, the ADC 1118 and/or the sensor 1116 can be optional depending upon the design requirements. Those alternative designs mentioned above all obey the spirit of the present invention, and therefore fall within the scope of the present invention.

Referring to FIG. 13, the switch 1114 is coupled between the controlling circuit 1112 and buffers 1106-1, 1106-2, 1106-3, . . . , 1106-N, and is implemented for coupling the controlling circuit 1112 to the selected buffer according to the state decision signal Sd for storing the control datum to the selected buffer corresponding to the selected operational state of the target circuit 1102. Further description of the control system 1100 is as below.

When the target circuit 1102 operates in a first selected operational state, state decision circuit 1104 will generate a first state decision signal and transmit the first state decision signal to the multiplexer 1108. Next, the multiplexer 1108 connects a first buffer corresponding to the first operational state according to the first state decision signal and then outputs a first control datum currently saved in the first buffer (e.g. the buffer 106-1) to the DAC 1110. Subsequently, the DAC 1110 converts the first control datum into a first analog control signal and then outputs the first analog control signal into the target circuit 1102. Finally, the target circuit 1102 operates in the first operational state according to the first analog control signal. Furthermore, the controlling circuit 1112 will detect the operation of the target circuit 1102 and determine a next control datum according to a detecting result. Then, the switch 1114 couples the controlling circuit 1112 to the first buffer according to the first state decision signal received from the state decision circuit 1104 so as to allow the next control datum to be transmitted from the controlling circuit 1112 to the first buffer and thereby be saved in the first buffer.

When it is desired to change operational state in which the target circuit 1102 operates from the first selected operational state to a second selected operational state, the state decision circuit 1104 will generate a second state decision signal and transmit the second state decision signal to the multiplexer 1108. Next, the multiplexer 1108 connects a second buffer (e.g. the buffer 1106-2) corresponding to the second operational state according to the second state decision signal and then outputs a second control datum currently saved in the second buffer to the DAC 1110. Next, the DAC 1110 converts the second control datum into a second analog control signal and then outputs the second analog control signal into target circuit 1102. Finally, the target circuit 1102 operates in the second operational state according to the second analog control signal, where the transition time required for changing the target circuit 1102 from the first operational state to the second operational state is greatly reduced due to the second control datum being stored in the second buffer in advance.

Please note that when it is desired to change the operational state in which the target circuit 1102 operates from the first selected operational state to the second selected operational state, the second state decision signal generated by the state decision circuit 1104 will be delayed by a period of time before being transmitted to the switch 1114, for ensuring that a last control datum corresponding to the first selected operational state is transmitted from the controlling circuit 1112 to the first buffer and saved in the first buffer completely before the switch 1114 is controlled to establish a connection between the controlling circuit 1112 and the second buffer according to the second state decision signal received from the state decision circuit 1104.

Briefly summarized, one of the buffers 1106-1, 1106-2, 1106-3, . . . , 1106-N of the control system 1100 is enabled to store a control datum for a corresponding active operational state of the target circuit 1102, and the control datum is repeatedly updated by the feedback loop established by the controlling circuit 1112 before the operational state of the target circuit 1102 is switched from the selected specific state to a new state. When the target circuit 1102 re-enters the specific state, the last control datum, applied to control the target circuit 1102 in a previous period when the same specific state is active, is output to quickly make an operation of the target circuit 1102 comply with the desired behavior in the specific state. For clear illustration, exemplary embodiments using the multi-buffer architecture are given as below. It should be noted that the following exemplary embodiments are for illustrative purposes only and not meant to be taken as limitations of the present invention.

Figure 14:
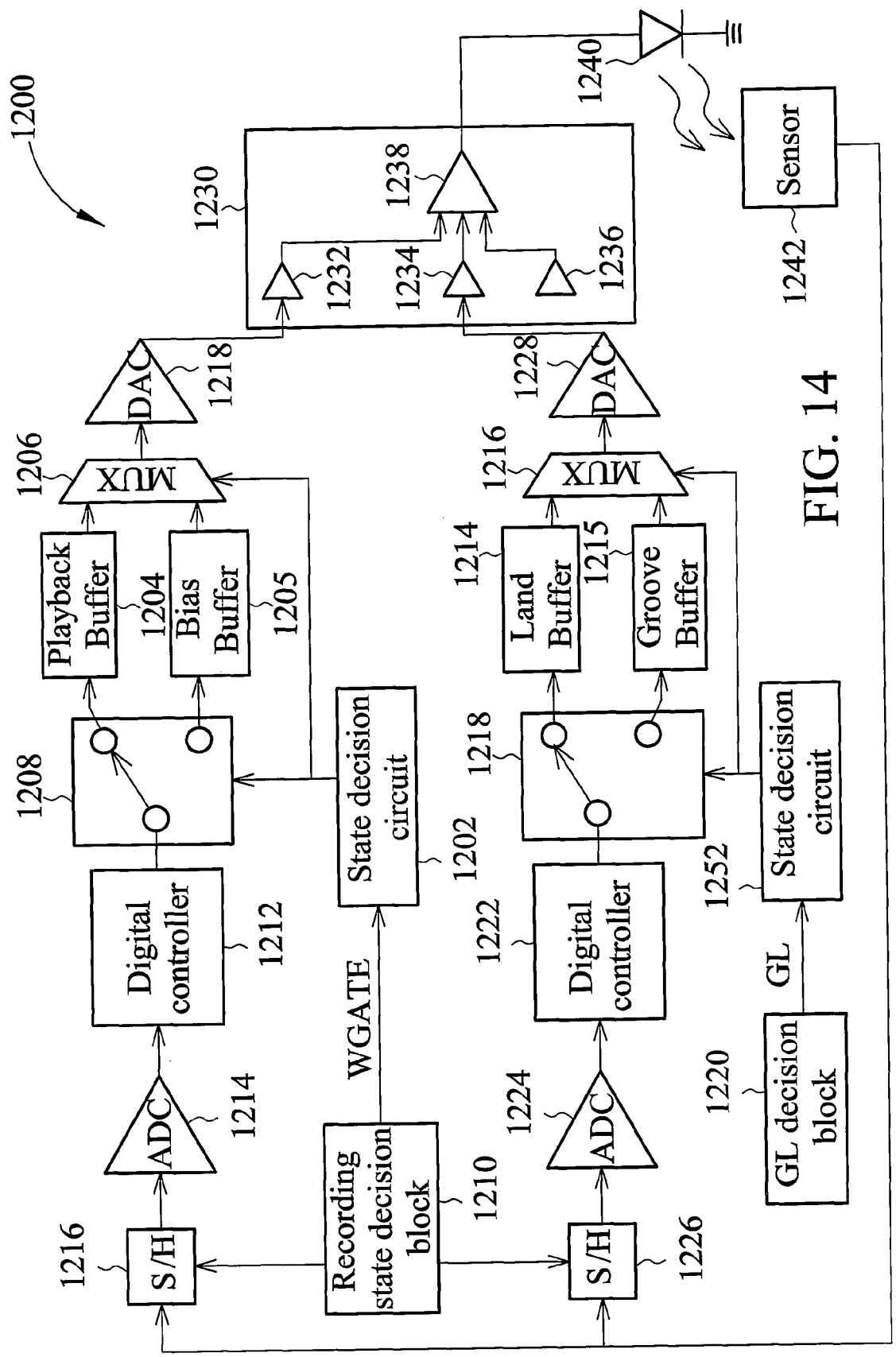
FIG. 14 is a diagram illustrating an automatic power control system of an optical disc drive employing the architecture shown in FIG. 1.

FIG. 14 is a diagram illustrating an automatic power control (APC) system 1200 employing the architecture shown in FIG. 13. In this embodiment, the APC system 1200 is used in an optical disc drive for accessing a DVD-RAM disc. The APC system 1200 has a laser diode 1240 for emitting laser beams onto an optical disc (i.e. a DVD-RAM disc); a sensor 1242 for detecting the laser power of the laser diode 1240; a plurality of state decision circuits 1202, 1212; a playback buffer 1204; a bias buffer 1205; a land buffer 1214; a groove buffer 1215; a plurality of multiplexers 1206, 1216; a plurality of switches 1208, 1218; a recording state decision block 1210 for generating a write gate signal WGATE indicating if the laser diode 1240 enters a write state; a GL decision block 1220 for generating a GL signal indicating a switching between a land track and a groove track on the DVD-RAM disc; a plurality of digital controllers 1212, 1222; a plurality of ADCs 1214, 1224; a plurality of sample/hold circuits 1216, 1226 for sampling output of the sensor 1242 and holding the sampled values fed into the corresponding ADCs 1214; a plurality of DACs 1218, 1228; and a laser driving circuit 1230 having a plurality of laser diode drivers 1232, 1234, 1238 for read power, write power and peak (overdrive) power respectively and a summing circuit 1238 for summing up driving currents outputted from the preceding laser diode drivers to drive the laser diode 1240. Since the configuration shown in FIG. 14 is created by integrating the architecture shown in FIG. 13 into a conventional optical disc drive, and the operations of the optical disc drive are well known to those skilled in this art, further description of each component illustrated in FIG. 14 is not detailed here for the sake of brevity. In the following, only the operations pertinent to the disclosed control mechanism adopted in the APC system 1200 are described.

When it is desired to make the operational state of the optical pick-up unit enter a read state, the state decision circuit 1202 will make the multiplexer 1206 couple with the playback buffer 1204 according to the write gate signal WGATE received from the recording state decision block 1210, and then the multiplexer 1206 outputs a control effort saved in playback buffer 1204 as an initial control effort for the read state. Additionally, the state decision circuit 1202 also switches the switch 1208 to the playback buffer 1204 after a last control effort corresponding to the write state is saved completely into the bias buffer 1205.

On the other hand, when it is desired to make the operational state of the optical pick-up unit change to the write state from the read state, the state decision circuit 1202 will make the multiplexer 1206 couple with the bias buffer 1205 according to the write gate signal WGATE received from the recording state decision block 1210, and then the multiplexer 1206 outputs a control effort saved in bias buffer 1205 as an initial control effort for the write state. Additionally, the state decision circuit 1202 also switches the switch 1208 to the bias buffer 1205 after a last control effort corresponding to the read state is saved completely into the playback buffer 1204. Moreover, regarding the DVD-RAM disc recording, the write state of the optical pick-up unit has two types, land track state and groove track state. The APC device 1200 therefore requires the land buffer 1214 and the groove buffer 1216 for storing two kinds of control efforts corresponding to the land track recording and groove track recording respectively. Accordingly, when the optical pick-up unit performs a writing operation upon a land track, the state decision circuit 1212 will make the multiplexer 1216 couple with the land buffer 1214 according to the indication signal GL received from the GL decision block 1220, and then the multiplexer 1216 outputs a control effort saved in the land buffer 1214 as an initial control effort for the land track recording. Additionally, the state decision circuit 1212 also switches the switch 1218 to the land buffer 1214 after a last control effort corresponding to the groove track recording is saved completely into the groove buffer 1215. However, when an end of the land track is encountered and the optical pick-up unit is ready to record data upon a following groove track, i.e. when the optical pick-up unit performs a writing operation upon a groove track, the operations of the state decision circuit 1212, multiplexer 1216 and switch 1218 are similar to the operations of the state decision circuit 1202, multiplexer 1206 and switch 1208. Therefore, further description is omitted here for brevity.

Figure 15:
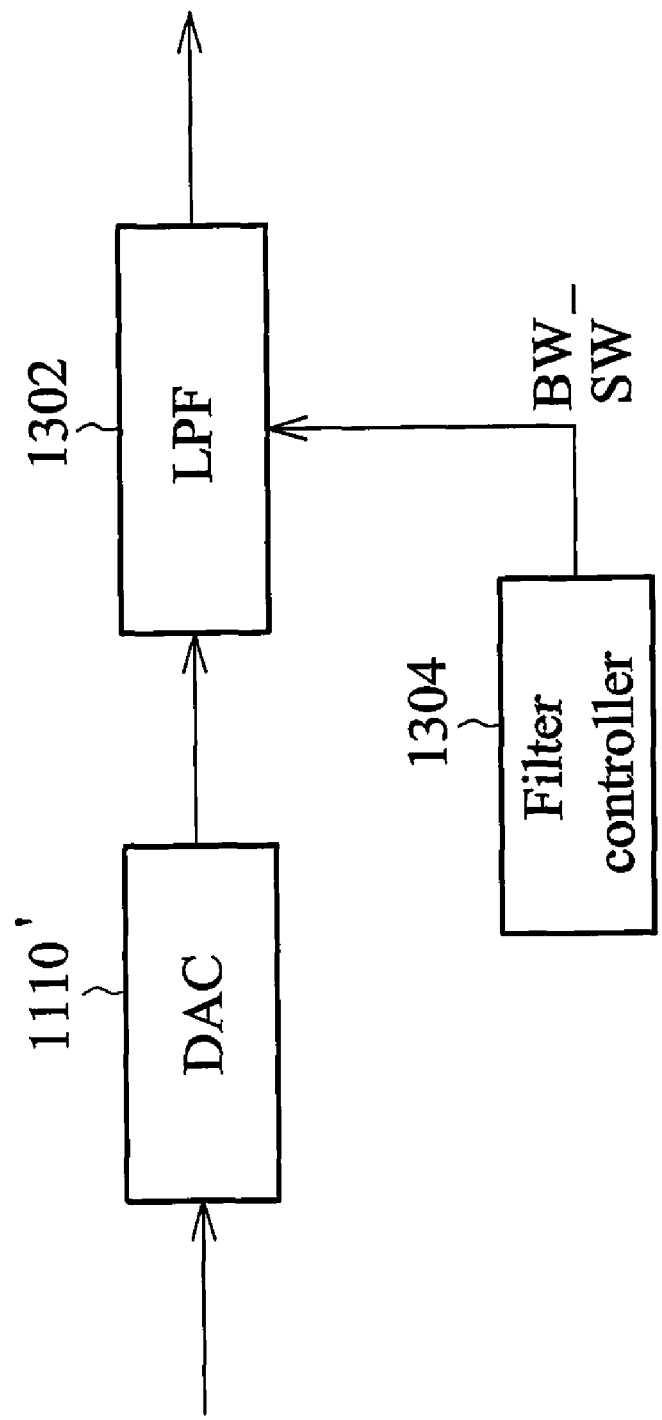
FIG. 15 a block diagram illustrating an alternative DAC architecture according to an embodiment of the present invention.
Figure 16:
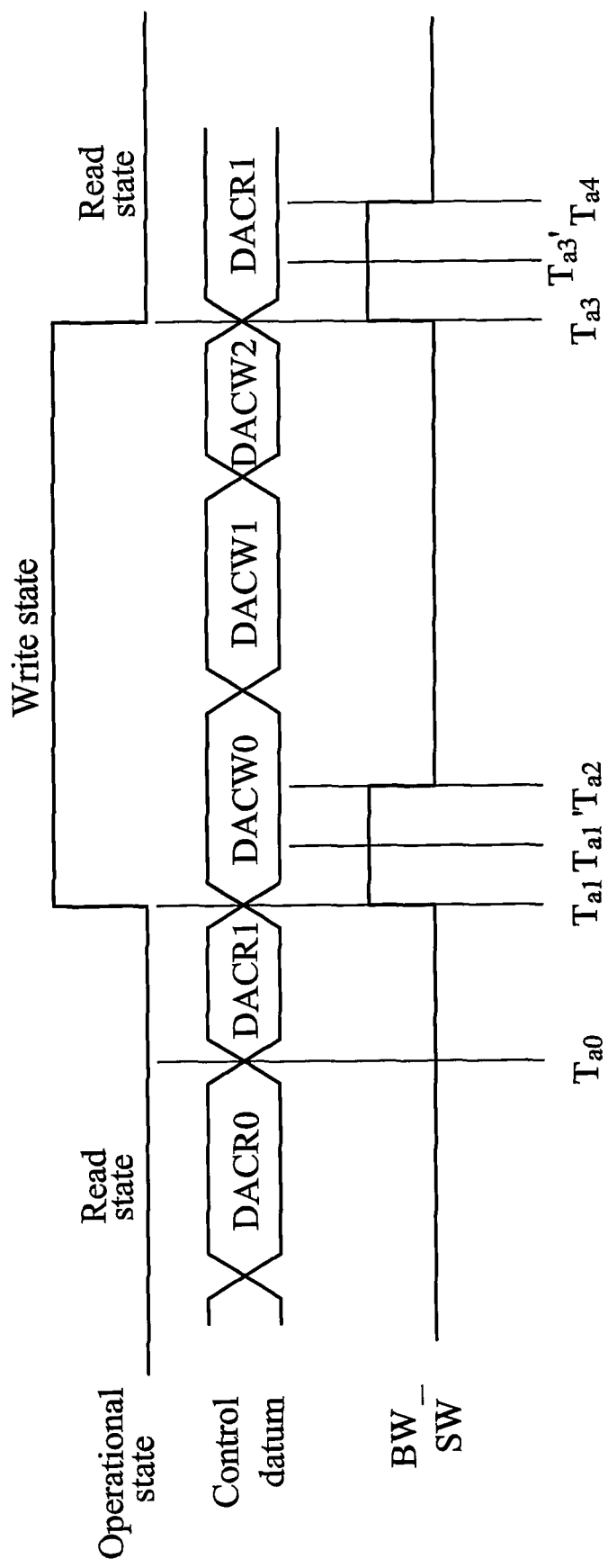
FIG. 16 is a timing diagram illustrating the filter bandwidth adjustment controlled by a filter controller shown in FIG. 3.

Please refer to FIG. 13 again. In the control system 1100 of the multi-buffer architecture mentioned above, the control effort stored in a selected buffer of the buffers 1106-1, 1106-2, 1106-3, . . . , 1106-N will be applied to the DAC 1110 when the state change occurs. However, due to hardware limitations, there may be an unavoidable latency at the output of DAC 1110 while changing the input of the DAC 1100 from control datum of the current state to control datum of the next state. If the latency is too large, the overall system performance will be degraded. Commonly, the latency is introduced due to a specific ADC implementation having a low-pass filter connected to an output of the analog-to-digital converter for stabilizing the analog output fed into the following circuit block (e.g. the target circuit 1102). To solve this problem, the present invention further discloses a mechanism to dynamically control the response speed of the analog output fed into the target circuit 1102. Please refer to FIG. 15, which is a block diagram illustrating an alternative DAC architecture according to an embodiment of the present invention. The DAC 1110 is replaced with the combination including an ADC 1110', a low-pass filter (LPF) 1302, and a filter controller 1304. The ADC 1110' is used for receiving the control datum outputted from the multiplexer 1108 and then converting the control datum into an analog control signal. The LPF 1302 is implemented for filtering out high-frequency components in the analog control signal to smooth the analog control signal fed into the target circuit 1102. In this embodiment shown in FIG. 15, the filter controller 1304 is coupled to the LPF 1302, and is configured to output a control signal BW_SW to change a bandwidth of the LPF 1302 when detecting a state transition from a selected operational state to a next selected operational state. Please refer to FIG. 16. FIG. 16 is a timing diagram illustrating the filter bandwidth adjustment controlled by the filter controller 304 shown in FIG. 3. Suppose that the target circuit 1102 is a laser diode of an optical pick-up unit and the current state is a read state. It should be noted that the digital-to-analog converter 1110 used in the above-mentioned embodiments is driven by a fixed clock signal to update its output periodically according to the input digital value received at the time triggered by the clock signal. Therefore, as shown in FIG. 16, at the timing Ta0, the DAC 1110' reads the control datum DACR1 stored in a selected buffer (e.g. the buffer 1106-1) corresponding to the read state, where the control datum DACR1 is determined by the digital controller 1120 for updating the previous control datum DACR0. At the timing Ta1, the operational state of the target circuit 1102 is changed to a write state from the current read state. The filter controller 1304 is triggered by the state transition, for example, from the state decision signal Sd outputted from the state decision circuit 1104, and the control signal BW_SW is set to a high logic level to switch the LPF 1302 to a high bandwidth mode, thereby allowing the analog output of the DAC 1110' to reach the desired level rapidly. At the timing Ta2, the filter controller 1304 resets the control signal BW_SW to a low logic level to switch the LPF 1302 back to a low bandwidth mode. It should be noted that after the LPF 1302 enters the low bandwidth mode, the analog output fed into the target circuit 1102 changes smoothly but the signal-to-noise ratio (SNR) is high. Similarly, at the timing Ta3, the operational state of the target circuit 1102 is changed to a read state from the current write state. The filter controller 1304 is triggered by the state transition to make the control signal BW_SW set to a high logic level to switch the LPF 1302 to a high bandwidth mode, thereby allowing the analog output of the DAC 1110' to reach the desired level rapidly; and at the timing Ta4, the filter controller 1304 resets the control signal BW_SW to a low logic level to switch the LPF 1302 back to a low bandwidth mode. In addition, as shown in FIG. 16, the DAC 1110' is also configured to change its analog output in spite of the updating timing defined by the clock signal inputted thereto. For example, at the timing Ta1 which is prior to the normal updating timing Ta1', the DAC 1110' changes its updating timing in response to the state transition; similarly, at the timing Ta3 which is prior to the normal updating timing Ta3', the DAC 1110' changes its updating timing in response to the state transition, thereby also decreasing the latency and increasing the response speed. Any ADC architectures using one or both of the aforementioned latency reduction techniques all fall within the scope of the present invention.

Figure 17:
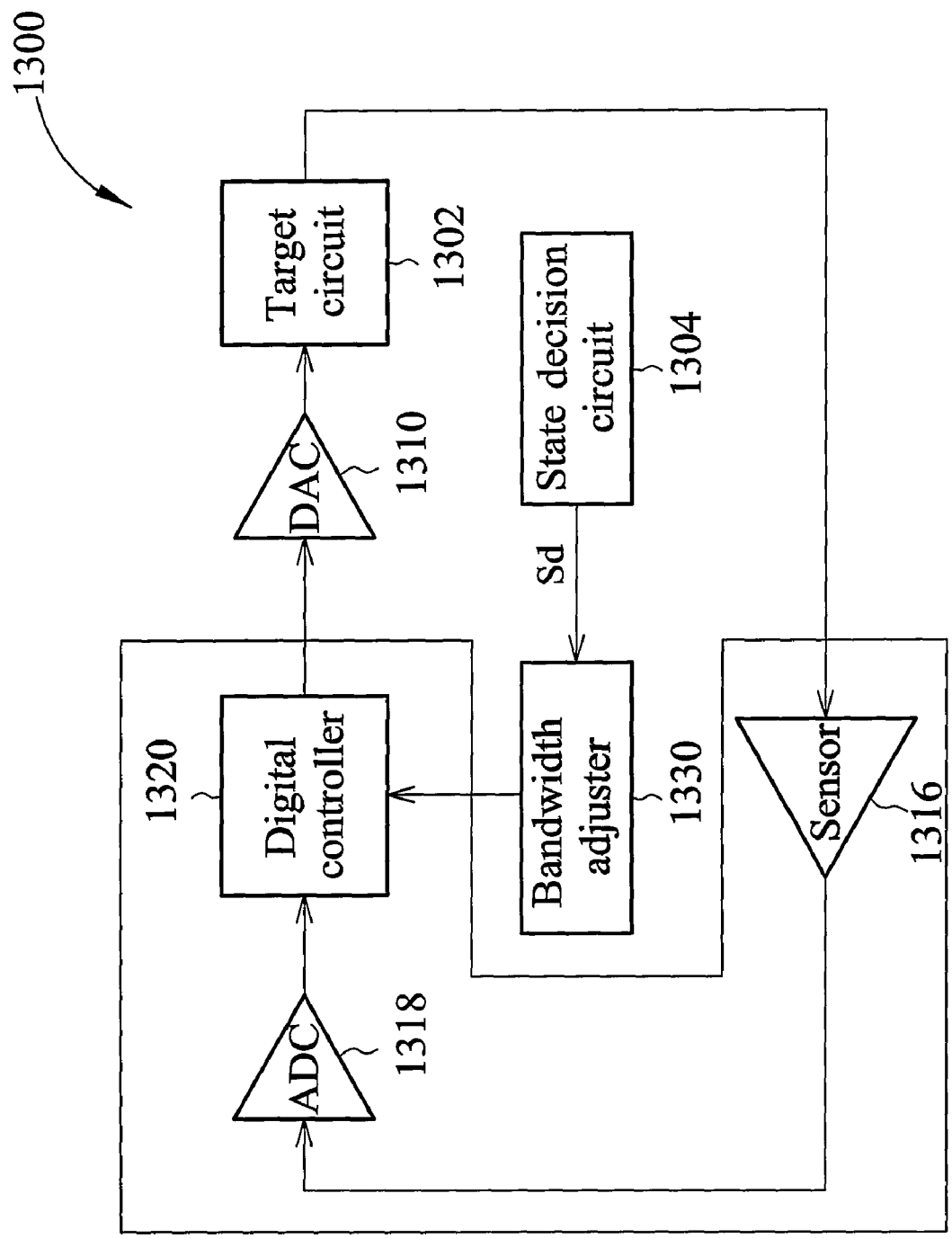
FIG. 17 is a block diagram illustrating a control system according to a second embodiment of the present invention.

Please refer to FIG. 17. FIG. 17 is a block diagram illustrating a control system 1300 according to another embodiment of the present invention. In this embodiment, the control system 1300 comprises a target circuit 1302, a state decision circuit 1304, a DAC 1310, a bandwidth adjuster 1330, and a controlling circuit 1312 having a sensor 1316, an ADC 1318, and a digital controller 1320. Please note that the components of the same name in the embodiments shown in FIG. 13 and FIG. 17 have the same operation and functionality, and further description is omitted for brevity. Similarly, the above-mentioned optional modifications made to the control system 1100 are suitable for the control system 1300, and further description is omitted here as well. The bandwidth adjuster 1330 is coupled to the digital controller 1320 and the state decision circuit 1304 to adjust the bandwidth of the controller according to the state decision signal Sd generated from the state decision circuit 1304. For example, the bandwidth adjuster 1330 is configured to change the bandwidth of the digital controller 1320 from a first bandwidth to a second bandwidth higher than the first bandwidth when a state transition occurs, and then change the bandwidth of the digital controller 1320 from the second bandwidth to the first bandwidth after a predetermined period of time.

In this embodiment, the bandwidth adjuster 1330 adjusts the bandwidth of the digital controller 1320 by adjusting a gain setting of the digital controller 1320, a clock rate of the digital controller 1320, or a combination thereof. For example, suppose that the digital controller 1320 is operated under a clock rate CLK and is configured to have a gain G, where the clock rate CLK defines the updating speed of the analog output, and the gain G defines the step size of adjusting the analog output. If the clock rate CLK is doubled to be 2*CLK with the same gain G, the time required for changing the analog output from a first level to a second level is half that of the original bandwidth setting; similarly, if the gain G is doubled to be 2*G and the clock rate CLK is unchanged, the time required for changing the analog output from the first level to the second level is also half that of the original bandwidth setting. For clear illustration, exemplary embodiments using the bandwidth adjuster are given as below. It should be noted that the following exemplary embodiments are for illustrative purposes only and not meant to be taken as limitations of the present invention.

Figure 18:
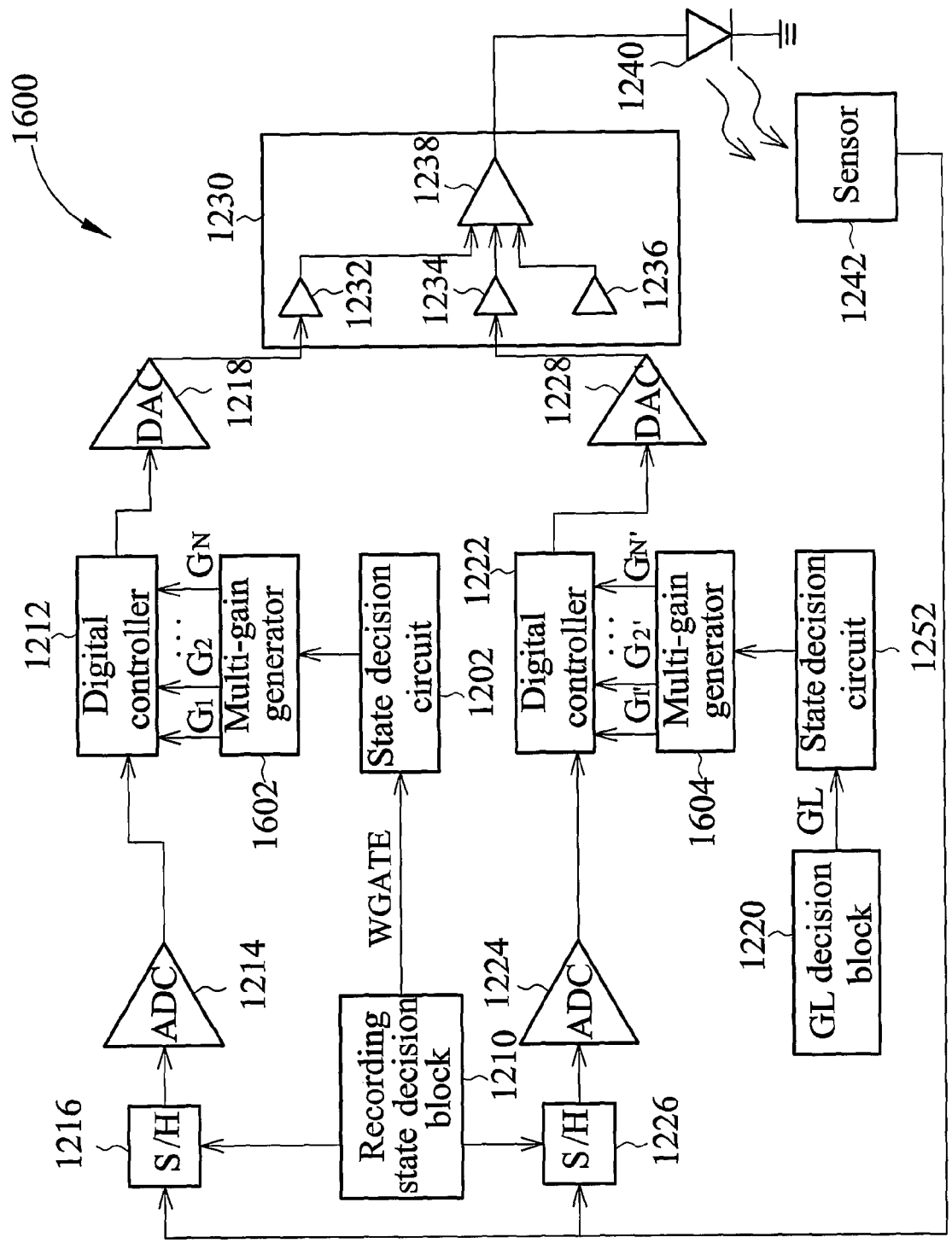
FIG. 18 is a diagram illustrating an automatic power control system of an optical disc drive employing the architecture shown in FIG. 5.
Figure 19:
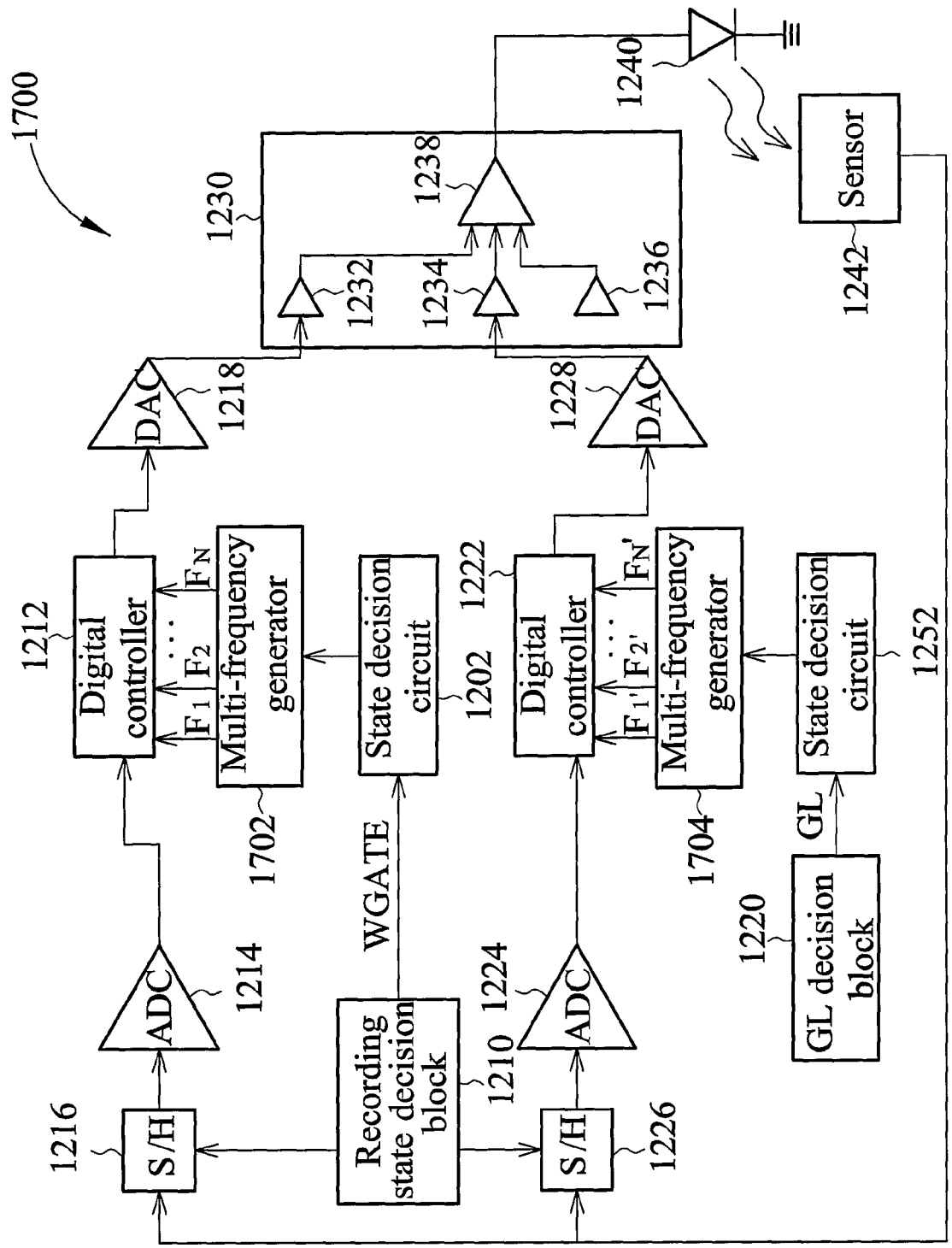
FIG. 19 is a diagram illustrating another automatic power control system of an optical disc drive employing the architecture shown in FIG. 5.

FIG. 18 is a diagram illustrating an automatic power control (APC) system 1600 employing the architecture shown in FIG. 17, and FIG. 19 is a diagram illustrating another automatic power control (APC) system 1700 employing the architecture shown in FIG. 17. In these embodiments, the APC systems 1600 and 1700 each are used in an optical disc drive for accessing a DVD-RAM disc. Since the operation and functionality of the components having aforementioned reference numerals are detailed above, further description is omitted here for brevity. In FIG. 18, the multi-gain generator 1602 serves as a bandwidth adjuster used for setting the gain setting of the corresponding digital controller 1212 by a target gain value selected from the candidate gain values G1, G2, ..., GN to thereby adjust the controller bandwidth, and the multi-gain generator 1604 serves as a bandwidth adjuster used for setting the gain setting of the corresponding digital controller 1222 by a target gain value selected from the candidate gain values G1', G2', ..., GN' to thereby adjust the controller bandwidth. Regarding the APC system 1700 shown in FIG. 7, the multi-frequency generator 1702 serves as a bandwidth adjuster used for setting the clock rate of the corresponding digital controller 1212 by outputting a clock signal with a target frequency selected from the candidate clock signals with different frequency values F1, F2, ..., FN to thereby adjust the controller bandwidth, and the multi-frequency generator 1704 serves as a bandwidth adjuster used for setting the clock rate of the corresponding digital controller 1222 by a clock signal with a target gain value selected from the candidate clock signals with different frequency values F1', F2', ..., FN' to thereby adjust the controller bandwidth. It should be noted that the disclosed ADC architecture in FIG. 15 can be applied to the APC systems 1600, 1700 to reduce the latency of changing the analog output fed into the following target circuit (e.g. the laser diode of the optical pick-up unit). This also falls within the scope of the present invention.

Figure 20:
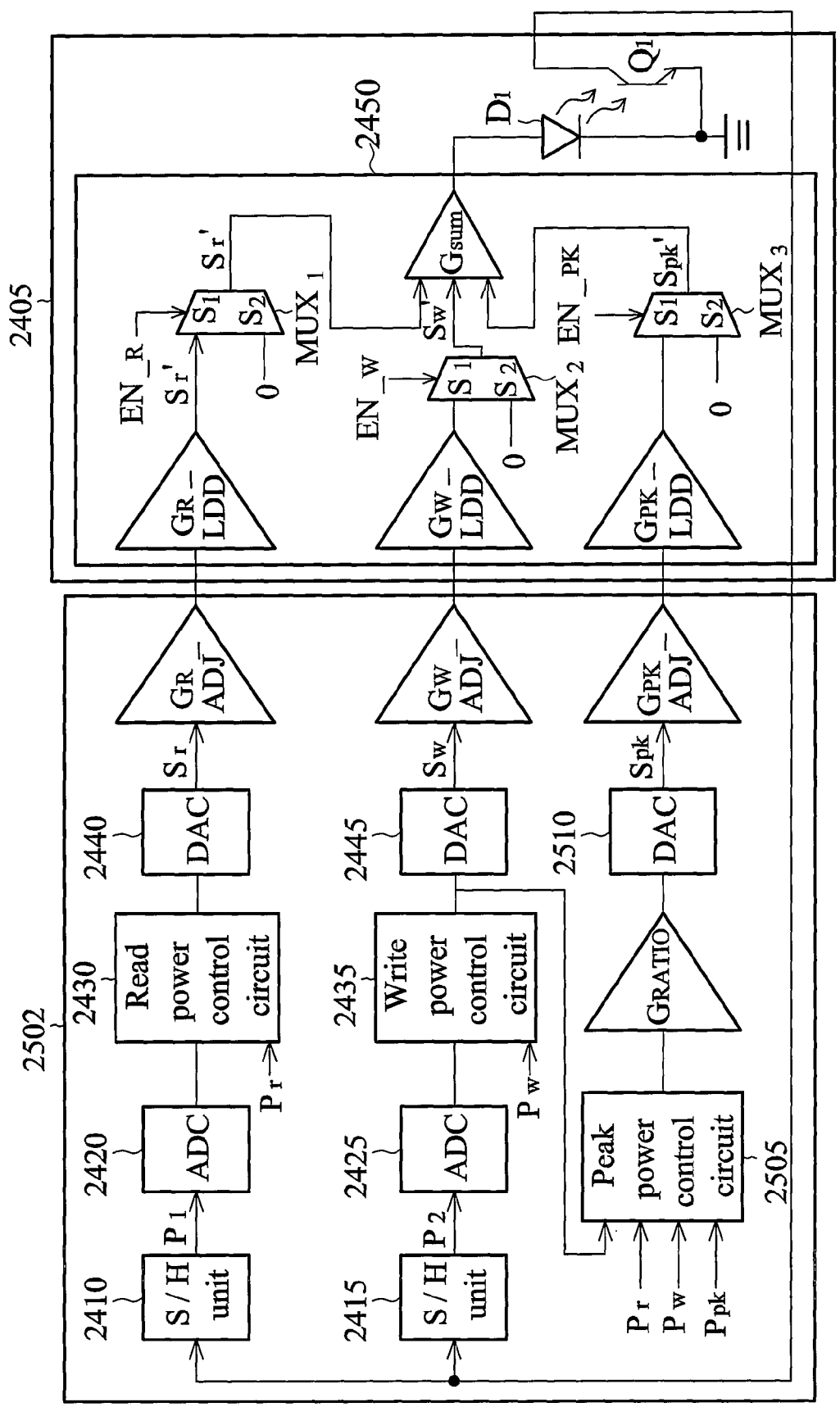
FIG. 20 is a schematic diagram of an APC system coupled to an OPU according to an embodiment of the present invention.

Please refer to FIG. 20. FIG. 20 is a schematic diagram of an APC system 2502 coupled to the OPU 2405 according to an embodiment of the present invention. The APC system 2502 is utilized for controlling an output power level emitted from the OPU 2405. The APC system 502 further utilizes a peak power control circuit 505 and a DAC 510 for controlling an actual peak power level emitted from the LD D1 at a target peak power level. In this embodiment, suppose that an actual write power level and an actual read power level emitted from the LD D1 have been calibrated at a target write power level Pw and a target read power level Pr respectively. The peak power control circuit 505 is utilized for receiving a write power control value outputted from the write power control circuit 2435 and then determining a peak power control value according to the target write power level Pw, the target read power level Pr, the target peak power level Ppk, and the received write power control value. The peak power control value is amplified by a digital gain amplifier GRATIO X' times, which X' means a value equal to (Ppk−Pw)/Pw; the amplified peak power control value is then converted into a driving signal Spk by the DAC 2510. The driving signal Spk is amplified through the adjustable gain amplifier GPK_ADJ and the gain amplifier GPK_LDD for outputting a driving signal Spk' to the analog adder Gsum. The analog adder Gsum can output a resultant driving signal to drive the LD D1 for irradiating an appropriate power level onto a recordable disc according to the driving signals Sr', Sw', and Spk'. For example, the driving signals Sr', Sw', and Spk' are all non-zero driving currents when the multiplexers MUX1, MUX2, and MUX3 are controlled respectively by signals EN_R, EN_W, and EN_PK to remain in state S1. The analog adder Gsum can sum up the driving currents Sr', Sw', and Spk' to output the resultant driving current fed into the LD D1 for driving the LD D1 to emit a laser light with the target peak power level Ppk. The detailed operation of the peak power control circuit 505 is discussed in the following paragraphs.

Figure 21:
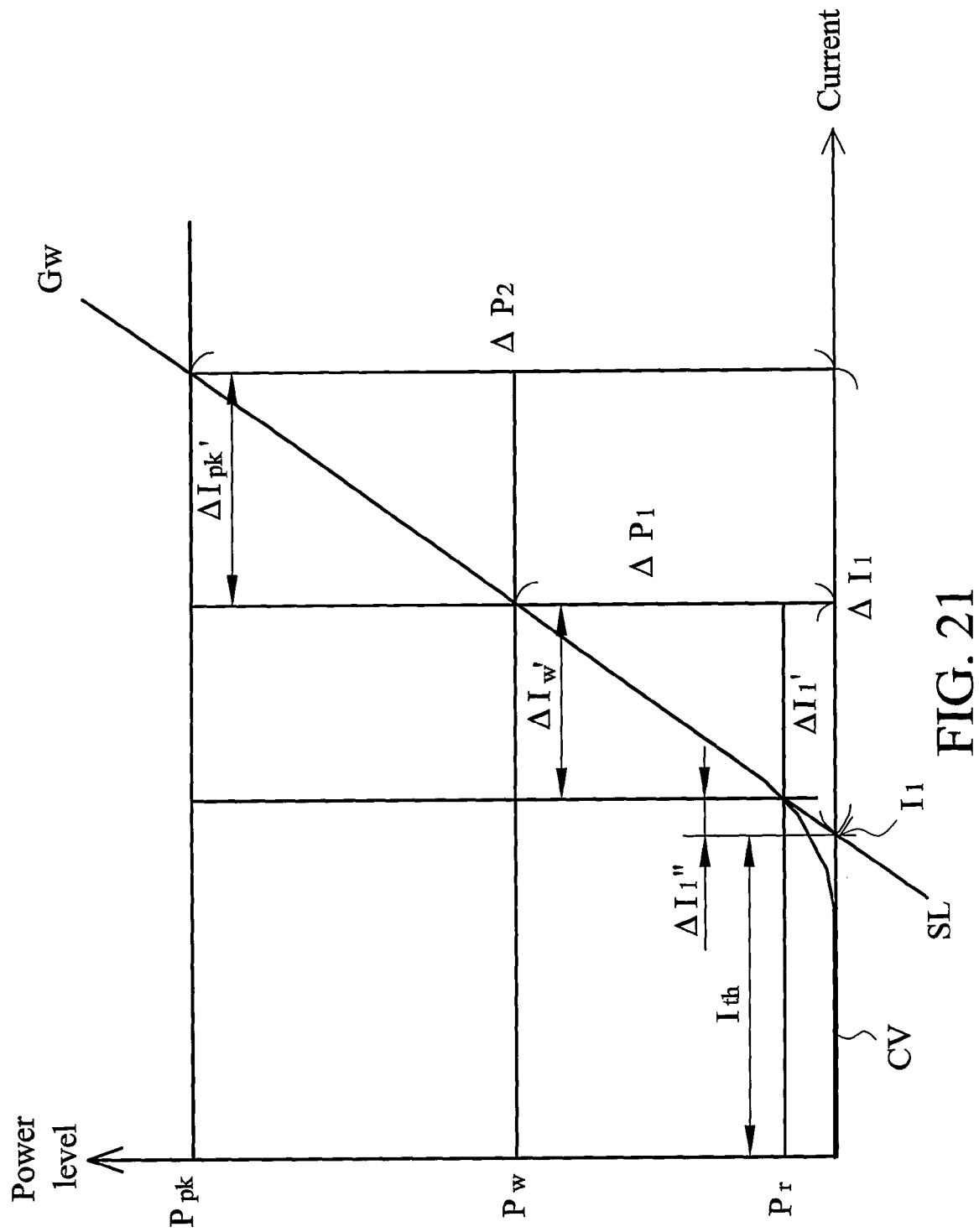
FIG. 21 is a diagram showing a straight line SL and a characteristic curve CV of the LD shown in FIG. 5.

Please refer to FIG. 21. FIG. 21 is a diagram showing a straight line SL and a characteristic curve CV of the LD D1 shown in FIG. 20. It is assumed that a slope of the characteristic curve CV from the target read power level Pr to the target write power level Pw is identical to that of the characteristic curve CV from the target write power level Pw to the target peak power level Ppk, and the slope is also identical to that of the straight line SL extending from the characteristic curve CV. The slope is also considered as a total gain of a driving current to an output power and referred to as Gw in this embodiment. As shown in FIG. 21, the straight line SL crosses the horizontal axis at a point I1 (representative of a current value) on the horizontal axis, and the slope Gw can be calculated according to the target read power level Pr, the target write power level Pw, and an amount of current ΔIw' corresponding to the write power control value. According to the well-known equal ratios theorem, a ratio of an amount of current ΔI1' to an amount of current ΔI1 is identical to that of a power difference ΔP1 (this is equal to the target write power level Pw) to a power difference ΔP2, where the power difference ΔP2 is equal to the target peak power level Ppk. This relation can be illustrated by the following equation:

$$\frac{P_w}{P_{pk}} = \frac{\Delta I'_1}{\Delta I_1} = \frac{(\Delta I''_1 + \Delta I'_w)}{(\Delta I''_1 + \Delta I'_w + \Delta I'_{pk})} \qquad \text{Equation (1)}$$

In Equation (1), the parameter ΔI1" is meant to be an amount of current shown in FIG. 21 and can be calculated according to the slope Gw and target read power level Pr, and the amount of current ΔIw' can be derived according to the driving signal Sw'. Since the target peak power level Ppk and the target write power level Pw are known and the amounts of current ΔI1" and ΔIw' are calculated, the amount of current ΔIpk' can also be calculated by Equation (1). That is, the peak power control value can be derived if the write power control value and an adjusting value corresponding to the amount of current ΔI1" are determined, since a conversion relation between driving signals corresponding to the above-mentioned amounts of current and control values is almost linear. Thus, the adjusting value corresponding to the amount of current ΔI1" can be calculated according to the amount of current ΔI1" and the conversion relation between the driving signals and control values. The peak power control value is determined once the adjusting value is calculated, and then the APC system 2502 can control the actual peak power level at the target peak power level Ppk correctly according to the peak power control value. In this embodiment, the peak power control value is equal to the value of the write power control value plus the determined adjusting value. Even though a required driving current passing through the LD D1 may be a little different due to the above-mentioned reasons (e.g. a change of the temperature of the LD D1 or the other factors), the APC system 2502 can still control the actual peak power level at the target peak power level Ppk effectively by deriving a new adjusting value according to the target read power P–r, and a new calculated slope (usually, when the required driving current is different, there is also some possibility that the write power control value is changed and therefore it is necessary to calculate a new slope).

The new slope can be calculated according to the target read power level P–r, the target write power level Pw, and the changed write power control value.

In addition, since the slope Gw of the characteristic curve CV from the target read power level Pr to the target write power level Pw is assumed to be identical to that of the characteristic curve CV from the target write power level Pw to the target peak power level Ppk, it is also necessary to adjust the gain of the adjustable gain amplifier GPK_ADJ to ensure that the gain of the write channel is equal to that of a peak channel. The peak channel is meant to be a signal path through the peak power control circuit 2505, the digital gain amplifier GRATIO, the DAC 2510, the adjustable gain amplifier GPK_ADJ, and the gain amplifier GPK_LDD. Therefore, the relation between total gains of the write channel and the peak channel can be illustrated as the following equation:

$$X' \times G_{pkadj} G_{pkldd} \times G_s = G_{wadj} G_{wldd} \times G_s \qquad \text{Equation (2)}$$

In Equation (2), the parameter X' is just the ratio (Ppk–Pw)/Pw. Parameters Gpkadj, Gpkldd, Gwadj, Gwldd, and Gs are gains of the gain amplifiers GPK_ADJ, GPK_LDD, GW_ADJ, GW_LDD, Gsum respectively. From Equation (2), the gain Gpkadj of the adjustable gain amplifier GPK_ADJ can be determined since the gain Gpkadj depends on the parameters R, Gpkldd, Gwadj, and Gwldd.

Of course, it will be obvious that the gains Gpkadj and Gwadj are the same and the adjustable gain amplifiers GPK_ADJ and GW_ADJ can therefore be removed from the APC system 2502 without incurring errors if the gains Gpkldd and Gwldd are identical and the target write power level Pw is half of the target peak power level Ppk. In another embodiment, the amount of current ΔIpk' corresponding to the peak power control value can equivalently be derived by directly dividing the target write power level Pw by the slope Gw, without calculating the amount of current ΔI1" corresponding to the adjusting value. That is, the peak power control circuit 2505 can also generate the peak power control value according to the target write power level Pw and the slope Gw, without calculating the adjusting value. This also falls within the scope of the present invention.

Furthermore, although controlling the actual peak power level at the target peak power level when accessing/recording a recordable disc is only discussed in the above-mentioned embodiments, the method disclosed in the embodiments of the present invention can also be applied to controlling an actual write power level at a target write power level when accessing/recording a rewritable disc. This also obeys the spirit of the present invention.

In other embodiments, the peak power control circuit 2505 can further multiply the above-mentioned peak power control value by the parameter X' (i.e. the ratio (Ppk–Pw)/Pw) to output an amplified control value to the DAC 2510. Thus, the digital gain amplifier GRATIO in the APC system 2502 is not required and is excluded from the APC system 2502. The relation between total gains of the write channel and the peak channel is illustrated as the following equation:

$$G_{pkadj} \times G_{pkldd} \times Gs = G_{wadj} \times G_{wldd} \times G_s \qquad \text{Equation (3)}$$

Referring to Equation (3), the gain Gpkadj of the adjustable gain amplifier GPK_ADJ only depends on the parameters Gpkldd, Gwadj, and Gwldd.

Figure 22:
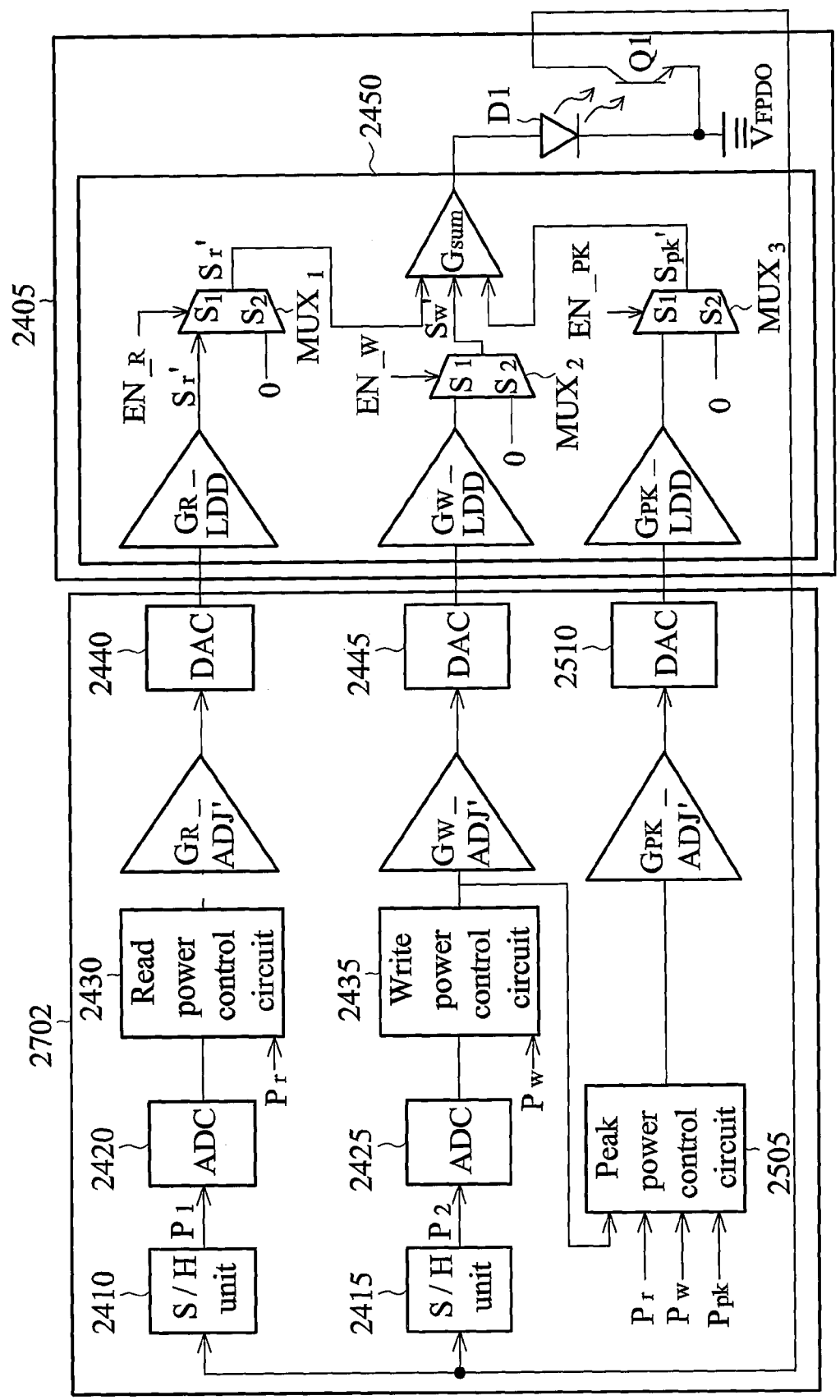
FIG. 22 is a schematic diagram of an APC system coupled to an OPU according to another embodiment of the present invention.

Moreover, in another embodiment, the adjustable gain amplifiers GR_ADJ, GW_ADJ, and GPK_ADJ can be respectively replaced by other digital adjustable gain amplifiers, which are located at the front stages of the above-mentioned power control circuits (as shown in FIG. 22). In this embodiment, the gain of an adjustable gain amplifier GPK_ADJ' is modified as the original gain value (i.e. the gain of the adjustable gain amplifier GPK_ADJ in the APC system 2502) multiplied by the above-mentioned parameter X'. Consequently, the digital gain amplifier GRATIO is not needed. However, the gain of the adjustable gain amplifier GPK_ADJ' can also be designed to be equal to the gain of the adjustable gain amplifier GPK_ADJ in the APC system 2502, so the digital gain amplifier GRATIO is required in this situation. This also obeys the spirit of the present invention.

Figure 23B:
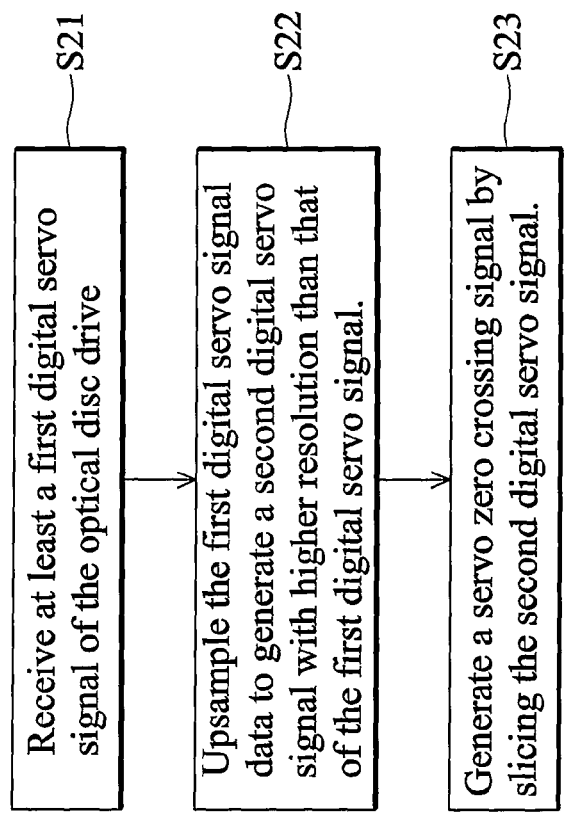
FIG. 23B is a flowchart of a second method of generating a zero crossing signal of an optical disc drive according to another exemplary embodiment of the invention.
Figure 23A:
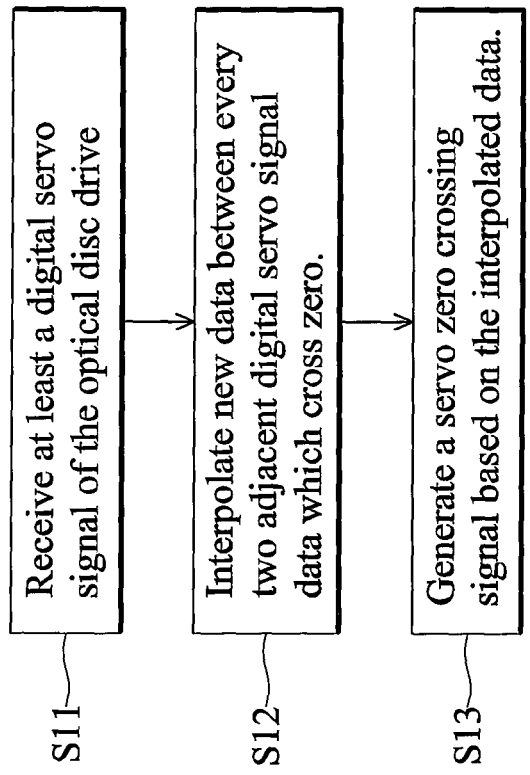
FIG. 23A is a flowchart of a first method of generating a zero crossing signal of an optical disc drive according to an exemplary embodiment of the invention.

FIG. 23A is a flowchart of a first method of generating a zero crossing signal of an optical disc drive according to an embodiment of the invention. The method comprises receiving at least a digital servo signal of the optical disc drive (step S11). The digital servo signal from the optical disc drive can be a tracking error (TE) signal, a radio frequency ripple (RFRP) signal, a focus error (FE) signal or other. Next, new data is interpolated between every two adjacent digital servo signals which cross zero (step S12). Finally, a servo zero crossing signal is generated through the interpolated data (step S13).

FIG. 23B is a flowchart of a second method of generating a zero crossing signal of an optical disc drive according to another exemplary embodiment of the invention. First, at least a first digital servo signal of the optical disc drive is received (step S21). Also, the digital servo signal from the optical disc drive can be a tracking error (TE) signal, a radio frequency ripple (RFRP) signal, a focus error (FE) signal or other. Next, the first digital servo signal data is upsampled to generate a second digital servo signal with higher resolution than the first digital servo signal (step S22). Finally, a servo zero crossing signal is generated by slicing the second digital servo signal (step 23).

Figure 24:
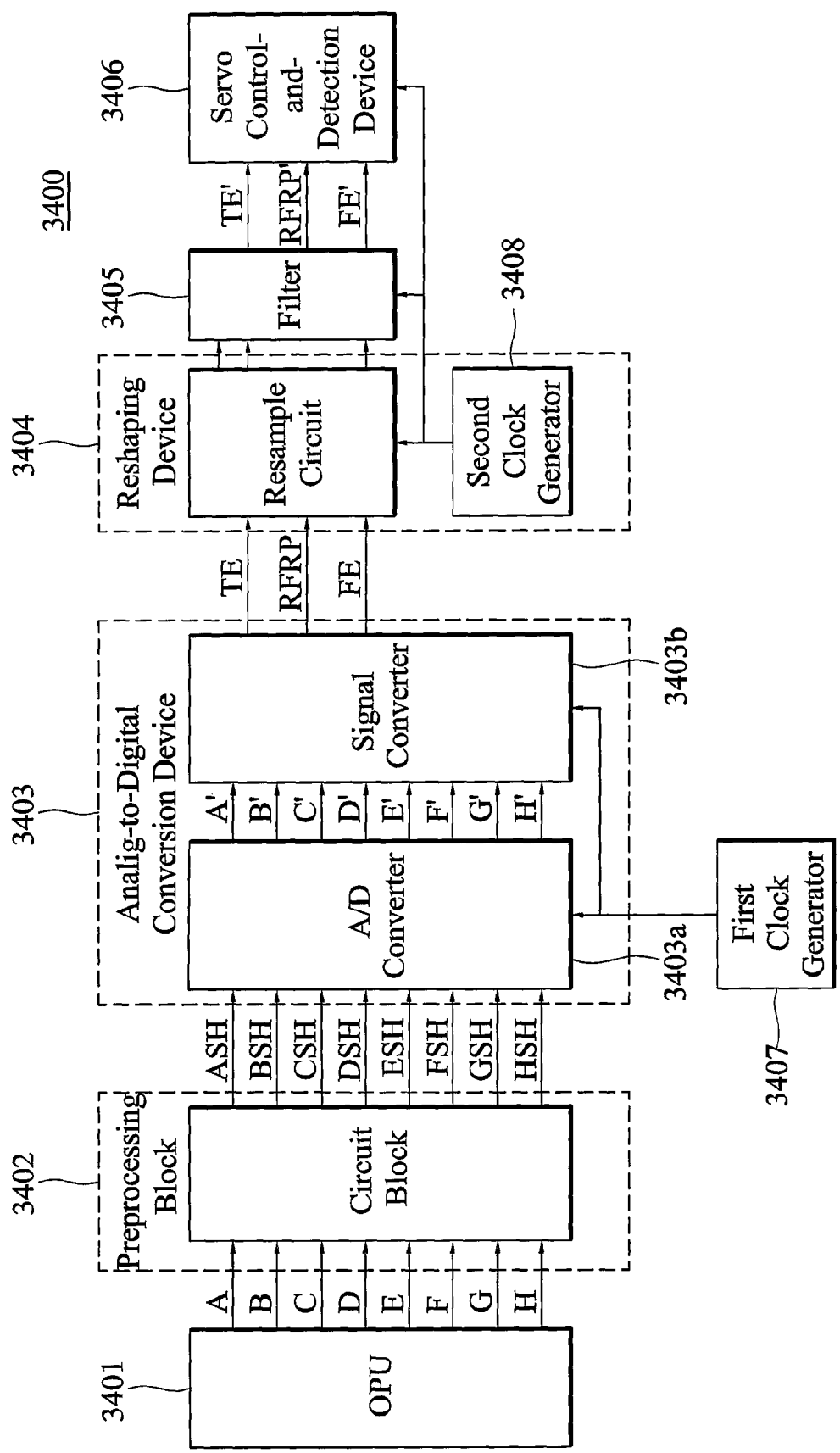
FIG. 24 shows a signal processing apparatus for an optical disc drive according to an embodiment of the invention.

FIG. 24 shows a signal processing apparatus 3400 for an optical disc drive (not shown in FIG. 24) according to an exemplary embodiment of the invention. Optical pickup unit (OPU) 3401 of the optical disc drive receives a laser signal reflected from a disc and generates signals A to H which are sent to a preprocessing block 3402. Here, the preprocessing block 3402 is a circuit block as shown in FIG. 1, which performs sample and hold (S/H) operation, gain and offset adjustments, and outputs signals ASH to HSH to an analog-to-digital conversion (ADC) device 3403. In FIG. 24, the analog-to-digital conversion device 3403, comprising an analog-to-digital (A/D) converter 3403a and a signal converter 3403b, converts the signals ASH to HSH to servo signals comprising a digital track error (TE) signal, a digital radio frequency ripple (RFRP) signal, a digital focus error (FE) signal and other digital servo signals (not shown in FIG. 24). A reshaping device 3404 receives the digital TE signal, digital RFRP signal and digital FE signal, generating a new TE signal TE', new RFRP signal RFRP' and new FE signals FE' for the servo control-and-detection device 2406.

The signal processing apparatus 3400 operates in conjunction with the first method shown in FIG. 3A. Thus, the reshaping device 3404 of the signal processing apparatus 3400 receives the digital TE signal, RFRP signal and FE signal, for example, and interpolates new data between every two adjacent digital servo signals (or data) which cross zero. In this embodiment, new data is merely interpolated to the digital TE signal to generate the interpolated TE signal TE', although the disclosure is not limited thereto. Then, the servo control-and-detection device 3406 generates a TEZC signal (not show in FIG. 24) through the interpolated data to perform further servo control and detection.

Figure 25:
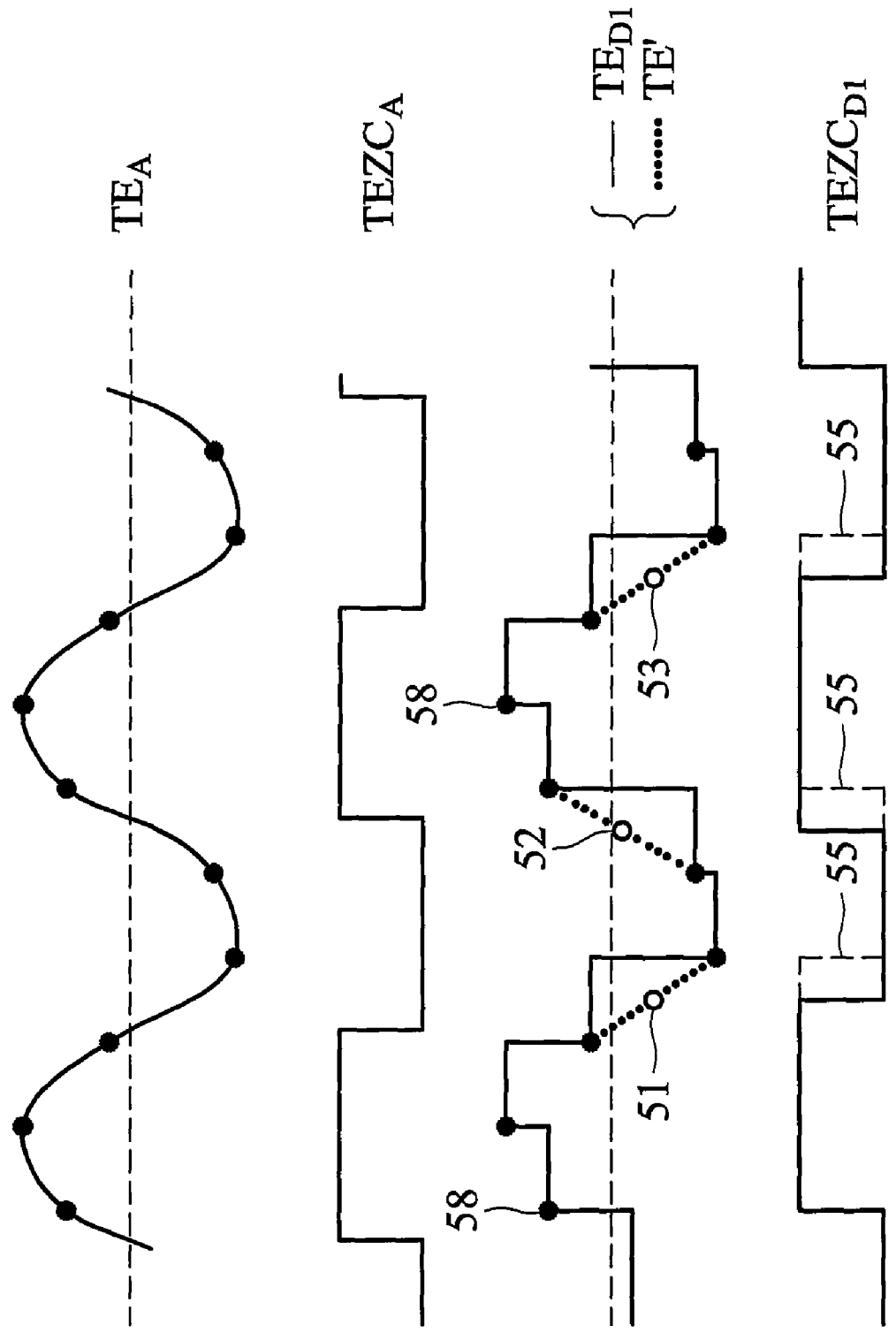
FIG. 25 shows generation of the TEZC signal based on the first method of the exemplary embodiment.

FIG. 25 shows generation of the TEZC signal based on the first method of FIG. 3A. Signals TEA and TEZCA, represent waveforms of an analog TE signal and an ideal TEZC signal sliced from the analog TE signal. TED1 and TEZCD1 represent waveforms of the digital TE signal and the TEZC signal generated through or sliced using the interpolated data. The block circles 58 in the TED1 signal are samples taken by the analog-to-digital conversion device 3403 using a first sampling rate. The sampling rate corresponds to the frequency of a first clock generator 3407. In FIG. 25, the reshaping device 3404 interpolates data 51 to 53 between every two adjacent digital TED1 signal data which cross zero to generate the TE' signal depicted as a dotted line in FIG. 25. Then, the servo control-and-detection device 2406 slices the digital TE' signal through the interpolated data 51 to 53 to generate the TEZCD1 signal. It can be seen from FIG. 25 that the TEZCD1 signal is more accurate than the TEZC signal TEZCD (as a dotted line 55 in FIG. 25). In this embodiment, only one new data is interpolated between two adjacent digital TE signal data which cross zero, but the disclosure is not limited thereto. A plurality of data can be interpolated between two adjacent digital TE signal data which cross zero, and that closest to zero can be selected to slice the interpolated TE signal TE'.

Signal processing apparatus 3400 also can operate in conjunction with the second method shown in FIG. 23B. Accordingly, the reshaping device 3404 of the signal processing apparatus 400 receives the digital TE signal, RFRP signal and FE signal, and upsamples the digital TE, RFRP and FE signal data to generate the upsampled digital TE, RFRP and FE signals (TE', RFRP' and FE'), all with higher resolution than the digital TE, RFRP and FE signals. Then, the servo control-and-detection device 3406 generates at least one zero crossing signal of the TE', RFRP' and FE' signals (all not show in FIG. 24) through the corresponding upsampled signal to perform further servo control and detection. It is noted that the reshaping device 3404 can be a resample circuit, with the signal processing apparatus 3400 further comprising a filter 3405 coupled between the resample circuit 3404 and the servo control-and-detection device 3406. For example, the filter 3405 can be a second order finite impulse response (FIR) filter which may be an interpolation filter with FIR structure of $Y(n)=x(n)/2+x(n-1)/2$, but the disclosure is not limited thereto.

Figure 26:
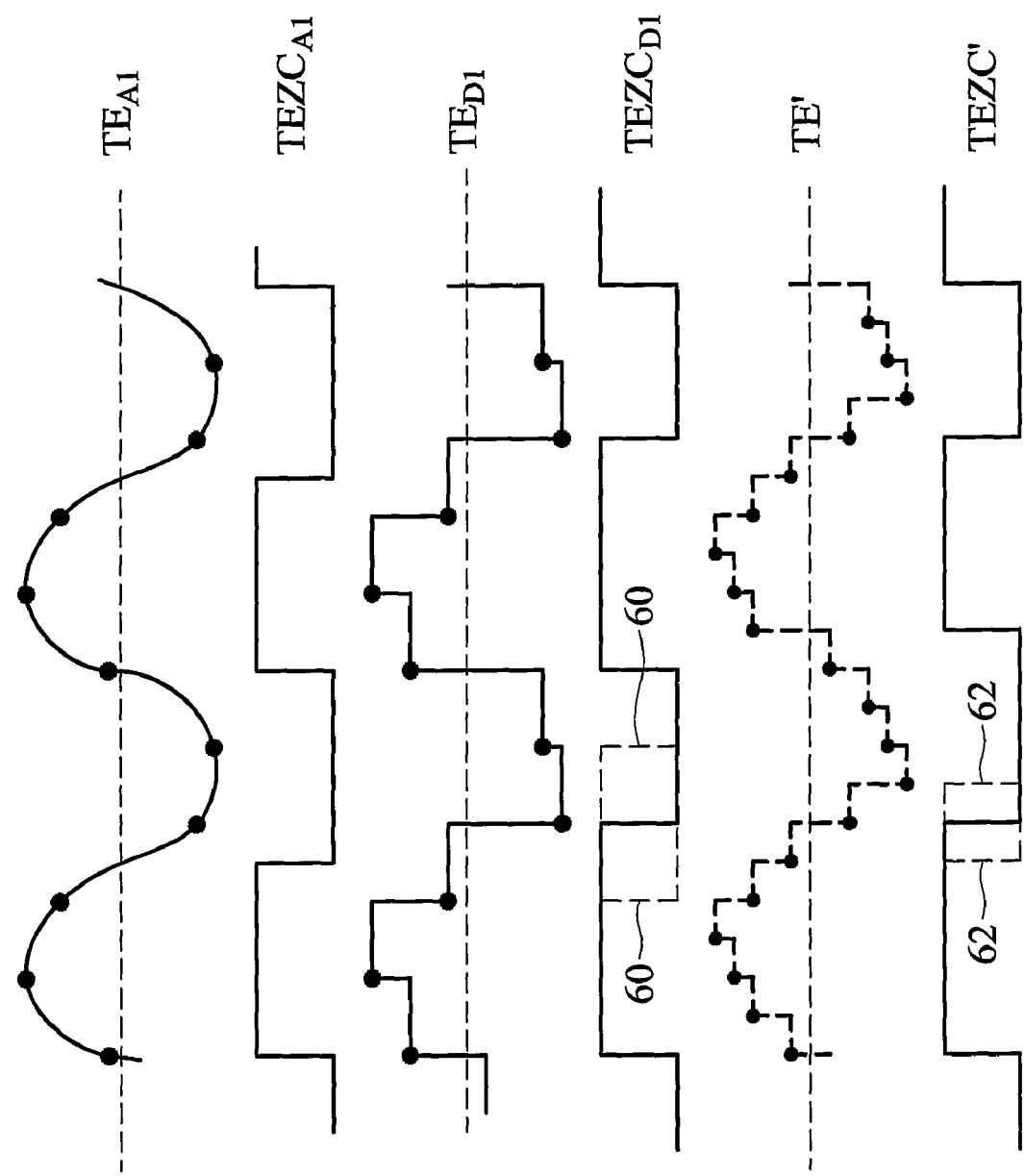
FIG. 26 shows generation of the TEZC signal based on the second method of another exemplary embodiment.

FIG. 26 shows generation of the TEZC signal based on the second method of FIG. 3B. Signals TEA1 and TEZCA1 represent waveforms of an analog TE signal and an ideal TEZC signal sliced from the analog TE signal. Signals TED1 and TE' represent waveforms of the digital TE signal and the reshaped (upsampled or resampled) TE signal. Signal TEZC' is the TEZC signal generated from the TE' signal. If sampling rate of the TED1 signal is 100 KHz, when track speed is about 5 KHz, the ADC device 3403 will sample 5 points for one whole period, as shown in signal TED1. In this embodiment, for example, the reshaping device (or resample circuit) 3404 upsamples the TED1 to 200 KHz and sends the upsampled TED1 signal to the filter 3405, thereby obtaining the reshaped TE signal TE' which is smoother and has 20 data points in one period, as depicted in FIG. 26. The reshaped TE signal TE' has a higher resolution than the digital TE signal TED1. Then, the servo control-and-detection device 3406 slices the reshaped TE signal TE' to generate the TEZC' signal with higher resolution than the TEZCD signal sliced from the digital TE signal TED1. Numerals 60 and 62, depicted by the dashed line in FIG. 26, indicate possible width deviations. It can be seen from FIG. 26 that the possible width deviation of the TEZC' signal is less than that of the TEZCD1 signal. Use of the TEZC' signal for further servo control and detection, such as short seek velocity control, provides better performance.

It is noted that the analog-to-digital conversion (ADC) device 3403, clocked by a first clock generator 3407, couples and processes signals A to H to generate the digital TE signal of a first sampling rate. The reshaping device 3404, filter 3405 and servo control-and-detection device 3406, all clocked by a second clock generator 3408 with higher frequency than the first clock generator 3407, have a higher data processing rate than the first sampling rate of the ADC device.

Figure 27:
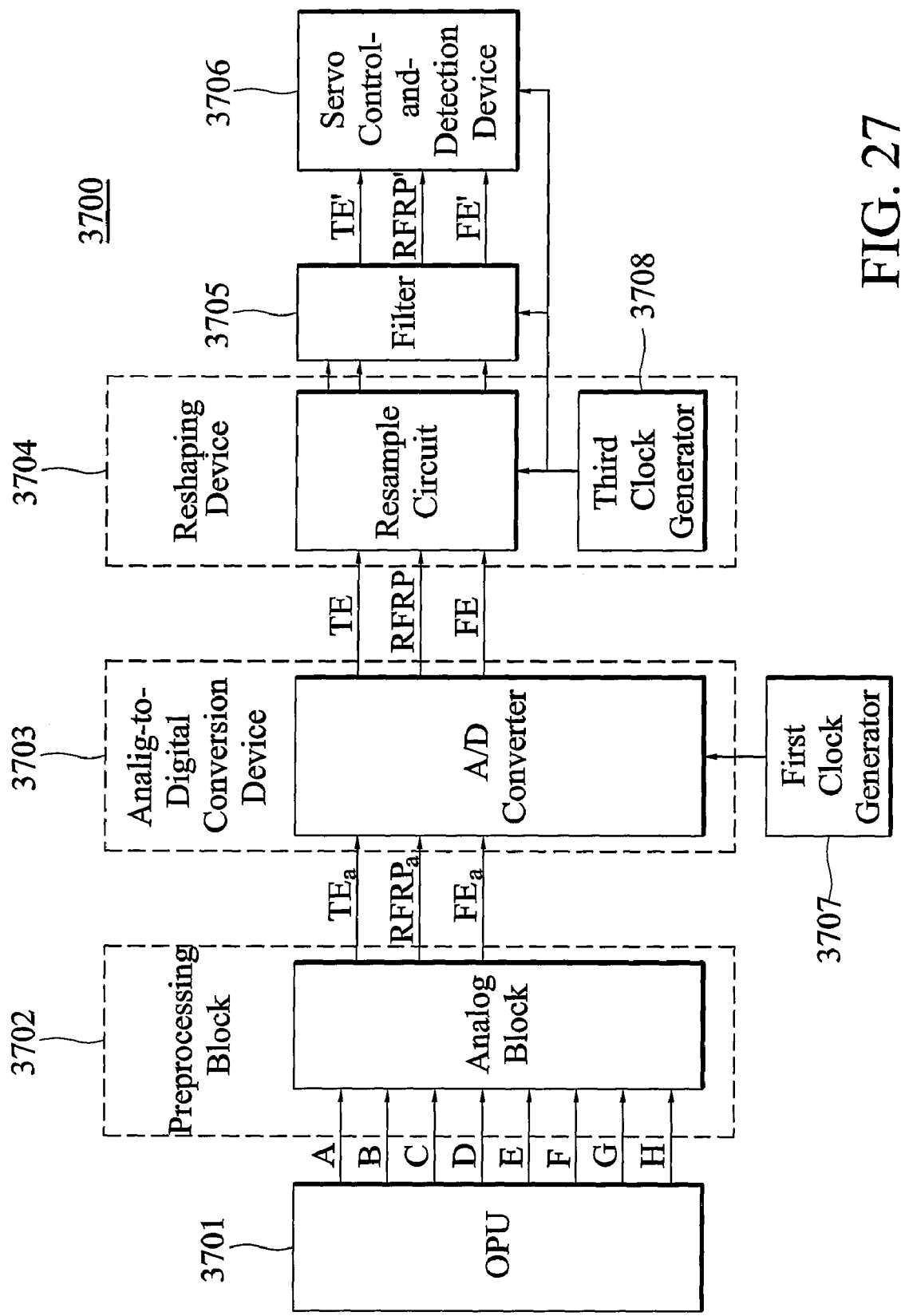
FIG. 27 shows a signal processing apparatus for an optical disc drive according to another exemplary embodiment of the invention.

FIG. 27 shows another signal processing apparatus 3700 for an optical disc drive (not shown in FIG. 27) according to another embodiment of the invention. Optical pickup unit (OPU) 3701 of the optical disc drive receives laser signal from disc and generates signals A to H which are sent to preprocessing block 3702. In FIG. 7, the preprocessing block 402 is an analog block which processes signals A to H and outputs servo signals comprising at least an analog track error (TEa) signal, an analog radio frequency ripple (RFRPa) signal, an analog focus error (FEa) signal and other analog servo signals (not shown in FIG. 27). Servo signals are sent to an analog-to-digital conversion (ADC) device 3703 to generate digital servo signals such as a digital TE signal, a digital RFRP signal, a digital FE signal and other digital servo signals (not shown in FIG. 27). The reshaping device 3704 receives and processes the digital servo signals in conjunction with the first method of FIG. 23A or the second method of FIG. 23B. The reshaping device 3704 in FIG. 27 and the reshaping device 3404 in FIG. 24 have the same functions, corresponding to the same waveforms shown in FIGS. 25 and 26. The reshaping device 3704 can be a resample circuit. A filter 3705 coupled between the reshaping device 3704 and the servo control-and-detection device 3706 can be, for example, a second order finite impulse response (FIR) filter which may be an interpolation filter with FIR structure of Y(n)=x(n)/2+x(n−1)/2, but the disclosure is not limited thereto.

Figure 34:
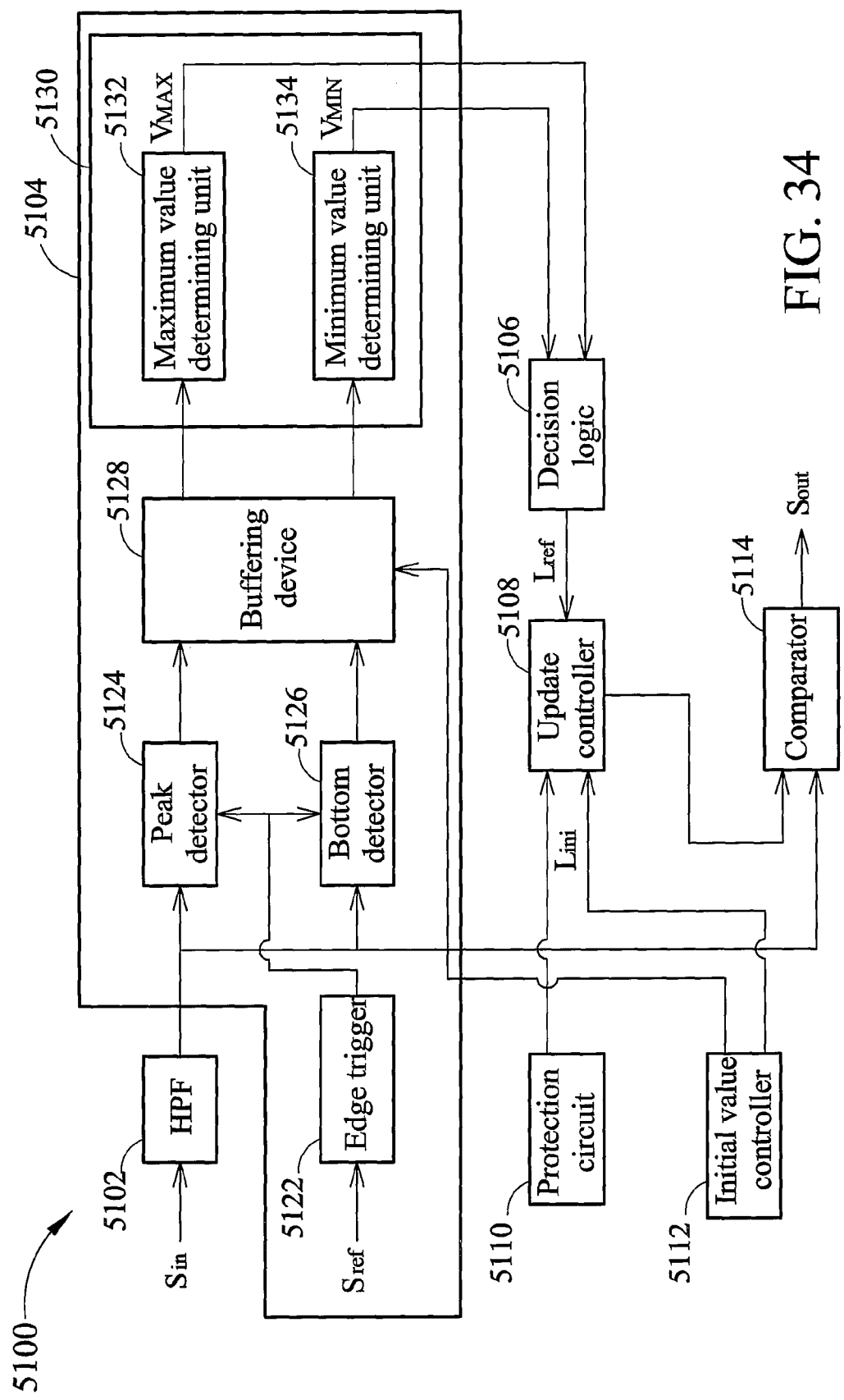
FIG. 34 is a block diagram illustrating an exemplary embodiment of an apparatus capable of determining a reference level according to an input signal and a reference signal and then processing the input signal using the determined reference level.
Figure 37:
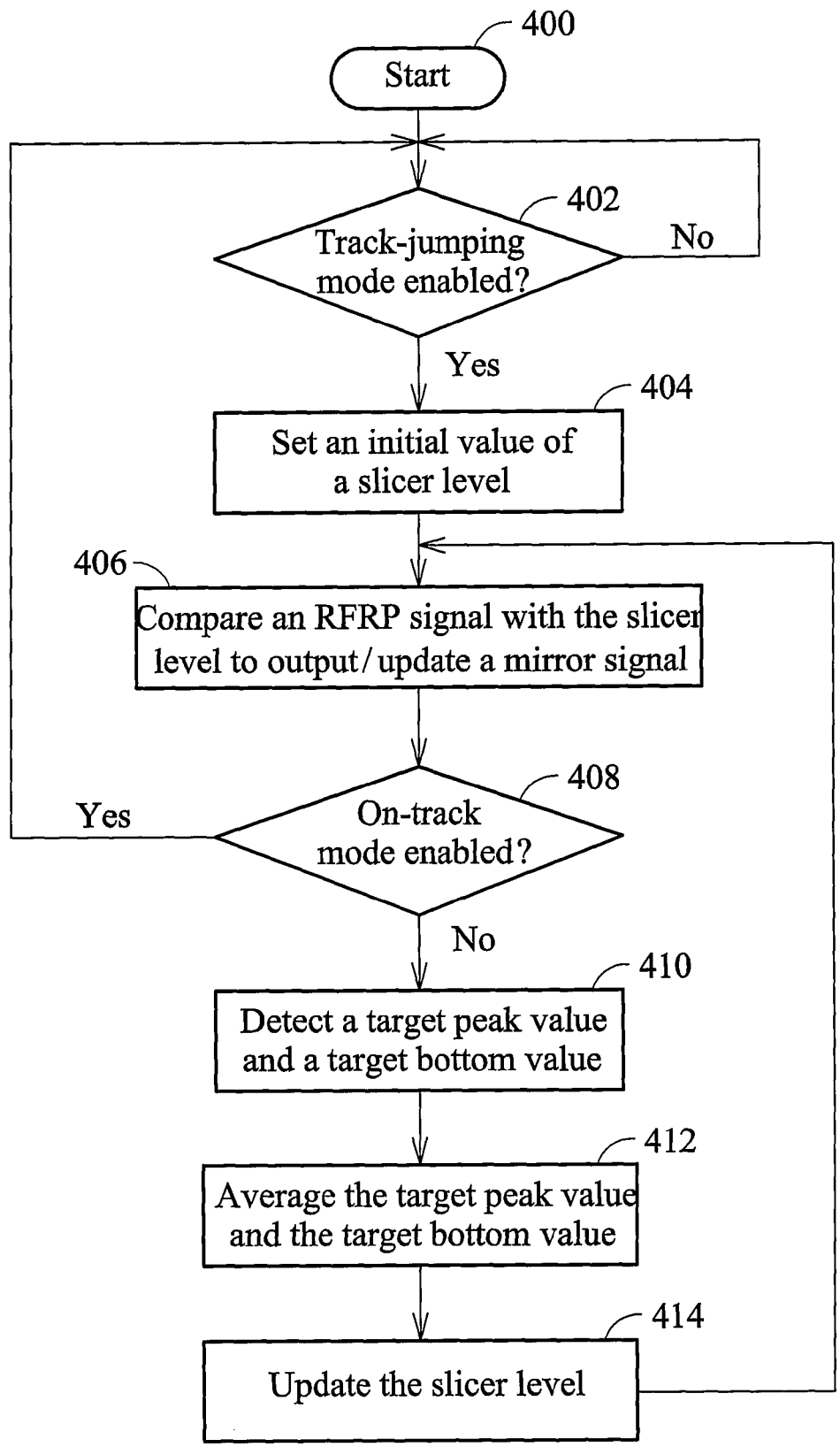
FIG. 37 is a flow chart of processing an RFRP signal to generate a mirror signal according to an embodiment of the present invention.

It is noted that the servo control-and-detection device in FIGS. 34 and 37 can be implemented using a digital signal processing (DSP) device.

Figure 28:
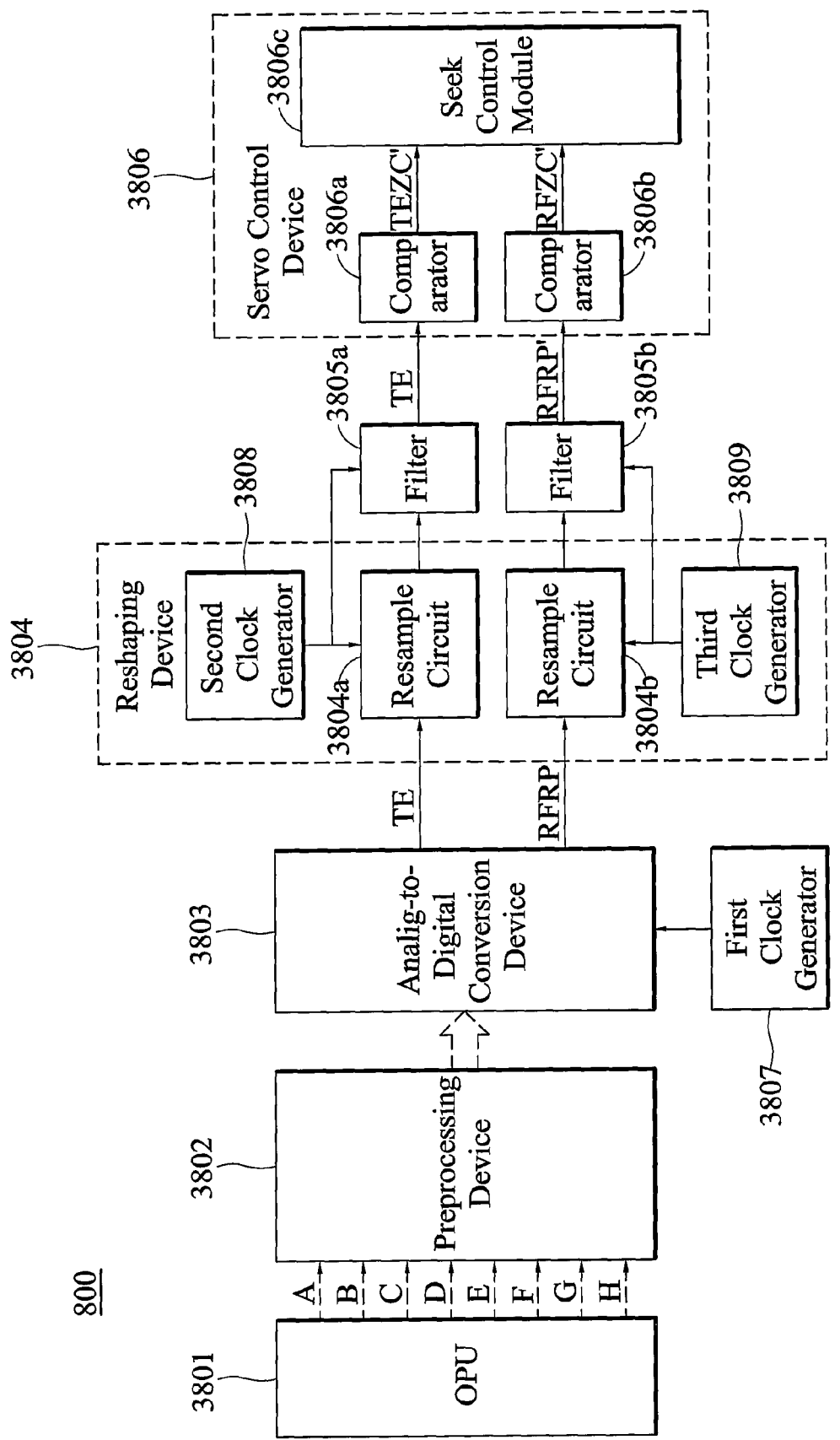
FIG. 28 shows a signal processing apparatus for an optical disc drive according to another exemplary embodiment of the invention.

FIG. 28 shows a servo system for an optical disc drive according to another exemplary embodiment of the invention, wherein detailed block diagrams of a reshaping device and a servo control-and-detection device which may be applied in the above embodiments are shown. In this example, the reshaping device 3804 comprises two resample circuits 3804a and 3804b, respectively receiving a digital TE signal and a digital RFRP signal. The resample circuits 3804a and 3804b operate based on the first method of FIG. 23A or the second method of FIG. 23B, outputting interpolated or upsampled digital TE signal and digital RFRP signal. Filters 3805a and 3805b further smooth the interpolated or upsampled digital TE signal and digital RFRP signal, to output TE' signal and RFRP' signal. A servo control-and-detection device 3806 slices the TE' signal and the RFRP' signal by comparators 3806a and 3806b to generate a TEZC' signal and a RFRP' signal. A seek control module 3806c of the servo control-and-detection device 806 performs seek control for an optical disc drive. In this example in FIG. 28, the ADC device 3803 is clocked by a first clock generator 3807 with a frequency of 100 KHz, the resample circuit 804a and filter 3805a are clocked by a second clock generator 3808 with a frequency of 200 KHz, and the resample circuit 3804b and filter 3805b are clocked by a third clock generator 3809 with a frequency of 200 KHz. Therefore, the data processing rates of the resample circuits 3804a and 3804b, and filters 3805a and 3805b are higher than the sampling rate of the ADC converter.

In view of the above embodiments, the servo zero crossing signal such as TEZC and RFZC signals have reduced width deviations, thereby providing improved waveform accuracy, enabling servo systems to achieve better performance in servo control and detection using the TEZC and RFZC signals or others obtained according to embodiments of the invention.

Figure 29:
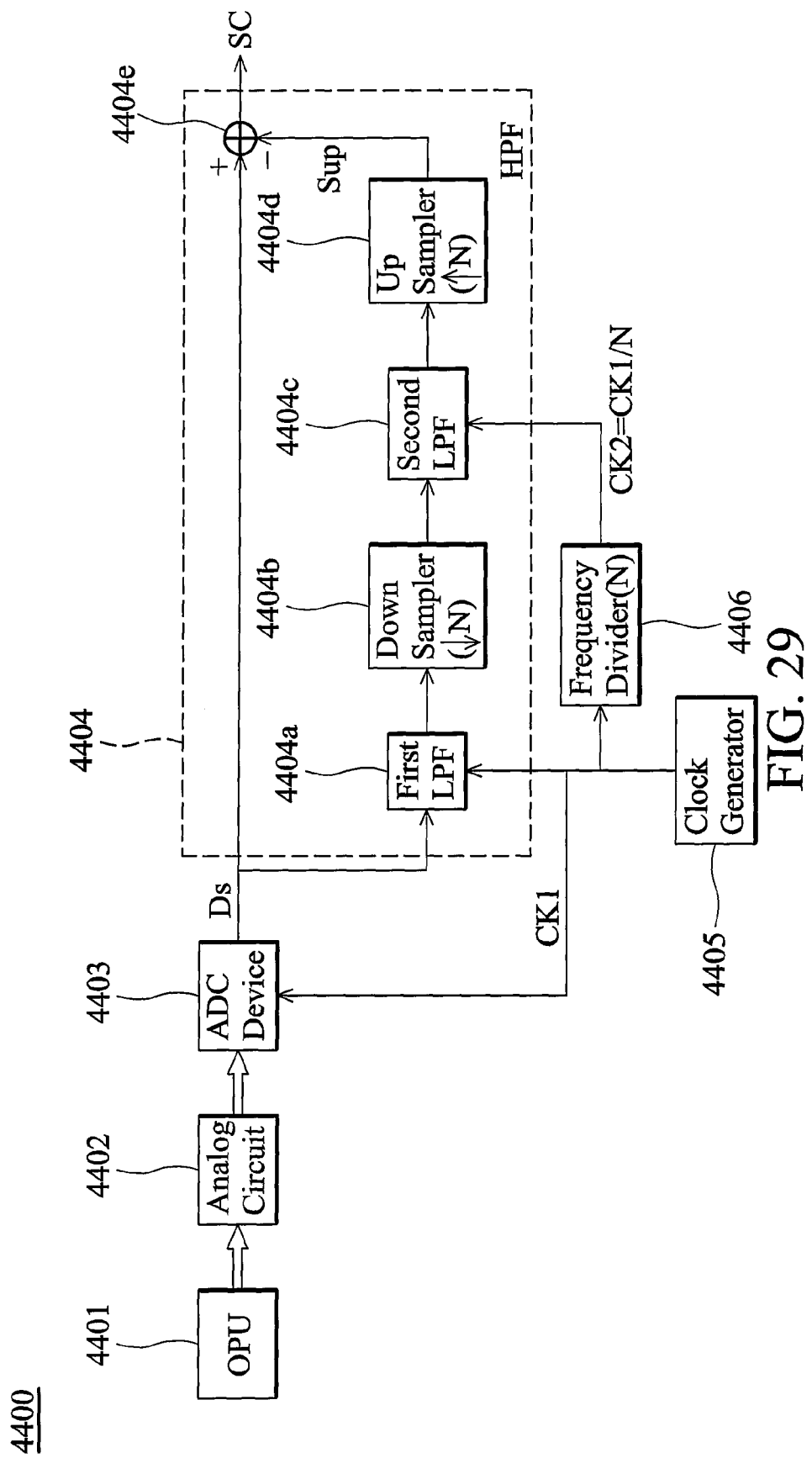
FIG. 29 shows a signal processing apparatus of an optical disc drive according to an exemplary embodiment of the invention.

FIG. 29 shows a signal processing apparatus 4400 of an optical disc drive according to an embodiment of the invention. The signal processing apparatus 4400 comprises an analog circuit 4402, an analog-to-digital conversion (ADC) device 4403 and a high pass filter (HPF) 4404. The analog circuit 4402 receives a laser signal from a disc in the optical disc drive (not shown in FIG. 29) to generate servo signals. The ADC device 4403, for example an analog-to-digital (A/D) converter, receives the servo signals and generates digital servo signals such as digital tracking error (TE) signal, digital radio frequency ripple (RFRP) signal, digital focus error (FE) signal and others. The HPF 4404 may receive at least one of the servo signal Ds, such as the TE signal, to output a high pass filtered signal SC for subsequent generation of a servo control signal.

The HPF 4404 comprises a first low pass filter (LPF) 4404a of a first sampling rate, receiving and filtering the digital servo signal Ds, a down-sampler 4404b receiving a first filtered signal output by the first LPF 4404a to down-sample the first filtered signal by a factor N of integer; a second LPF 4404c of a second sampling rate, receiving and filtering a first down-sampled signal output by the down-sampler 4404b, wherein the second sampling rate is equal to 1/N times the first sampling rate; an up-sampler 4404d receiving a second filtered signal output by the second LPF 4404c to up-sample the second filtered signal by the factor N; and a subtractor (or an adder) 4404e subtracting an up-sampled signal Sup output by the up-sampler 4404d from the digital servo signal Ds.

In this embodiment, the ADC device 4403 and the first LPF 4404a are clocked or synchronized by a clock generator 4405 of clock rate (or frequency) CK1. Therefore, the first sampling rate of the first LPF 4404a is CK1, and the ADC device 4403 samples the servo signals by the first sampling rate CK1. A frequency divider 4406 divides clock signal of the clock generator 4405 by the factor N, and outputs a divided clock signal of clock rate CK2 (equal to $$\frac{CK1}{N}$$

) to the second LPF 4404c. Therefore, the second sampling rate of the second LPF 4404c is CK2. It is noted that the first LPF 4404a can be an anti-alias filter for the second LPF, and the second LPF 4404c is designed to have a low corner frequency corresponding to the desired frequency (or bandwidth) of the HPF 4404. In addition, both the first and second LPFs 4404a and 4404c can have unit DC gain. In order to not lose bit information, two cascade-coupled LPFs implement the HPF, according to this embodiment. Therefore, a high pass filter with a lower frequency (or bandwidth) is obtained without losing too much bit information.

Figure 30:
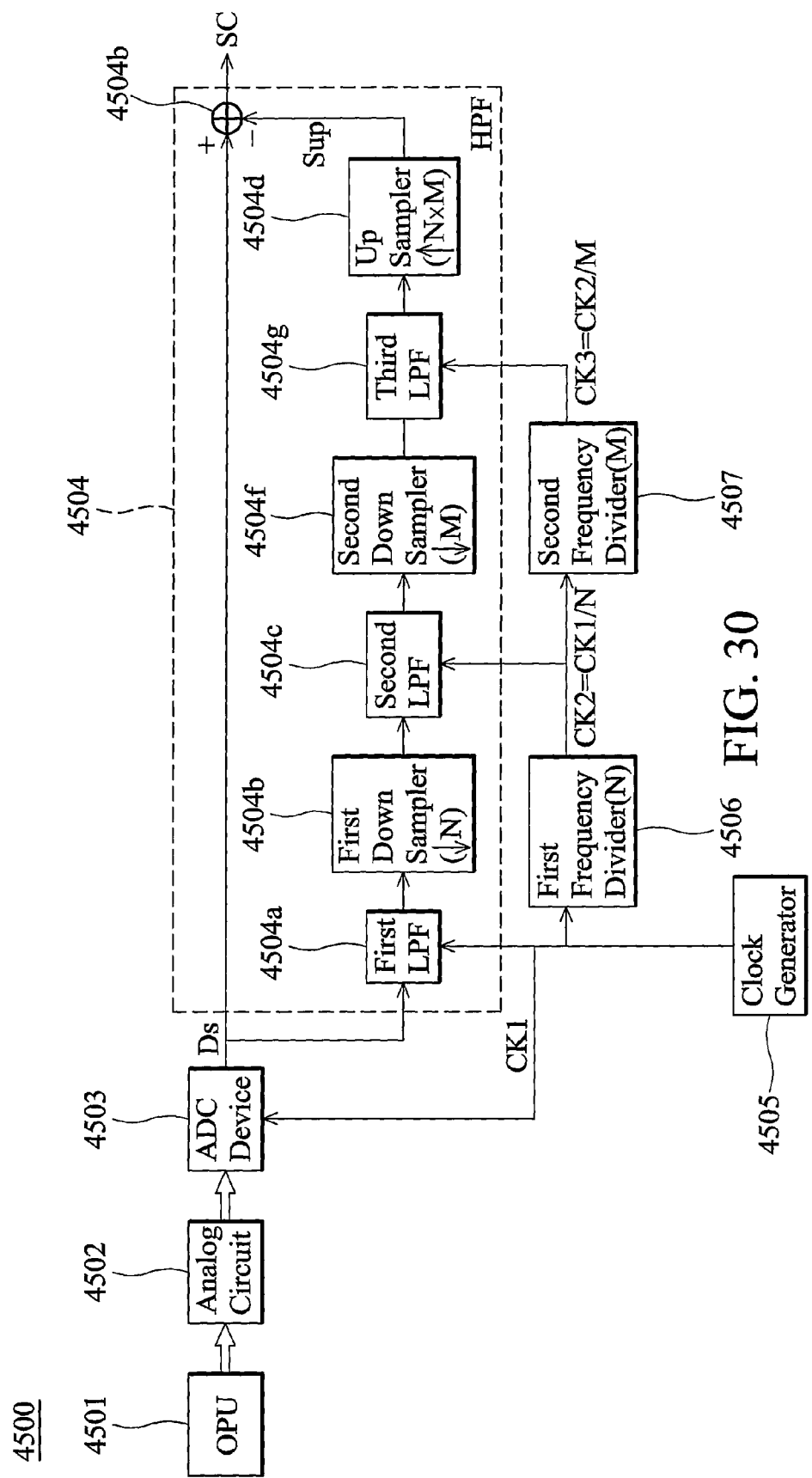
FIG. 30 shows a signal processing apparatus of an optical storage device according to another exemplary embodiment of the invention.

FIG. 30 shows a signal processing apparatus 4500 of an optical disc drive according to another embodiment of the invention. The signal processing apparatus 4500 comprises an analog circuit 4502, an analog-to-digital conversion (ADC) device 4503 and a high pass filter (HPF) 4504. The analog circuit 4502 receives a laser signal from a disk in the optical disc drive (not shown in FIG. 30) to generate servo signals. The ADC device 4503, for example an analog-to-digital (A/D) converter, receives the servo signals and generates digital servo signals such as tracking error (TE) signal, radio frequency ripple (RFRP) signal, focus error (FE) signal and others. The HPF 4504 may receive at least one of the servo signals Ds, such as the TE signal, to output a high pass filtered signal SC for subsequent generation of a servo control signal.

The HPF 4504 comprises a first low pass filter (LPF) 4504a of a first sampling rate, receiving and filtering the digital servo signal; a first down-sampler 4504b receiving a first filtered signal output by the first LPF 4504a to down-sample the first filtered signal by a factor N of integer; a second LPF 4504c of a second sampling rate, receiving and filtering a first down-sampled signal output by the first down-sampler 4504b, wherein the second sampling rate is equal to 1/N times the first sampling rate; a second down-sampler 4504f receives a second filtered signal output by the second LPF 4504c to down-sample the second filtered signal by a factor M of integer; a third LPF 4504g of a third sampling rate, receiving and filtering a second down-sampled signal output by the second down-sampler 4504f, wherein the third sampling rate is equal to 1/M times the second sampling rate; an up-sampler 4504d receiving a third filtered signal output by the third LPF 4504g to up-sample the third filtered signal by a factor N×M; and a subtractor (or adder) 4504e subtracting an up-sampled signal Sup output by the up-sampler 4504d from the digital servo signal Ds.

In this embodiment, the ADC device 4503 and the first LPF 4504a are clocked or synchronized by a clock generator 4505 of clock rate CK1. Thus, the first sampling rate of the first LPF 4504a is CK1, and the ADC device 4503 samples the servo signals using the first sampling rate CK1. A first frequency divider 4506 divides clock signal of the clock generator 4505 by the factor N, and outputs a divided clock signal of clock rate CK2 (equal to $$\frac{CK1}{N}$$

) to the second LPF 4504c. A second frequency divider 4507 divides clock signal output from the first frequency divider 4506 by the factor M, and output a divided clock signal of clock rate CK3 (equal to $$\frac{CK2}{M}$$

) to the third LPF 4504g. Therefore, the second and third sampling rate of the second and third LPFs 4504c and 4504g are CK2 and CK3 respectively. It is noted that the first and second LPF 4504a and 4504c can be anti-alias filters, and the third LPF 4504g is designed to have a low corner frequency corresponding to the desired frequency (or bandwidth) of the HPF 4504. In addition, the first to third LPFs 4504a, 4504c and 4504g can have unit DC gains. A low corner frequency needs a small coefficient for a LPF. In order to not lose bit information, three cascade-coupled LPFs are used to implement the HPF, according to this embodiment. Thus, a high pass filter with a lower frequency (or bandwidth) is obtained, without losing too much bit information.

Figure 31:
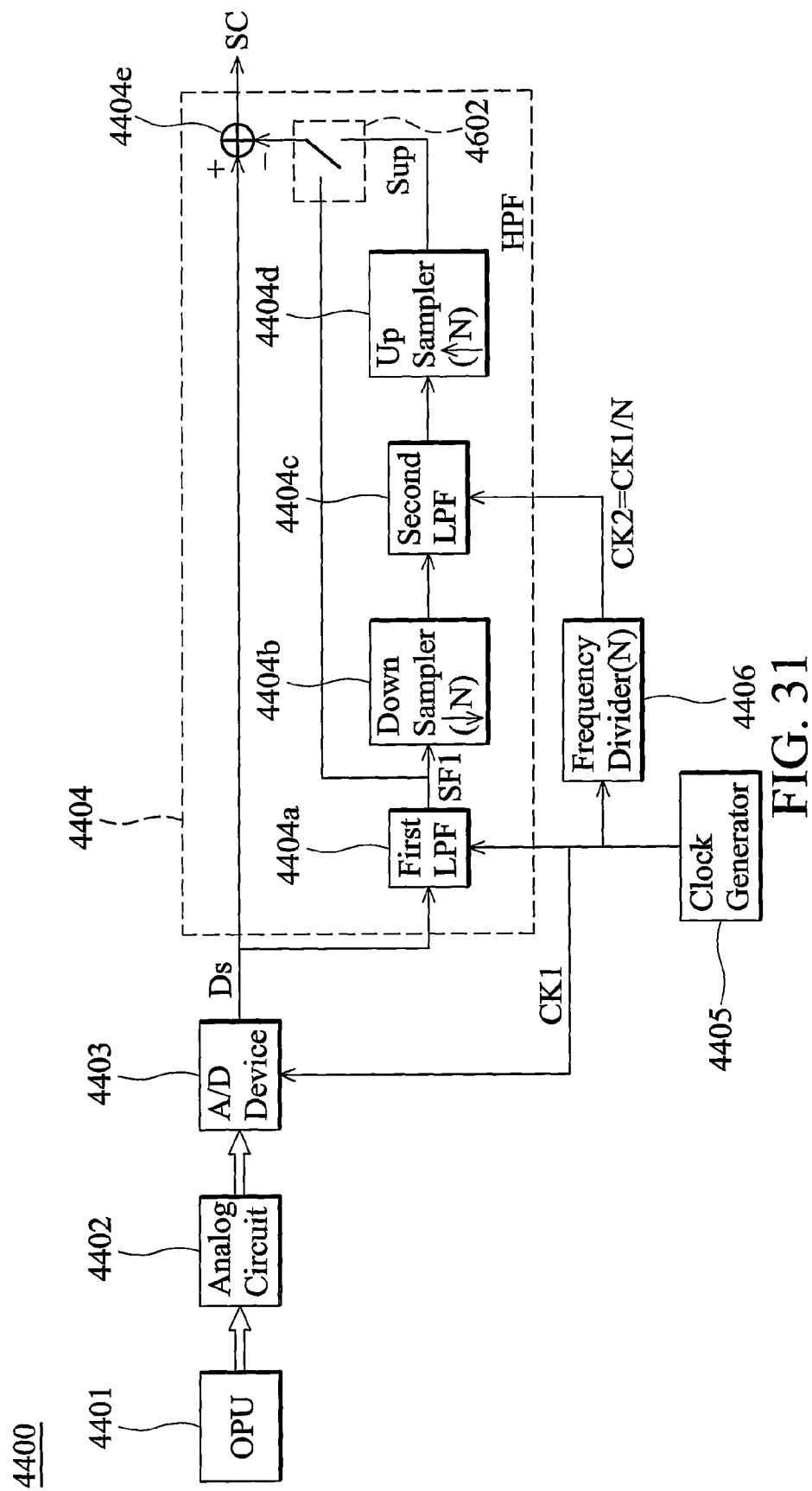
FIG. 31 shows a signal processing apparatus of an optical storage device according to further another exemplary embodiment of the invention.
Figure 32:
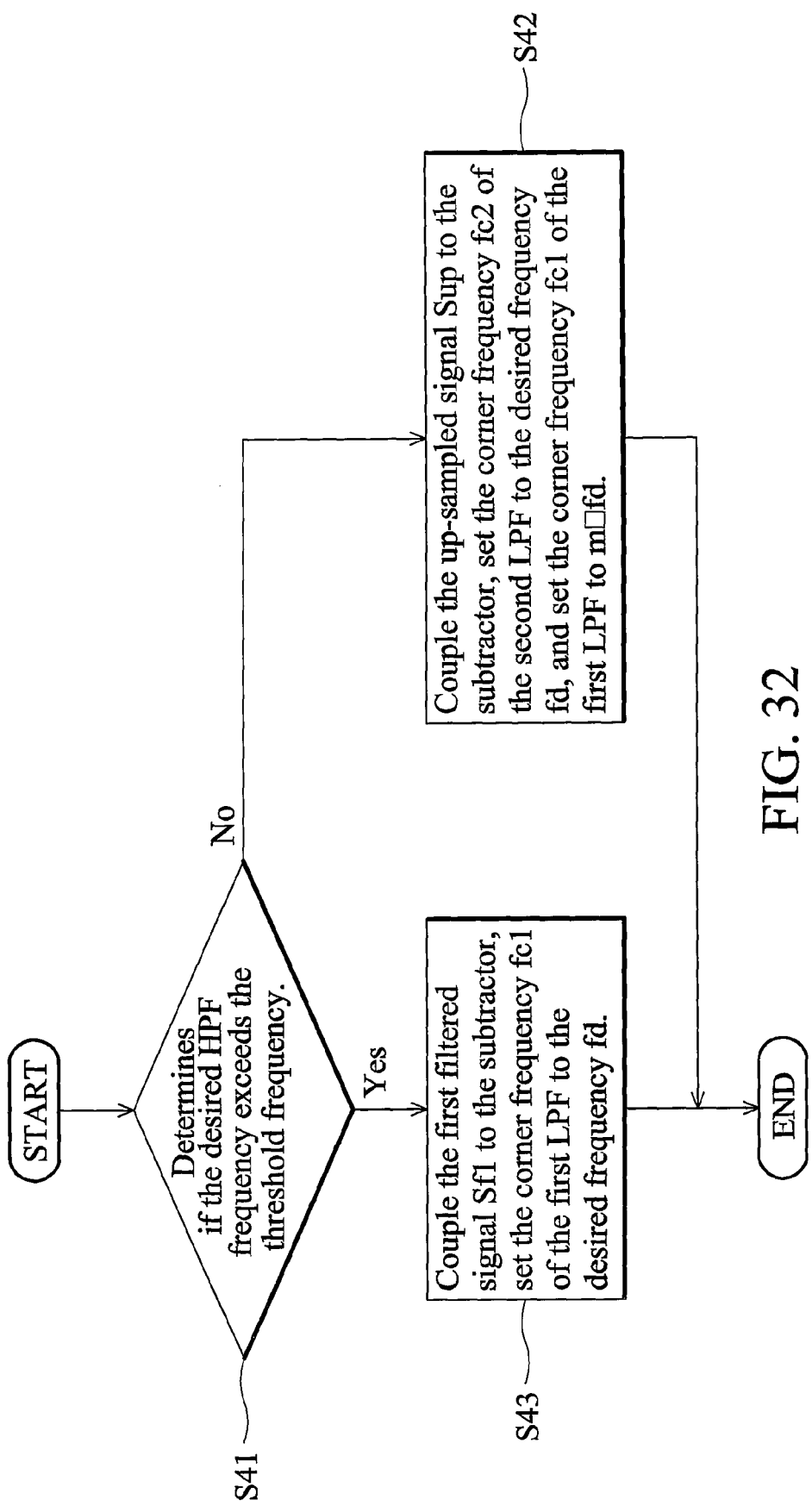
FIG. 32 is a flowchart showing operation of the control module in conjunction with the selector in FIG. 31.

To be compatible with a general HPF structure, the HPF 4404 of the signal processing apparatus 4400 can be modified to further comprise a selector, as shown in FIG. 31. The selector 4602 selectively couples the up-sampled signal Sup or the first filtered signal Sf1 to the subtractor 4404e according to the desired frequency (or bandwidth) of the HPF 4404. If the desired frequency of the HPF 4404 exceeds a threshold frequency, the selector 4602 bypasses the down-sampler 4404b, the second LPF 4404c and the up-sampler 4404d to couple the first filtered signal Sf1 to the subtractor 4404e. Therefore, the HPF 4404 outputs the filtered signal SC=Ds−Sf1. Otherwise, the selector 4602 couples the up-sampled signal Sup to the subtractor 4404e. Therefore, the HPF 4404 outputs the filtered signal SC=Ds−Sup. In this embodiment, the digital servo apparatus may comprise a control module (not shown in FIG. 31). In the flowchart of FIG. 32, the control module determines if the desired HPF frequency exceeds the threshold frequency (Step S41). The control module controls the selector 4602 to output the up-sampled signal Sup to the subtractor 4404e, and sets the corner frequency fc2 of the second LPF to the desired frequency fd of the HPF 4404 and sets the corner frequency fc1 of the first LPF to a multiple of desired frequency fd, mxfd, when the desired frequency of the HPF 4404 does not exceed the threshold (Step S42). The control module controls the selector 4602 to output the first filtered signal Sf1 to the subtractor 4404e and set the corner frequency fc1 of the first LPF to the desired frequency fd of the HPF 4404 when the desired frequency of the HPF 4404 exceeds the threshold (Step 43).

It is noted that the selector can also be applied to the HPF disclosed in FIG. 30 in conjunction with the control module, according to flowchart of FIG. 32.

Figure 33:
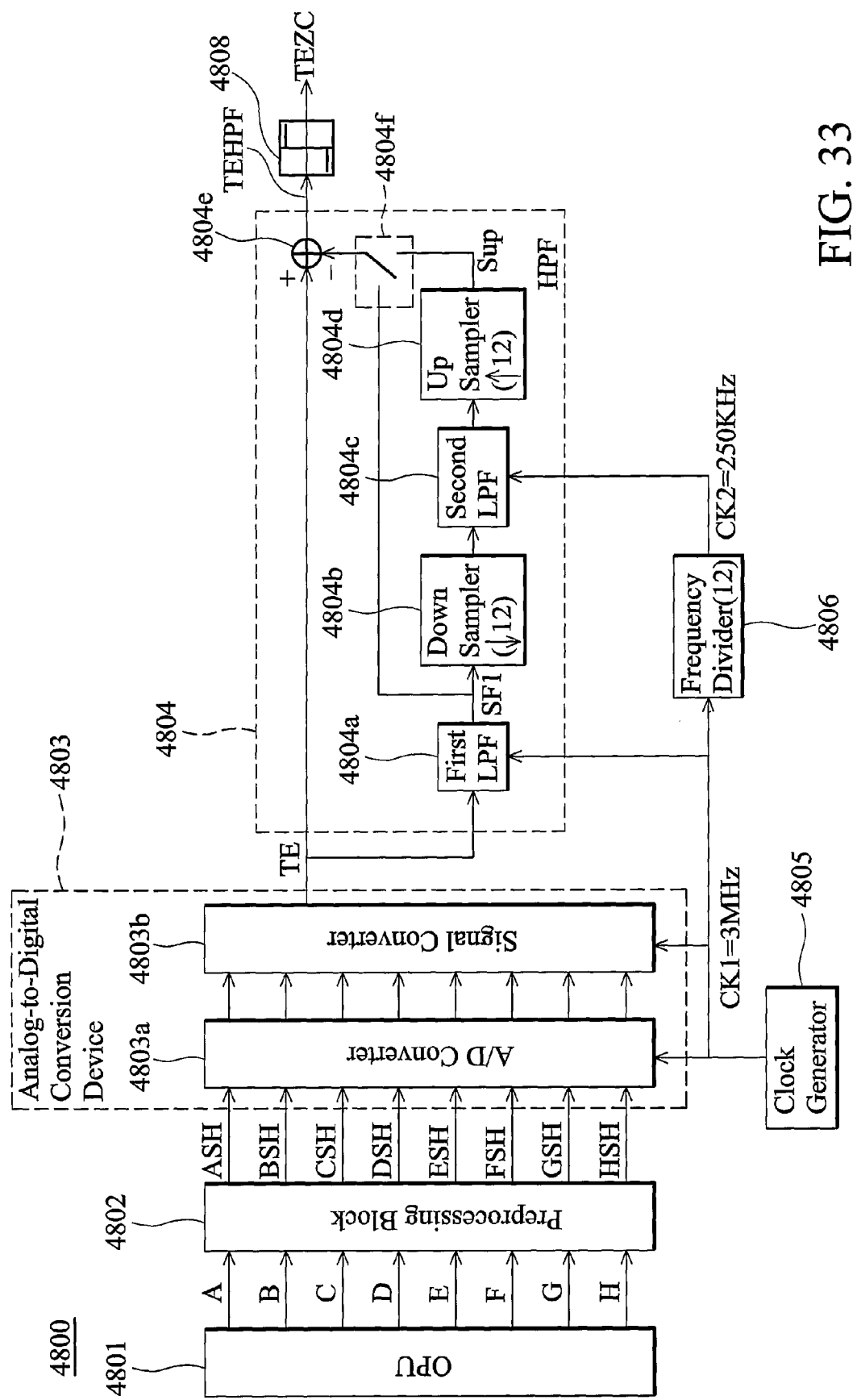
FIG. 33 shows a signal processing apparatus of an optical storage system according to yet another embodiment of the invention.

FIG. 33 shows a signal processing apparatus of an optical disc drive according to another embodiment of the invention, wherein a high pass filter of the signal processing apparatus is implemented using two cascade-coupled low pass filters. In the signal processing apparatus of FIG. 33, a digital TE signal is first filtered by a high pass filter to remove DC component thereof, and then the filtered TE signal is sliced by a comparator to generate a tracking error zero crossing (TEZC) signal for subsequent servo control of the optical storage system. Optical pickup head (PUH) 801 of the optical storage system (not shown in FIG. 33) receives a laser signal from a disc and generates signals A to H which are sent to a preprocessing block 4802. Here, the preprocessing block 4802 is a circuit block which performs sample and hold (S/H) operation, gain and offset adjustments, and outputs signals ASH to HSH to an analog-to-digital conversion (ADC) device 4803. In FIG. 33, the analog-to-digital conversion device 4803, comprising an analog-to-digital (A/D) converter 4803a and a signal converter 4803b, converts the signals ASH to HSH to servo signals comprising a digital track error (TE) signal, a digital radio frequency ripple (RFRP) signal, a digital focus error (FE) signal and other digital servo signals. Here, only the digital TE signal is shown in FIG. 33. The digital TE signal is sent to a high pass filter (HPF) 4804 to remove DC component thereof. Then, the filtered TE signal TEHPF is sliced by a comparator 808 to generate a tracking error zero crossing (TEZC) signal.

In this embodiment, the HPF 4804 comprises a first low pass filter (LPF) 4804a, a down-sampler 4804b, a second LPF 4804c, an up-sampler 4804d, a selector 4804f and a subtractor (or adder) 4804e. The first LPF 804a, with a first sampling rate CK1, receives and filters the digital TE signal. A clock generator 4805 provides clock signal CK1 with frequency 3 MHz to the ADC device 4803, the first LPF 4804a and a frequency divider 4806. Thus, the first sampling rate of the LPF 4804a is 3 MHz.

The down-sampler 4804b receives a first filtered TE signal to down-sample the first filtered signal by a factor N of integer. For example, N is equal to 12. The second LPF 4804c of a second sampling rate, receives and filters a down-sampled signal output by the down-sampler 4804b. The frequency divider 4806 divides the clock signal CK1 by the factor 12 and generates a divided clock signal CK2 of 250 KHz to the second LPF 4804c. Thus, the second sampling rate is equal to $\frac{1}{12}$ times the first sampling rate, i.e. 250 KHz. The up-sampler 4804d receives a second filtered signal output by the second LPF 4804c to up-sample the second filtered signal by the factor 12.

The selector 4804f selectively couples the up-sampled signal Sup or the first filtered signal Sf1 to the subtractor 4404e according to the desired frequency (or bandwidth) of the HPF 4804. If the desired frequency of the HPF 804 exceeds a threshold frequency, the selector 4602 bypasses the down-sampler 4804b, the second LPF 4804c and the up-sampler 4804d to couple the first filtered signal Sf1 to the subtractor 4404e. Otherwise, the selector 804f couples the up-sampled signal Sup to the subtractor 4404e. In this embodiment, the signal processing apparatus 4800 may comprise a control module (not shown in FIG. 33). The operations of the control module in conjunction with the selector 4804f are similar to those described in FIG. 32. First, the control module determines if the desired HPF frequency exceeds the threshold frequency (Step S41). The control module controls the selector 4804f to output the up-sampled signal Sup to the subtractor 4804e, and sets the corner frequency fc2 of the second LPF to the desired frequency fd of the HPF 4804 and the corner frequency fc1 of the first LPF to N×fd when the desired frequency of the HPF 4804 does not exceed the threshold (Step S42). On the contrary, the control module controls the selector 4804f to output the first filtered signal Sf1 to the subtractor 4804e and sets the corner frequency fc1 of the first LPF to the desired frequency fd of the HPF 4804 when the desired frequency of the HPF 4404 exceeds the threshold (Step 43).

Table B shows examples of different bandwidths, coefficients, and lost bits when implementing a HPF using only one LPF. Coefficients of the low pass filters in table B are shown in decimal and hexadecimal fixed point Q15 formats. It is clear that the smaller the coefficient (the LPF frequency), the more bits are lost. The HPF implemented by only the LPF suffers serious limitation of precision when requiring lower HPF frequency (i.e., lower LPF corner frequency).

TABLE B

| LPF Frequency | Coefficient (Dec.) | Coefficient (Hex) | Lost Bits |
| --- | --- | --- | --- |
| 18 KHz | 0.03699 | 4BC | 4 |
| 14 KHz | 0.02970 | 3CE | 5 |
| 8 KHz | 0.01496 | 1EA | 6 |
| 4 KHz | 0.00751 | F6 | 7 |
| 2 KHz | 0.00401 | 84 | 8 |
| 1 KHz | 0.00200 | 42 | 9 |
| 500 Hz | 0.00100 | 21 | 10 |

Assume the first and second LPFs 4804a and 4804c are IIR LPFs, the sampling rates of the first and second LPFs are 3 MHz and 250 KHz, and the first LPF is an anti-alias filter, Table C shows lost bit numbers of HPFs (4804) with different desired bandwidths (BW) implemented according to disclosure of FIG. 33. Here, the threshold frequency is 2 KHz. As described in FIG. 33, when the desired HPF frequency exceeds 2 KHz, the selector 4804e bypasses the second LPF 4804c and the up-sampler 4804d, and the corner frequency of the first LPF is set to the desired HPF frequency. In addition, when the desired HPF frequency fd does not exceed 2 KHz, the HPF 4804 is implemented by the two cascade-coupled LPFs 4804a and 4804c, and the corner frequency of the second LPF is set to the desired HPF frequency fd.

TABLE C

| Desired HPF BW | 1st LPF (804a) | 2nd LPF (804c) | Total Lost Bits |
| --- | --- | --- | --- |
| 250 Hz | 8K | 250 Hz | 6 |
| 500 Hz | 8K | 500 Hz | 5 |
| 1 KHz | 14K | 1 KHz | 4 |
| 2 KHz | 18K | 2 KHz | 3 |
| 4 KHz | 4K | Bypass | 7 |
| 8 KHz | 8K | Bypass | 6 |
| 16 KHz | 16K | Bypass | 5 |
| 18 KHz | 18K | Bypass | 4 |

Comparing the lost bit numbers in table B and table C, when the desired HPF frequency is within 250 Hz to 2 KHz, it is clear that the lost bit numbers are reduced using the HPF based on FIG. 33.

Please refer to FIG. 34. FIG. 34 is a block diagram illustrating an exemplary embodiment of an apparatus 5100 capable of determining a reference level according to an input signal and a reference signal and then processing the input signal using the determined reference level. In this embodiment, the apparatus 5100 is designed to operate in a digital domain. That is, the apparatus 5100 is a digital circuit. However, this is not meant to be a limitation of the present invention. After reading following descriptions, a person skilled in this art would understand that other implementations obeying the spirit of the present invention are possible. Additionally, in the following embodiments the input signal is the aforementioned RFRP signal, the reference signal is the aforementioned TEZC signal, and the reference level is a slicer level used for slicing the RFRP signal to generate a sliced signal, i.e., the aforementioned mirror signal. Similarly, this is not meant to be a limitation of the present invention.

As shown in FIG. 34, the apparatus 5100 comprises a high-pass filter (HPF) 5102, a detecting circuit 5104, a decision 5106, an update controller 5108, a protection circuit 5110, an initial value controller 5112, and a comparator 5114. The HPF 5102 is used for filtering out DC components of the incoming input signal (e.g., an RFRP signal) Sin to remove the DC offset; however, it is an optional circuit component depending upon design requirements. The detecting circuit 5104 is configured to detect a target peak value and a target bottom value of the RFRP signal Sin within at least one period of a reference signal (e.g., a TEZC signal) Sref. For example, in this embodiment, the detecting circuit 5104 detects the peak value and the bottom value per period of the TEZC signal Sref.

As shown in FIG. 34, the detecting circuit 104 includes an edge trigger 5122, a peak detector 5124, a bottom detector 5126, a buffering device 5128, and a processing circuit 5130. The edge trigger 5122 receives the TEZC signal Sref, and then triggers the peak detector 5124 and the bottom detector 5126 to determine one peak value and one peak value at each edge of the TEZC signal Sref. Taking the peak detector 5124 for example, it is triggered at a first edge of the TEZC signal Sref, and then searches for a peak value until a second edge following the first edge occurs. Therefore, when the peak detector 5124 is triggered due to the second edge of the TEZC signal Sref, it will output a peak value found during a time interval between the first edge and the second edge. The bottom detector 5126 is defined to have similar operations to output a bottom value found during a time interval between every two adjacent edges of the TEZC signal Sref. As known to those skilled in this art, each period of the TEZC signal Sref is representative of one track pitch in a radial direction of an optical disc. Therefore, during the track jumping operation, the occurrence of each edge of the TEZC signal Sref indicates that the optical pick-up unit has passed a half track pitch. That is, the peak detector 5124 and the bottom detector 5126 are triggered to output a peak value and a bottom value for every half track pitch due to rising and falling edges of the TEZC signal Sref. The buffering device 5128 can be implemented using any volatile or non-volatile storage components.

In a case where the detecting circuit 5104 is configured to detect a target peak value and a target bottom value of the RFRP signal Sin within one period of the TEZC signal Sref (i.e., the moving window for monitoring the magnitude of the RFRP signal Sin is defined to be one period of the TEZC signal Sref), two buffers are implemented in the buffering device 5128 for storing a previous peak value PRE_MAX and a previous bottom value PRE_MIN obtained according to a previous edge of the TEZC signal Sref, and two buffers are implemented in the buffering device 5128 for storing a current peak value CUR_MAX and a current bottom value CUR_MIN obtained according to a current edge following the previous edge. The processing circuit 5130 is coupled to the buffering device 5128 for determining the target peak value VMAX according to the current peak value CUR_MAX and the previous peak value PRE_MAX and for determining the target bottom value VMIN according to the current bottom value CUR_MIN and the previous bottom value PRE_MIN. As shown in FIG. 34, the processing circuit 5130 comprises a maximum value determining unit 5132 and a minimum value determining unit 5134, where the maximum value determining unit 5132 is configured to select a maximum value out of the current peak value CUR_MAX and the previous peak value PRE_MAX to serve as the target peak value VMAX, and the minimum value determining unit 5134 is configured to select a minimum value out of the current bottom value CUR_MIN and the previous bottom value PRE_MIN to serve as the target peak value VMIN. The computations are illustrated using following equations.

$$VMAX = \max(CUR\_MAX, PRE\_MAX) \quad (1)$$

$$VMIN = \min(CUR\_MIN, PRE\_MIN) \quad (2)$$

However, in another case where the detecting circuit 5104 is configured to detect a target peak value and a target bottom value of the RFRP signal Sin within N (N is greater that 1, for example, an integer greater than 1) periods of the TEZC signal Sref (i.e., the moving window for monitoring the magnitude of the RFRP signal Sin is defined to be N periods of the TEZC signal Sref), (2N−2) buffers are implemented in the buffering device 5128 for storing (N−1) previous peak values PRE_MAX1-PRE_MAXn−1 and (N−1) previous bottom values PRE_MIN1-PRE_MINn−1 obtained according to (N−1) previous successive edges of the TEZC signal Sref, and two buffers are implemented in the buffering device 5128 for storing a current peak value CUR_MAX and a current bottom value CUR_MIN obtained according to a current edge immediately following the previous successive edges. The maximum value determining unit 5132 is configured to select a maximum value out of the current peak value CUR_MAX and the (N−1) previous peak values PRE_MAX1-PRE_MAXn−1 to serve as the target peak value VMAX, and the minimum value determining unit 5134 is configured to select a minimum value out of the current bottom value CUR_MIN and the (N−1) previous bottom values PRE_MIN1-PRE_MINn−1 to serve as the target peak value VMIN. The computations are illustrated using following equations.

$$VMAX = \max(PRE\_MAX1, PRE\_MAX2, \ldots, PRE\_MAXn-1, CUR\_MAX) \quad (3)$$

$$VMIN = \max(PRE\_MIN1, PRE\_MIN2, \ldots, PRE\_MINn-1, CUR\_MIN) \quad (4)$$

It should be noted that above cases are for illustrative purposes only, and are not meant to be limitations of the present invention.

Next, the decision logic 5106 is operative to determine a reference level (e.g., a slicer level of the RFRP signal) Lref according to the received target peak value VMAX and the target bottom value VMIN. In this embodiment, the decision logic 5106 determines the slicer level Lref by averaging the target peak value VMAX and the target bottom value VMIN.

$$Lref = (VMAX + VMIN)/2 \quad (5)$$

It should be noted that the current slicer level Lref will be updated at the time when the new target peak value VMAX and the target bottom value VMIN are outputted from the processing circuit 130 at a next edge of the TEZC signal Sref since the moving window of monitoring the magnitude of the RFRP signal Sin is shifted forward continuously. After the slicer level Lref is generated, the comparator 5114 serves as a slicer for slicing the RFRP signal Sin through comparing the slicer level Lref and the RFRP signal Sin, and then outputs the sliced signal Sout as the desired mirror signal.

Additionally, the update controller 5108 is implemented to bypass the slicer level Lref determined by the decision logic 5106 to the comparator 5114 or directly set the slicer level Lref outputted to the comparator 5144 by an initial value Lini provided by the initial value controller 5112. Some examples of setting the initial value Lini are given as below.

In a first example, the initial value controller 5112 directly set the initial value Lini to the update controller 108 according to the following equation:

$$Lini = IN - (MAX - MIN)/2 \quad (6)$$

In above equation (6), IN represents the RFRP signal Sin in the beginning of the current track jumping operational period, MAX represents a specific maximum value outputted from the maximum value determining unit 5132 in the previous track jumping operational period, and MIN represents a specific minimum value outputted from the minimum value determining unit 5134 in the previous track jumping operational period. Preferably, the specific maximum value is the last target peak value VMAX found in the previous track jumping operational period, and the specific minimum value is the last target bottom value VMIN found in the previous operational period. In this example, the slicer level Lref initially set by the initial value Lini will be updated when a previous peak value, a previous bottom value, a current peak value, and a current bottom value are buffered in the buffering device 5128 if the slicer level setting scheme mentioned in above first case is implemented. In addition, the slicer level Lref initially set by the initial value Lini will be updated when (N−1) previous peak values, (N−1) previous bottom values, a current peak value, and a current bottom value are buffered in the buffering device 5128 if the slicer level setting scheme mentioned in above second case is implemented.

In a second example, the initial value controller 5112 is coupled to the buffering device 5128 for controlling the initial value of the slicer level Lref by directly setting an initial current peak value, an initial previous peak value, an initial current bottom value, and an initial previous bottom value buffered in the buffering device 5128 according to a first predetermined value, a second predetermined value, a specific maximum value (e.g., the above-mentioned MAX), a corresponding specific minimum value (e.g., the above-mentioned MIN) of the previous track jumping operational period, and the RFRP signal Sin in the beginning of the current track jumping operational period (e.g., the above-mentioned IN). In this example, the initial value controller 5112 sets IN−(MAX−MIN) to the initial current bottom value, IN to the initial current peak value, the first predetermined value to the initial previous peak value, and the second predetermined value to the initial previous bottom value. Preferably, the specific maximum value MAX is the last target peak value VMAX found in the previous track jumping operational period, and the specific minimum value MIN is the last target bottom value VMIN found in the previous track jumping operational period. Additionally, the first predetermined value could be set by any value less than or equal to a minimum of all possible bottom values of the RFRP signal Sin or set by the last minimum value found in the previous track jumping operational period (i.e., MIN), and the second predetermined value could be set by any value greater than or equal to a maximum of all possible peak values of the RFRP signal Sin or set by the last maximum value found in the previous track jumping operational period (i.e., MAX).

In a third example, the buffering device 5128 for controlling the initial value of the slicer level Lref by directly setting an initial current peak value, an initial current bottom value, (N−1) initial previous peak values, and (N−1) initial previous bottom values buffered in the buffering device 5128 according to first predetermined values, second predetermined values, a specific maximum value (e.g., the above-mentioned MAX), a corresponding specific minimum value (e.g., the above-mentioned MIN) of the previous track jumping operational period, and the RFRP signal Sin in the beginning of the current track jumping operational period (e.g., the above-mentioned IN). In this example, the initial value controller 5112 sets IN−(MAX−MIN) to the initial current bottom value, IN to the initial current peak value, the first predetermined values to the (N−1) initial previous peak values respectively, and the second predetermined values to the (N−1) initial previous bottom values respectively. Preferably, the specific maximum value MAX is the last target peak value VMAX found in the previous track jumping operational period, and the specific minimum value MIN is the last target bottom value VMIN found in the previous track jumping operational period. Additionally, the first predetermined values each could be set by any value less than or equal to a minimum of all possible bottom values of the RFRP signal Sin or set by the last minimum value found in the previous track jumping operational period (i.e., MIN), and the second predetermined values each could be set by any value greater than or equal to a maximum of all possible peak values of the RFRP signal Sin or set by the last maximum value found in the previous track jumping operational period (i.e., MAX).

If the initial value controller 5112 is only designed to support the initial value setting scheme disclosed in above first example, the circuit complexity of the initial controller 5112 is high due to additional computation is needed for determining the initial value Lini according to the aforementioned equation (6). However, if the initial value controller 5112 is only designed to support the initial value setting scheme disclosed in above second example or third example, the circuit complexity of the initial controller 5112 is reduced since no extra computation is needed. As a result, the production cost is reduced accordingly.

Figure 35:
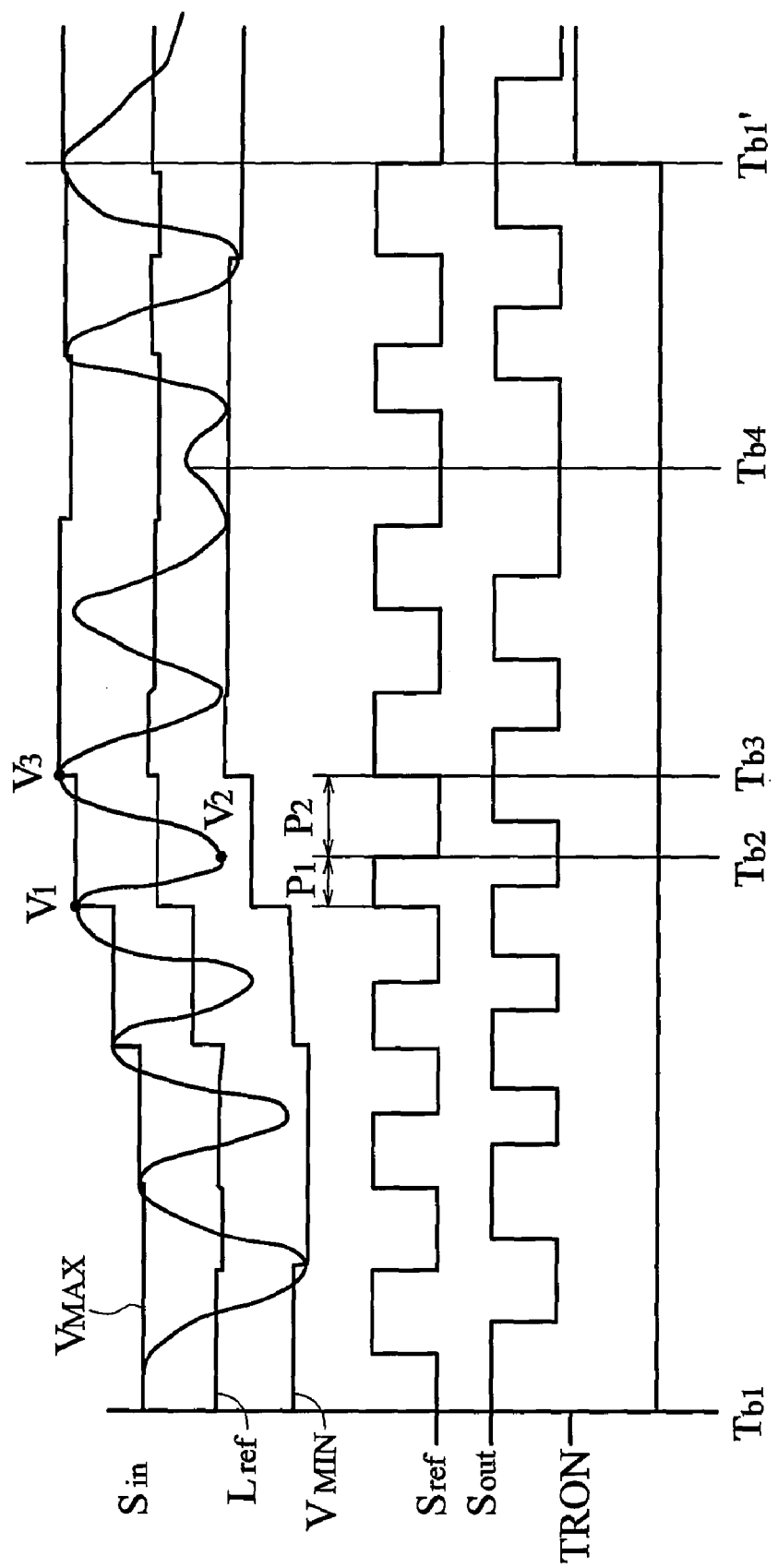
FIG. 35 is a timing diagram illustrating the generation of the reference level and the sliced signal shown in FIG. 34 according to an embodiment of the present invention.

Please refer to FIG. 35 in conjunction with FIG. 34. FIG. 35 is a timing diagram illustrating the generation of the reference level Lref and the sliced signal Sout shown in FIG. 34 according to an embodiment of the present invention. As mentioned above, in one exemplary embodiment of the present invention, the input signal Sin is an RFRP signal, the reference signal Sref is a TEZC signal, the reference level Lref is a slicer level used for slicing the RFRP signal, and the sliced signal Sout is a mirror signal. Suppose that the detecting circuit 5104 is configured to detect a target peak value VMAX and a target bottom value VMIN of the RFRP signal Sin within one period of the TEZC signal Sref (i.e., the moving window for monitoring the magnitude of the RFRP signal Sin is defined to be one period of the TEZC signal Sref). At time Tb2, the peak detector 5124 is triggered by a falling edge of the TEZC signal Sref to determine and output a peak value V1 of the half track pitch P1; simultaneously, the bottom detector 5124 is triggered by the same falling edge of the TEZC signal Sref to determine and output a bottom value V2 of the half track pitch P1. At time Tb3, the peak detector 5124 is triggered by a rising edge of the TEZC signal Sref to determine and output a peak value V3 of the half track pitch P2 following the half track pitch P1; simultaneously, the bottom detector 5124 is triggered by the same rising edge of the TEZC signal Sref to determine and output the bottom value V2 of the half track pitch P2 following the half track pitch P1. At this moment, the buffering device 5128 has stored the peak value V1 as the previous peak value PRE_MAX, the bottom value V2 as the previous bottom value PRE_MIN, the peak value V3 as the current peak value CUR_MAX, and the bottom value V2 as the current bottom value CUR_MIN. Therefore, the maximum value determining unit 5132 outputs the peak value V3 as the target peak value VMAX, and the minimum value determining unit 5134 outputs the bottom value V2 as the target bottom value VMIN. Next, the decision logic 5106 updates the slicer level Lref according to an average value of the target peak value VMAX and the target bottom value VMIN. As a result, the updated slicer level Lref becomes (V3+V2)/2 as shown in FIG. 35. Since a person skilled in the art can readily understand the disclosed slicer level updating occurring at other edges of the TEZC signal Sref after reading above description, further description is not repeated here for the sake of brevity. Please note that the movement of the optical pick-up unit relative to the optical disc is inversed at time Tb4. However, the slicer level Lref is well controlled to make the comparator 5114 output an accurate sliced signal Sout. Compared to the related art, the performance of the track jumping (track seeking) operation is improved.

As shown in FIG. 35, an on-track signal TRON is additionally presented. The on-track signal TRON serves as a system flag for indicating if the current operation mode is an on-track mode or a track-jumping (track-seeking) mode. For example, when the on-track signal TRON is maintained at a high logic level, it means that the optical pick-up unit is operated under the on-track mode; however, when the on-track signal TRON has a transition from a high logic level to a low logic level, it means that the optical pick-up unit enters the track-jumping mode, and when the on-track signal TRON has a transition from a low logic level to a high logic level, it means that the optical pick-up unit leaves the track-jumping mode. Referring to FIG. 35, the track-jumping mode is activated during an operational period from Tb1 to Tb1'. At time T1, a new track jumping operation starts. Therefore, when the on-track signal TRON has a transition from a high logic level to a low logic level at time Tb1, the initial value controller 5112 is enabled to control the initial value of the slicer level Lref. When a next track jumping operation is activated, the target peak value VMAX and the target bottom value VMIN obtained due to an edge of the TEZC signal Sref occurring at time T1' are used for controlling the initial value of the slicer level Lref.

Figure 36:
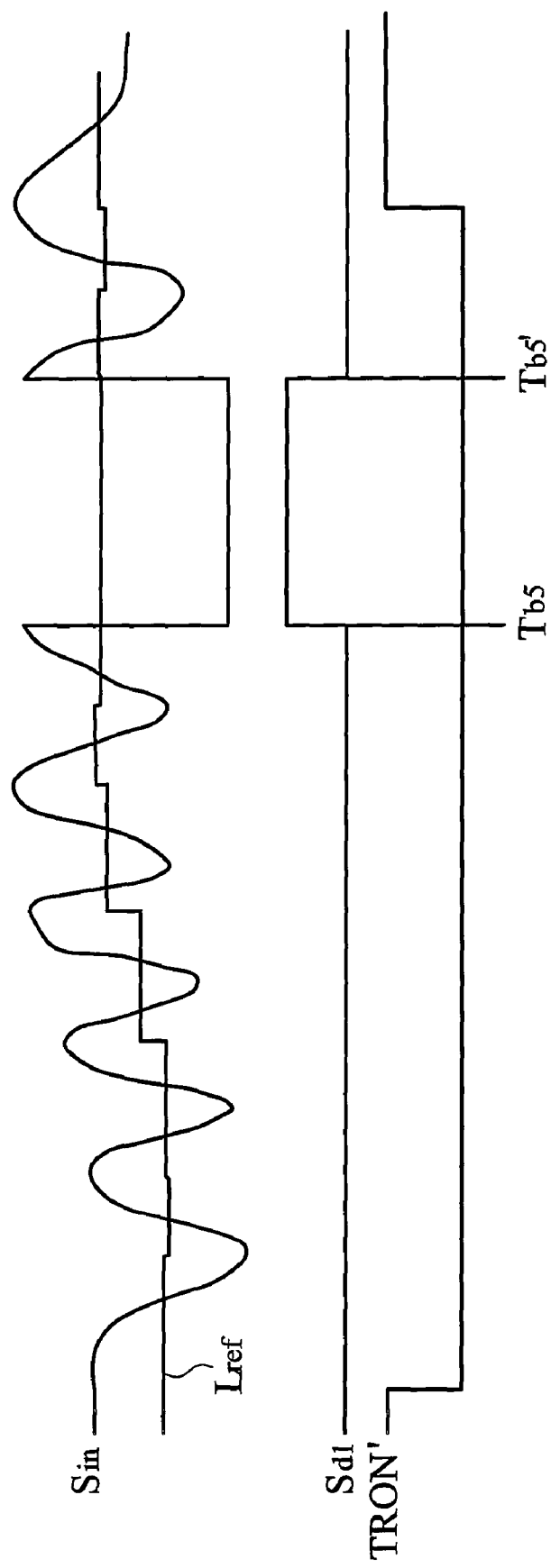
FIG. 36 is a diagram illustrating the protection scheme according to an embodiment of the present invention.

Moreover, when the optical pick-up unit is moving on a defect area of the optical disc, the waveform of the RFRP signal becomes abnormal. Therefore, the present invention provides a protection circuit 5110 to prevent the slicer level from being erroneously biased due to the defects. As shown in FIG. 34, the protection circuit 5110 is coupled to the update controller 5108 and operative to control the update controller 5108 to hold the slicer level Lref when a defect detection result indicates that a defect on the optical disc is found. Since how to detect the defects is well known to those skilled in this art, further description is omitted for brevity. Please refer to FIG. 36. FIG. 36 is a diagram illustrating the protection scheme according to an embodiment of the present invention. A defect indication signal Sdi is provided to indicate if a defect on the optical disc is found. At time Tb5, the defect indication signal Sdi has a transition from a low logic level to a high logic level, meaning that a defect on the optical disc is identified. Therefore, the protection circuit 5110 instructs the update controller 5108 to hold the current slicer level Lref. At time Tb5', the defect indication signal Sdi has a transition from a high logic level to a low logic level, meaning that the optical pick-up unit has moved to a defect-free area of the optical disc. Therefore, the protection circuit 110 allows the update controller 5108 to bypass the calculated slicer level Lref to the following comparator 5114.

Please refer to FIG. 37. FIG. 37 is a flow chart of processing an RFRP signal to generate a mirror signal according to an embodiment of the present invention. Suppose that the same result is substantially obtained. The steps are not limited to be executed according to the exact order shown in FIG. 37. The flow of generating the mirror signal includes the following steps:

Step 400: Start.

Step 402: Is a track-jumping (track-seeking) mode enabled? If yes, go to step 404; otherwise, repeat step 402 to keep monitoring.

Step 404: Set an initial value of a slicer level.

Step 406: Compare an RFRP signal with the slicer level to output/update the mirror signal.

Step 408: Is an on-track mode enabled? If yes, go to step 402; otherwise, go to step 410.

Step 410: Detect a target peak value and a target bottom value of the RFRP signal within an integer multiple of a period of a TEZC signal.

Step 412: Average the target peak value and the target bottom value to generate an average value.

Step 414: Update the slicer level using an average value. Go to step 406.

The method is performed by the apparatus 5100 shown in FIG. 34. Since the details associated with functions and operations of the components in the apparatus 5100 have been given above, further description of the steps shown in FIG. 37 is omitted for the sake of brevity.

Figure 38:
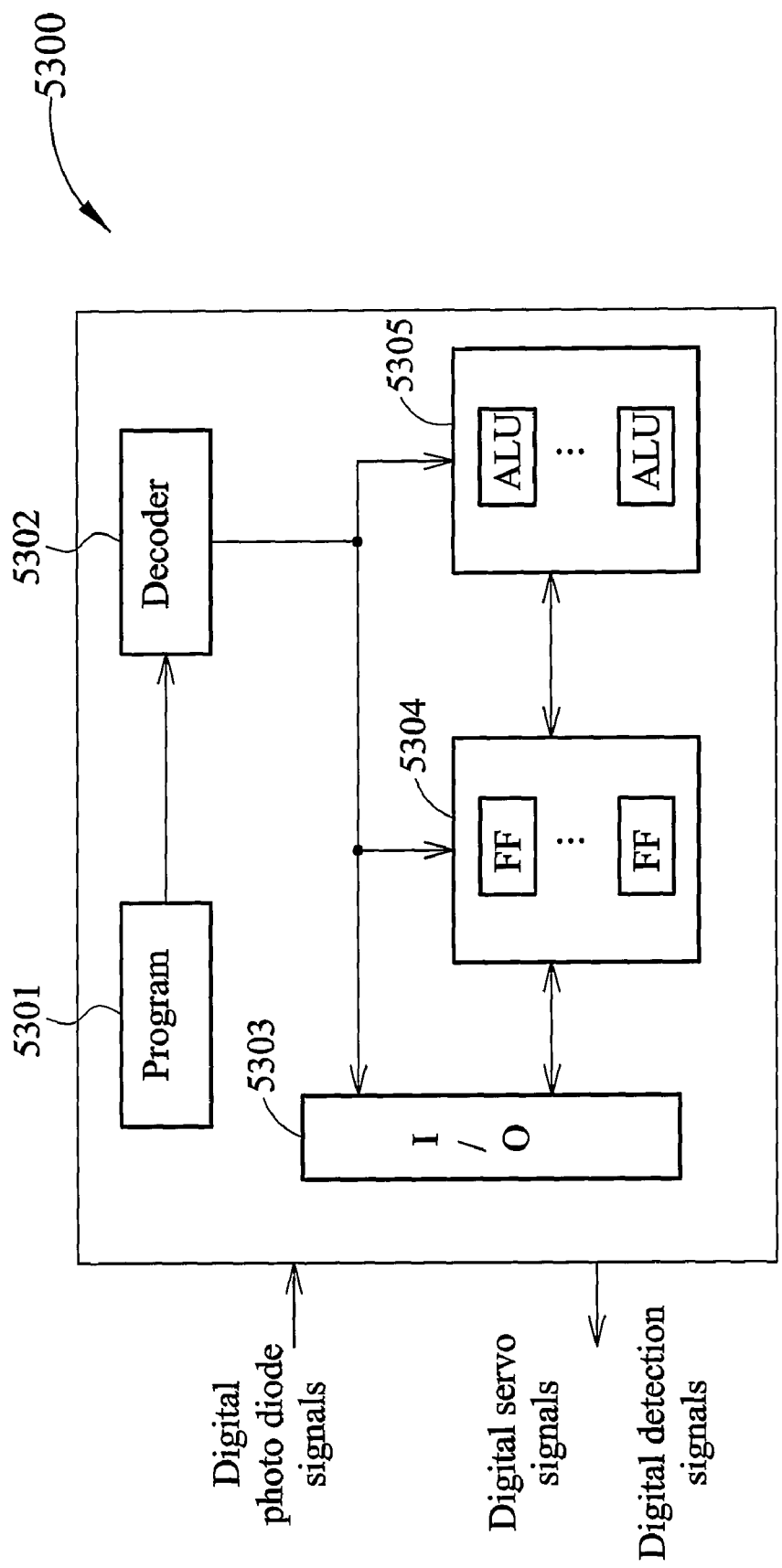
FIG. 38 is a diagram illustrating the structure of the digital signal processor 5300 of the signal processing apparatus 200 according to an embodiment of the present invention.

Please refer to FIG. 38. FIG. 38 is a diagram illustrating the structure of the digital signal processor 5300 of the signal processing apparatus 200 according to an embodiment of the present invention. Generally, the signal processing apparatus 200 is realized with a digital signal processor (DSP). As shown in FIG. 38, the signal generator 5300 comprises a program unit 5301, a decoder 5302, an I/O unit 5303, a flip-flop module 5304, and a calculation unit 5305. The flip-flop module 5304 comprises a plurality of flip-flops. The calculation unit 5305 comprises a plurality of arithmetic logic units.

Please continue referring to FIG. 38. The program unit 5301 is disposed for storing a program and transmitting instructions according to the program. The decoder 5302 is coupled to the program unit 5301 for receiving the instructions from the program unit 5301 and accordingly transmits control signals to the I/O unit 5303, the flip-flop module 4304, and the calculation unit 5305. The I/O unit 5303 serves as an interface for receiving the digital photo diode signals and outputting the digital servo signals and the digital detection signals. The digital detection signals can be RF zero-crossing signals (RFZC), tracking zero-crossing signals (TZC), or RAM-Header signals. The flip-flop module 5304 is coupled between the I/O unit 5303 and the calculation unit 5305 for storing signals from the I/O unit 5303 and from the calculation unit 5305. The calculation unit 5305 uses the plurality of ALUs for calculating the digital photo diode signals and the digital detection signals from the flip-flop module 5304 and storing the calculation result (servo signals or detection signals) in the flip-flop module 5304.

Please continue referring to FIG. 38. It is assumed that the sampling rate of the analog/digital device is 1 MHz, a low-pass filter designed in the calculation 5305 needs 5 instructions to operate and an adder designed in the calculation 5305 needs one instruction to operate, and to calculate a result as the digital servo signal needs 60 low-pass filters and 60 adders. Because the flip-flop module 5304 operates multiple instructions per program counter, that is, the flip-flop module 5304 can provide data to different devices at the same time, thus the calculation unit 5305 operates multiple instructions per program counter. Based on the above assumption, to generate a digital servo signal needs only 6 program counters (1*5+1). Therefore, the frequency of the signal generator 5300 only has to be 6 MHz, which can be designed easily.

Figure 39:
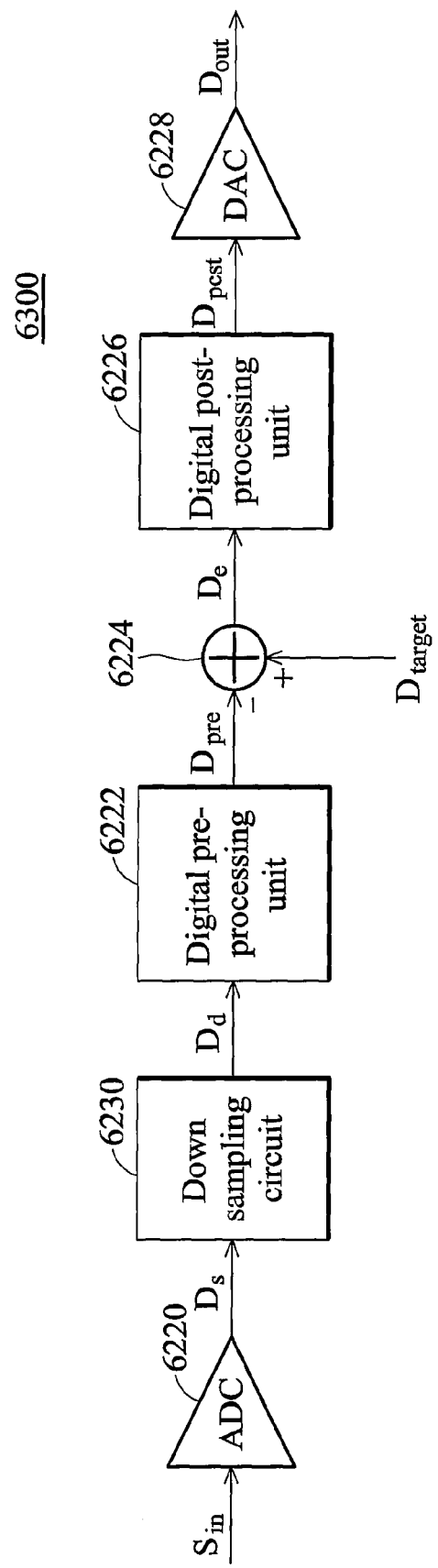
FIG. 39 is a block diagram of an exemplary automatic power control system according to the invention.

FIG. 39 is a block diagram of an exemplary automatic power control system according to the invention, comprising analog-to-digital converter (ADC) 6220, down sampling circuit 6230, digital preprocessing unit 6222, comparator 6224, digital post processing unit 6226, and digital-to-analog converter (DAC) 6228. Analog to digital converter (ADC) 6220 is coupled to down sampling circuit 6230, digital preprocessing unit 6222, comparator 6224, digital post processing unit 6226, and then to digital-to-analog converter (DAC) 6228.

In an example, automatic power control system 6300 provides automatic power control of a laser diode in an optical disc drive. Analog input signal $S_{in}$ is a laser beam reflection sensed by a photodetector in an optical pickup head of the system, and corresponds to power level of the laser diode. ADC 6220 converts analog input signal $S_{in}$ to digital sampled data $D_s$, down converted by down sampling rate R to generate down sampled data $D_d$ in down sampling circuit 6230, where the down sampling rate is a ratio less than a unity. Digital preprocessing unit 6222 preprocesses down sampled data $D_s$ to, for example, filter noise and smooth the signal, and outputs preprocessed data $D_{pre}$ to comparator 6224. Comparator 6224 compares preprocessed data $D_{pre}$ and target value $D_{target}$ to generate error data $D_e$, filtered in digital post-processing unit 6226 to generate smooth output $D_{post}$, converted to analog control signal $S_c$ in digital-to-analog converter 6228. Analog control signal $S_c$ in turn controls a driving current to the laser diode such that the power level thereof remains stable without error data $D_e$.

Figure 40:
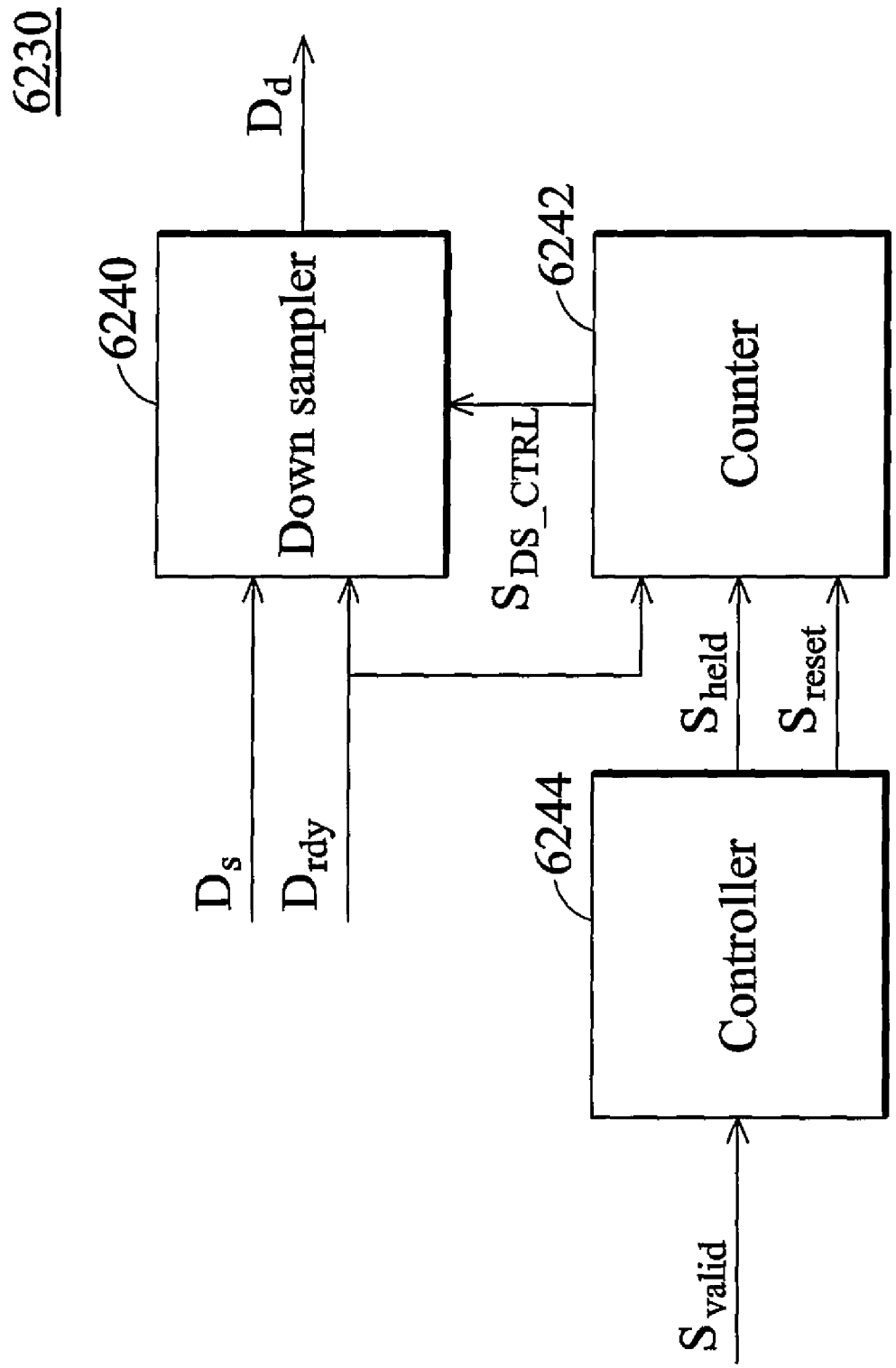
FIG. 40 is a block diagram of an exemplary down sampling circuit according to the invention, incorporated in the automatic control circuit in FIG. 39.

FIG. 40 is a block diagram of an exemplary down sampling circuit according to the invention, incorporated in the automatic power control system in FIG. 39, comprising down sampler 6240, counter 6242, and controller 6244. Controller 6244 is coupled to counter 6242, and subsequently to down sampler 6240.

Down sampler 6240 receives a predetermined amount of sampled data $D_s$ from ADC 6220 to generate down sampled (representation) data $D_d$ when sampled data Ds is valid. Down sampler 6240 may be an accumulator accumulating the predetermined amount of sampled data $D_s$ to generate accumulated down sampled data $D_d$, each sampled data $D_s$ is assigned to an equal or different weight (coefficient) in the accumulation. Down sampler 6240 may be a finite impulse response (FIR) filter. The validity of sampled data $D_s$ may be indicated by valid data indication $D_{rdy}$ that provides a pulse for each valid data.

Counter 6242 receives valid data indication $D_{rdy}$ to establish an amount of valid sampled data, and resets the down sampler 6240 when the amount of valid sampled data equals or exceeds the predetermined amount.

Controller 6244 receives valid signal $S_{valid}$ indicating the validity of sampled data $D_s$, enables counter 6242 when sampled data $D_s$ is valid, and disables counter 6242 when invalid. Controller 6244 may disable counter 6242 by resetting or holding the counter 6242. Controller 6244 may reset counter 6242 by reset signal $S_{reset}$ and hold counter 6242 by hold signal $S_{hold}$.

Figure 41:
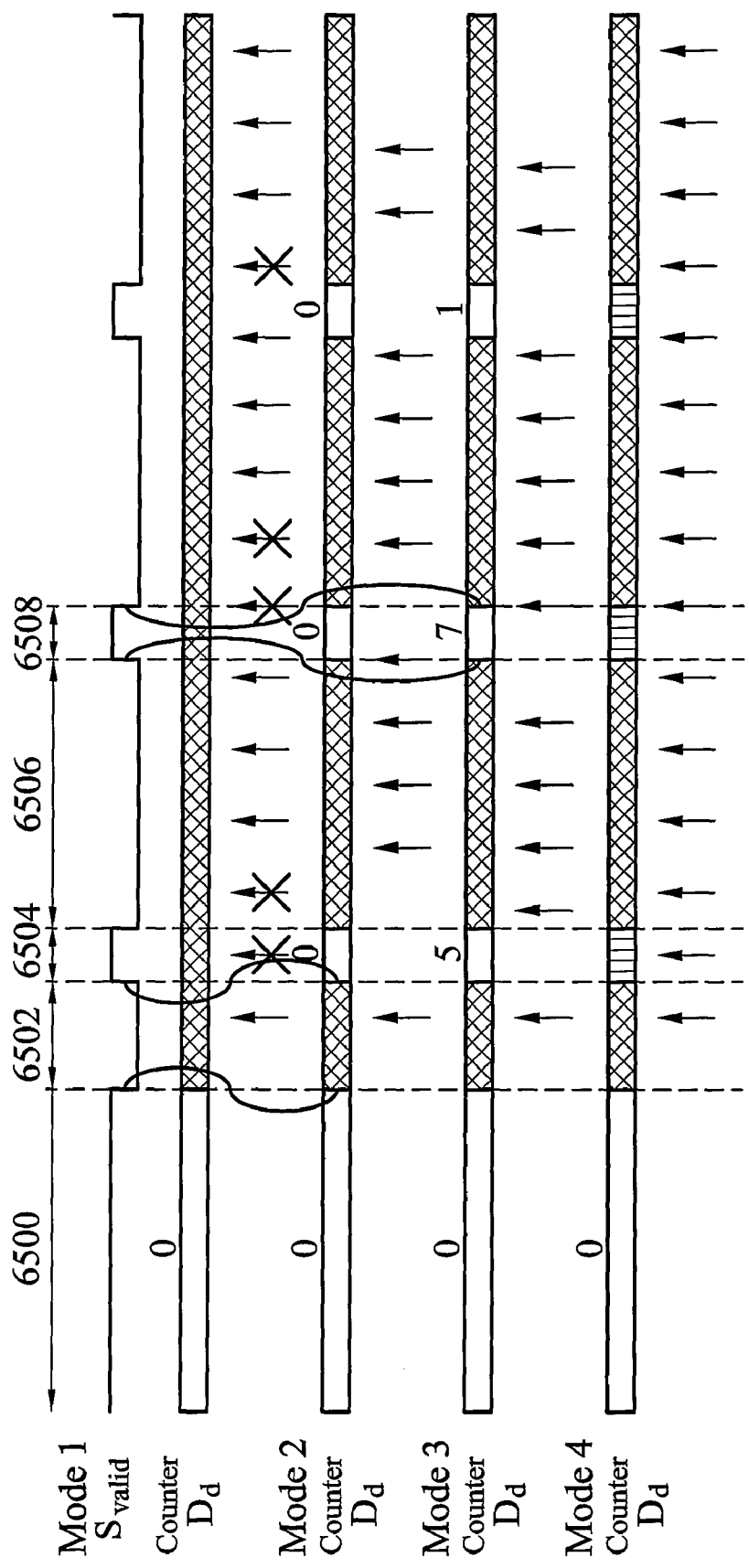
FIG. 41 is a timing diagram of selected signals according to the invention, incorporated in the down sampling circuit in FIG. 40.

Down sampling circuit 6230 may operate in four modes as depicted in FIG. 41, a timing diagram of selected signals according to the invention, incorporated in the down sampling circuit in FIG. 40, comprising valid signal $S_{valid}$, valid sampled count $N_{valid}$, and down sampled data $D_d$. Valid signal $S_{valid}$ is logic "high" for invalid data, and logic "low" for valid data. For automatic power control and servo control, valid signal $S_{valid}$ is high during writing data, and low during read. In the case of automatic power control, the read data are down sampled to provide a representation of reflected laser light power during read, and the laser power is adjusted so that the representation can meet the requirement set by target data $D_{target}$.

In the first mode, controller 6244 does not disable counter 6242 regardless of valid signal $S_{valid}$ and counter 6242 runs continuously such that down sampler 6240 generates a down sampled data $D_d$ every predetermined amount of sampled data $D_s$. Down sampler 6240 may receive valid or invalid sample data $D_s$ to generate down sampled data $D_d$. Down sampler 6240, however, discards the down sampled data $D_d$ when any of the sampled data Ds is invalid, such that the down sampled data $D_d$ is only output when all of the predetermined amount of sampled data is valid. The first down sampled data $D_d$ in the valid period (period 6506) is discarded to ensure validity, at the expense of circuit efficiency.

In the second mode, controller 6244 resets counter 6242 whenever receiving invalid data signal $S_{valid}$. Upon reset, Counter 6242 in turn resets down sampler 6240, so that down sampler 6240 discards all sampled data $D_s$ therein and restarts the down sampling operation again after sampled data Ds is valid ($S_{valid}$ is logic "low"). The second mode is more efficient than the first since the first down sampled data $D_d$ in the valid period (period 6506) is not wasted, while the last down sampled data $D_d$ immediately before the invalid period (period 6504) is dumped.

In the third mode, controller 6244 holds counter 6242 upon receiving invalid signal $S_{valid}$. Counter 6242 stops calculating the amount of valid sampled data and suspends down sampler 6240. Down sampler 6240 is disabled and discards any incoming sampled data Ds. Upon receiving valid signal $S_{valid}$, counter 6244 enables counter 6242, in turn to enable down sampler 6240 to complete the down sampling operation. The third mode is more efficient than the first and the second ones, since every sampled data Ds in valid period is not wasted.

In the fourth mode, controller 6244 does not disable counter 6244 upon invalid signal $S_{valid}$. Counter 6242 runs continuously and down sampler 6240 generates a down sampled data $D_d$ every predetermined amount of sampled data $D_s$. Upon detection of invalid data, down sampler 6240 recycles the valid data immediately before the invalid data for the accumulation, thereby generating a down sampled data $D_d$ every predetermined count. The fourth mode is more efficient than the first and the second ones, since every sampled data $D_s$ in valid period is not wasted.

Figure 42:
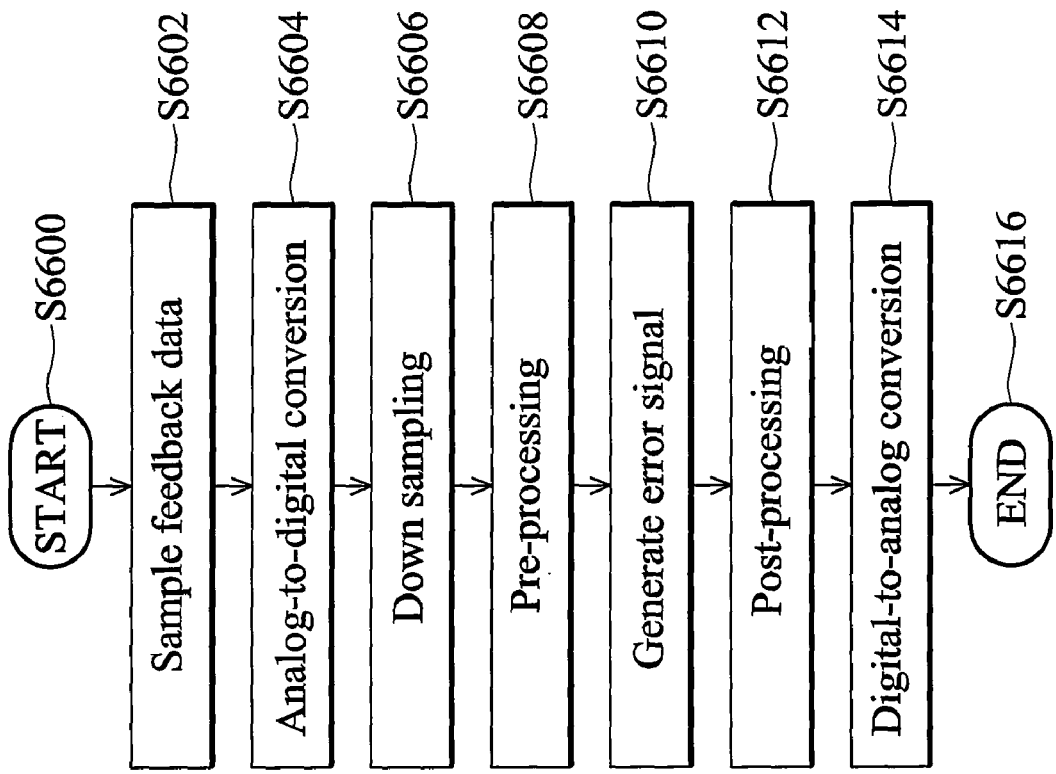
FIG. 42 is a flowchart of an exemplary automatic control circuit method, incorporated in the automatic control circuit in FIG. 39.

FIG. 42 is a flowchart of an exemplary automatic control circuit method, incorporated in the automatic control circuit in FIG. 39.

In Step S6600, automatic power control 6300 is initialized and analog input signal $S_{in}$ is detected in Step S6602.

In Step S6604, ADC 6220 converts analog input signal $S_{in}$ to digital for sampled data $D_s$, and down sampling circuit 6230 performs down sampling operation thereon to generate down sampled data Ds in Step S6606.

In Step S6608, digital preprocessing unit 6222 obtains down sampled data $D_s$ to perform filtering thereon, removing noise from and smoothing down sampled data $D_s$ to generate preprocessed data $D_{pre}$.

In step S6610, comparator 6224 compares preprocessed data $D_{pre}$ with target data $D_{target}$ to generate error data $D_e$ indicating a difference therebetween. Next post-processing unit 6226 filters and smoothes error data $D_e$ to provide post processed data $D_{post}$ in step S6612.

In Step S6614, digital to analog converter 6228 converts post processed data $D_{post}$ to analog control signal $D_e$, thereby controlling the driving current to the optical diode and the power level of the laser beam for a reading operation.

Figure 43:
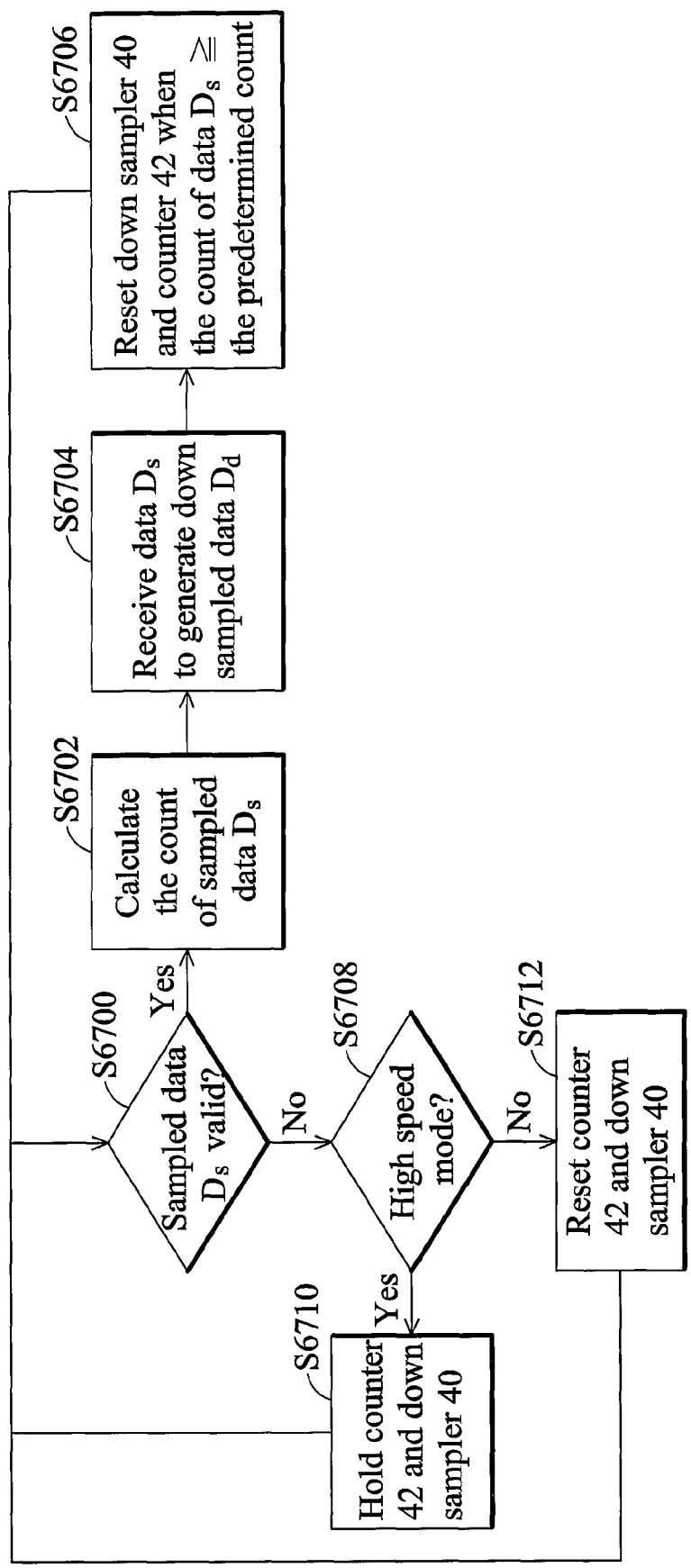
FIG. 43 is a flowchart of an exemplary down sampling method, incorporated in the method in FIG. 42 and the down sampling circuit in FIG. 40.
Figure 44:
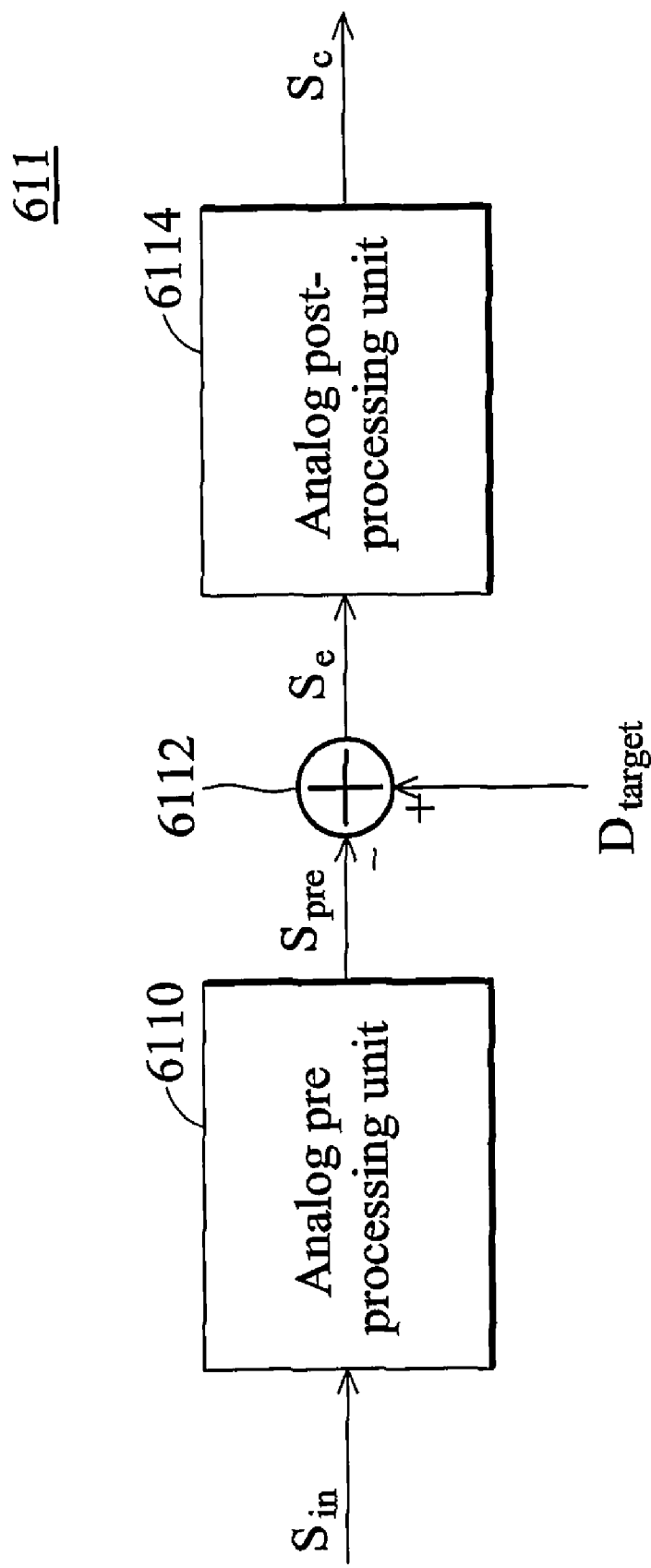
FIG. 44 is a block diagram of a conventional automatic power control system.
Figure 45:
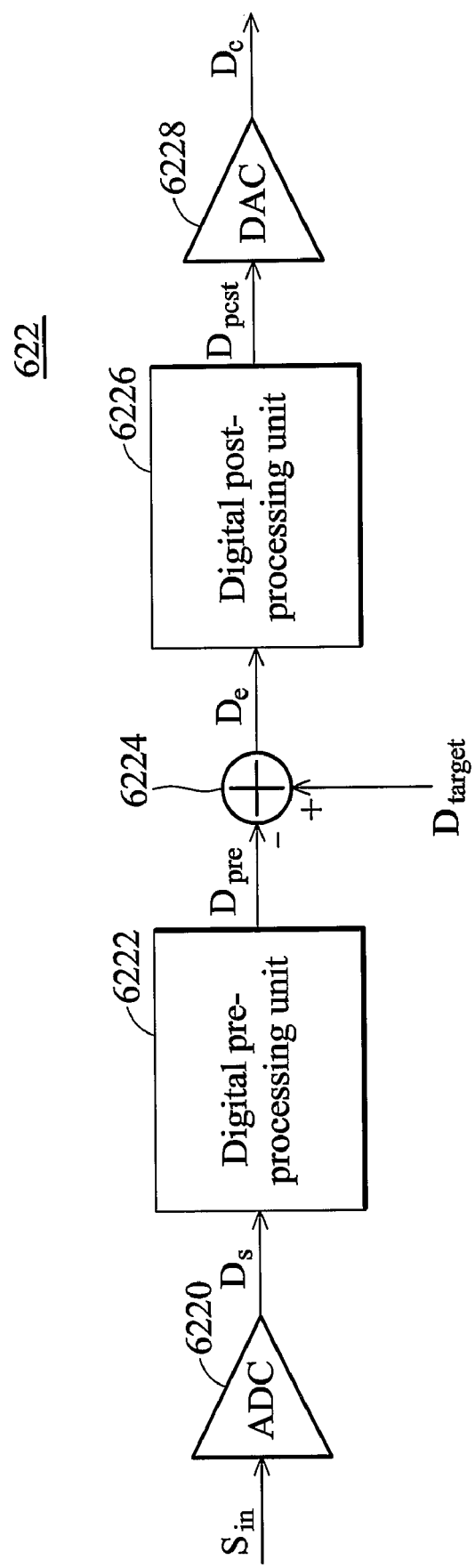
FIG. 45 is a block diagram of a conventional automatic power control system.

FIG. 43 is a flowchart of an exemplary down sampling method, incorporated in the method in FIG. 42 and the down sampling circuit in FIG. 40.

Upon initialization of down sampling circuit 6230, controller 6244 determines whether sampled data $D_s$ is valid in Step S6700, continues step S6702 if sampled data $D_s$ is valid, and step S6708 otherwise. The validity of sampled data $D_s$ is indicated by valid data signal $S_{valid}$, with logic "low" being valid and "high" being invalid.

Next counter 6242 calculates the amount of sampled data $D_s$ in step S6702, and down sampler receives sampled data $D_s$ to generate down sampled data $D_d$ in step S6704. Down sampler 6240 may accumulate each sampled data $D_s$ to generate an accumulation for down sampled data $D_d$.

Next in step S6706, when the amount of sampled data $D_s$ equals or exceeds the predetermined count, down sampler 6240 and counter 6242 are reset to reinitialize another down sampling operation in step S6700.

In Step S6708, controller determines whether down sampling circuit 6230 is in the high speed mode if sampled data $D_s$ is invalid, proceeds step S6710 if so, and step S6712 otherwise.

In Step S6710, down sampling circuit 6230, if in high speed mode, holds both counter 6242 and down sampler 6240, and continues checking the validity of subsequent sampled data $D_s$ in step S6700. Counter 6242 stops calculating the amount of sampled data $D_s$ and down sampler 6240 holds the generation of down sampled data $D_d$.

In Step S6712, down sampling circuit 6230, if not in high speed mode, resets both counter 6242 and down sampler 6240, so that the down sampling process is reinitialized in step S6700.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An automatic power control system for an optical disc drive to control the power of laser beam, the optical disc drive comprising a laser diode for receiving a control signal to generate a laser beam; and a photodetector for detecting the laser beam to generate an analog input signal; the automatic power control system, comprising:
    an analog-to-digital converter, converting the analog input signal into digital data;
    a down sampling circuit, coupled to the analog-to-digital converter, comprising:
        a down sampler, receiving a predetermined amount of digital data to generate representation data; and
        a controller, coupled to the down sampler, disabling the down sampler when the digital data is invalid, and resetting the down sampler when the amount of digital data equals or exceeds a predetermined count;
    a comparator, coupled to the down sampling circuit, comparing the representation data with predetermined target data to generate error data; and
    a digital-to-analog converter, coupled to the comparator, converting the error data to analog to generate the control signal.

2. The automatic power control system of claim 1, wherein the down sampler is an accumulator accumulating the digital data to generate the representation data.

3. The automatic power control system of claim 1, wherein the down sampler discards the representation data when any of the digital data is invalid.

4. The automatic power control system of claim 1, wherein the down sampler generates the representation data using the valid digital data immediately before the invalid data when any of the digital data is invalid.

5. The automatic power control system of claim 1, wherein the down sampling circuit further comprises a counter to count the amount of digital data.

6. The automatic power control system of claim 5, wherein the controller disables the counter by resetting the counter, and the controller further resets the down sampler.

7. The automatic power control system of claim 5, wherein the controller disables the counter by holding the counter, and the controller further holds the down sampler.

8. The automatic power control system of claim 1, wherein the down sampler is a filter.

9. An automatic power control system for an optical disc drive to control the power of laser beam, the optical disc drive comprising a laser diode for receiving a control signal to generate a laser beam; and a photodetector for detecting the laser beam to generate an analog input signal; the automatic power control system comprising:
- an analog-to-digital converter, converting the analog input signal into digital data;
- a down sampling circuit, coupled to the analog-to-digital converter, comprising:
  - a down sampler, receiving a predetermined amount of digital data to generate representation data; and
  - a controller, coupled to the down sampler, disabling or restarting the down sampler when the digital data is invalid;
- a comparator, coupled to the down sampling circuit, comparing the representation data with predetermined target data to generate error data; and
- a digital-to-analog converter, coupled to the comparator, converting the error data to analog to generate the control signal.

10. The automatic power control system of claim 9, wherein the down sampler is an accumulator accumulating the digital data to generate the representation data.

11. The automatic power control system of claim 9, wherein the down sampler discards the representation data when any of the digital data is invalid.

12. The automatic power control system of claim 9, wherein the down sampler generates the representation data using the valid digital data immediately before the invalid data when any of the digital data is invalid.

13. An automatic power control system for an optical disc drive to control the power of laser beam, the optical disc drive comprising a laser diode for receiving a control signal to generate a laser beam; a photodetector for detecting the laser beam to generate an analog input signal; and an analog-to-digital converter for converting the analog input signal into digital data; the automatic power control system comprising:
- a down sampling circuit, coupled to the analog-to-digital converter, comprising:
  - a down sampler, receiving a predetermined amount of digital data to generate representation data; and
  - a controller, coupled to the down sampler, disabling the down sampler when the digital data is invalid, and resetting the down sampler when the amount of digital data equals or exceeds a predetermined count; and
- a comparator, coupled to the down sampling circuit, comparing the representation data with predetermined target data to generate error data.

14. The automatic power control system of claim 13, wherein the down sampler is an accumulator accumulating the digital data to generate the representation data.

15. The automatic power control system of claim 13, wherein the down sampler discards the representation data when any of the digital data is invalid.

16. The automatic power control system of claim 13, wherein the down sampler generates the representation data using the valid digital data immediately before the invalid data when any of the digital data is invalid.

17. The automatic power control system of claim 13, wherein the down sampling circuit further comprises a counter to count the amount of digital data.

18. The automatic power control system of claim 17, wherein the controller disables the counter by resetting the counter, and the controller further resets the down sampler.

19. The automatic power control system of claim 17, wherein the controller disables the counter by holding the counter, and the controller further holds the down sampler.

20. The automatic power control system of claim 13, wherein the down sampler is a filter.

* * * * *